(12) United States Patent
Lee et al.

(10) Patent No.: US 12,349,556 B2
(45) Date of Patent: Jul. 1, 2025

(54) LIGHT EMITTING DISPLAY DEVICE AND MANUFACTURING METHOD THEREOF

(71) Applicant: Samsung Display Co., Ltd., Yongin-Si (KR)

(72) Inventors: Jun Hee Lee, Hwaseong-si (KR); Beohm Rock Choi, Seoul (KR); Jun Hyuk Woo, Yongin-si (KR); Choong Youl Im, Yongin-si (KR); Seong Min Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 585 days.

(21) Appl. No.: 17/584,747

(22) Filed: Jan. 26, 2022

(65) Prior Publication Data

US 2023/0046219 A1    Feb. 16, 2023

(30) Foreign Application Priority Data

Aug. 4, 2021  (KR) .......................... 10-2021-0102618

(51) Int. Cl.
*H10K 59/122*  (2023.01)
*H10K 50/86*  (2023.01)
*H10K 59/124*  (2023.01)
*H10K 71/00*  (2023.01)
*H10K 50/818*  (2023.01)
(Continued)

(52) U.S. Cl.
CPC ......... *H10K 59/124* (2023.02); *H10K 50/865* (2023.02); *H10K 59/122* (2023.02); *H10K 71/00* (2023.02); *H10K 50/818* (2023.02); *H10K 59/1201* (2023.02); *H10K 59/38* (2023.02)

(58) Field of Classification Search
CPC .... H10K 59/124; H10K 59/122; H10K 59/35; H10K 59/38; H10K 50/818; H10K 50/844; H01L 27/3246; H01L 51/5284; H01L 27/322

See application file for complete search history.

(56) References Cited

U.S. PATENT DOCUMENTS

2022/0077269 A1*  3/2022  Lee ...................... H10K 59/131

FOREIGN PATENT DOCUMENTS

| KR | 10-2006-0001377 A | 1/2006 |
| KR | 10-2007-0017817 A | 2/2007 |
| KR | 10-2015-0010237 A | 1/2015 |

* cited by examiner

*Primary Examiner* — Jay C Kim
*Assistant Examiner* — Joshua Scott Wyatt
(74) *Attorney, Agent, or Firm* — Innovation Counsel LLP

(57) ABSTRACT

A light emitting display device includes a substrate, an organic layer, a conductor, an anode, and a pixel definition layer. The organic layer overlaps the substrate and has a connection opening. The conductor is positioned between the substrate and the organic layer. The anode is positioned on the organic layer and is partially positioned inside the connection opening. The pixel definition layer exposes an exposed portion of the anode. The organic layer has a halftone exposure portion and a neighboring portion. The halftone exposure portion overlaps the exposed portion of the anode and overlaps the conductor. The neighboring portion neighbors the halftone exposure portion. A face of the halftone exposure portion and a face of the neighboring portion are spaced from the substrate by a first distance and a second distance, respectively. A difference between the first distance and the second distance is 30 nm or less.

13 Claims, 34 Drawing Sheets

(51) Int. Cl.
*H10K 59/12* (2023.01)
*H10K 59/38* (2023.01)

| | Comparative example 1 | Comparative example 2 | Embodiment 1 | Embodiment 2 |
|---|---|---|---|---|
| Green | | | | |
| Blue/Red | | | | |
| Reflective color band | | | | |
| Height difference (nm) | 60 | 45 | 30 | 20 |

LIGHT EMITTING DISPLAY DEVICE AND MANUFACTURING METHOD THEREOF

CROSS-REFERENCE TO RELATED APPLICATION

This application claims priority to Korean Patent Application No. 10-2021-0102618 filed in the Korean Intellectual Property Office on Aug. 4, 2021; the Korean Patent Application is incorporated by reference.

BACKGROUND

1. Field

The technical field relates to a light emitting display device and a manufacturing method of the light emitting display device.

2. Description of the Related Art

A display device may display images in response to input signals. Modern display devices include liquid crystal display (LCD) devices, organic light emitting diode (OLED) displays, and the like. Display devices may be included in various electronic devices, such as mobile phones, navigation devices, digital cameras, electronic books, portable game machines, and terminals.

SUMMARY

Embodiments are for improving display quality by reducing reflective color bands caused by asymmetrically reflected external light.

A light emitting display device according to an embodiment includes the following elements: a substrate; an organic layer positioned on the substrate and having an anode connection opening; an anode positioned on the organic layer and electrically connected through the anode connection opening of the organic layer; a black pixel definition layer having an anode exposure opening exposing the anode; a cathode positioned between the black pixel definition layer and the anode; and an encapsulation layer covering the cathode, wherein the organic layer has a halftone exposure area, a step of the halftone exposure area is 30 nm or less, and the halftone exposure area overlaps the anode exposure opening in a plan view.

A second data conductive layer between the substrate and the organic layer may be further included, and the organic layer may include a lower organic layer and an upper organic layer.

The halftone exposure area may include a first halftone exposure area and a second halftone exposure area, the first halftone exposure area may be positioned in the lower organic layer, and the second halftone exposure area may be positioned in the upper organic layer.

A pixel may include a red pixel, a green pixel, and a blue pixel, the first halftone exposure area and the second halftone exposure area may be positioned in the red pixel and the blue pixel, and the first halftone exposure area may only be positioned in the green pixel.

A first data conductive layer positioned between the substrate and the second data conductive layer may be further included, the first data conductive layer of the green pixel may include a first expansion part overlapping the anode in a plan view, and the second data conductive layer of the red pixel and the blue pixel may include a second expansion part overlapping the anode in a plan view.

The lower organic layer and the upper organic layer may each have a thickness of greater than 1 µm and less than 2 µm.

The anode connection opening may be formed in the lower organic layer and the upper organic layer, and the anode connection opening may have a stepped structure.

The halftone exposure area may be positioned in only one of the lower organic layer and the upper organic layer.

The halftone exposure area may be positioned in only the lower organic layer.

A second data conductive layer between the substrate and the organic layer may be further included, and the organic layer may be one organic layer.

A light blocking layer positioned on the encapsulation layer and having a color filter opening; a color filter filling the color filter opening of the light blocking layer; and a sensing electrode overlapping the light blocking layer in a plan view and covered by the light blocking layer may be further included, and the halftone exposure area may overlap the anode, the color filter opening, and the color filter in a plan view.

The halftone exposure area may be larger than the anode exposure opening, so as to overlap the whole of the anode exposure opening in a plan view, and the halftone exposure area is smaller than the color filter opening so that the color filter opening may overlap the whole of the halftone exposure area in a plan view.

A spacer positioned between the black pixel definition layer and the cathode may be further included, and the spacer may include a first portion and a second portion having a lower height than the first portion and integrally formed with the first portion.

A manufacturing method of a light emitting display device according to an embodiment includes the following steps: forming a second data conductive layer on a substrate including a first pixel and a second pixel; forming a lower organic layer covering the second data conductive layer; forming an upper organic layer covering the lower organic layer; forming an anode on the upper organic layer; forming a black pixel definition layer including an anode exposure opening exposing at least a part of the anode; forming a cathode on the black pixel definition layer and the anode; and forming an encapsulation layer covering the cathode, wherein a first halftone exposure area is formed in the lower organic layer in each of the first pixel and the second pixel by using a slit mask, and a second halftone exposure area is formed in the upper organic layer of the first pixel by using a slit mask.

The halftone exposure area may be not formed in the upper organic layer of the second pixel.

The first pixel may be a red pixel or a blue pixel, and the second pixel may be a green pixel.

The step of the first halftone exposure area or the second halftone exposure area may be 30 nm or less.

The first halftone exposure area and the second halftone exposure area may overlap the anode exposure opening of the black pixel definition layer in a plan view.

The lower organic layer and the upper organic layer may include an anode connection opening, and the anode connection opening may be formed of a stepped structure.

An exposure amount for exposing the lower organic layer may be smaller than an exposure amount for exposing the upper organic layer.

An embodiment may be related to a light emitting display device. The light emitting display device may include a substrate, and organic layer, a conductive layer, a conductive part, an anode, a black definition layer, a cathode, and an encapsulation layer. The organic layer may overlap the substrate and may have an anode connection opening. The conductive layer may be positioned closer to the substrate than the organic layer. The conductive part may be positioned closer to the substrate than the conductive layer and/or the organic layer. The anode may be positioned on the organic layer and may be partially positioned inside the anode connection opening. The black pixel definition layer may include an anode exposure opening that exposes an exposed portion of the anode. The cathode may overlap both the black pixel definition layer and the anode. The encapsulation layer may cover the cathode. The organic layer may include a halftone exposure portion and a neighboring portion. The halftone exposure portion may overlap the exposed portion of the anode and may overlap the conductive layer or the conductive part. The neighboring portion may neighbor the halftone exposure portion and may not overlap the conductive layer or the conductive part. A face of the halftone exposure portion may be spaced from the substrate by a first distance. A face of the neighboring portion may be spaced from the substrate by a second distance. A difference between the first distance and the second distance may be equal to or less than 30 nm.

The organic layer may include a first organic layer and a second organic layer overlapping each other.

The halftone exposure portion may include a first halftone exposure portion and a second halftone exposure portion. The first halftone exposure portion may be included in the first organic layer. The second halftone exposure portion may be included in the second organic layer and may overlap the first halftone exposure portion.

The light emitting display may include a red color filter, a green color filter, and a blue color filter. The first halftone exposure portion and the second halftone exposure portion may overlap one of the red pixel and the blue pixel. The first organic layer may include a green-pixel halftone exposure portion overlapping the green color filter.

The conductive part may overlap the green color filter. The conductive layer may overlap the red color filter or the blue color filter.

A thickness of the first organic layer may be greater than 1 µm and less than 2 µm. A thickness of the second organic layer may be greater than 1 µm and less than 2 µm.

The anode connection opening may include a first opening and a second opening. The first opening may be included in the first organic layer. The second opening may be included in the second organic layer. The first organic layer may include a stepped structure that is exposed by the second opening.

The halftone exposure portion may be included in only one of the first organic layer and the second organic layer.

The halftone exposure portion may be included in only the first organic layer.

Two opposite faces of the organic layer may be formed of a same material and may respectively directly contact the conductive layer and the anode.

The light emitting display device may include the following elements: a light blocking layer positioned on the encapsulation layer and including a color filter opening; a color filter filling the color filter opening; and a sensing electrode covered by the light blocking layer. The halftone exposure portion may overlap the color filter.

A perimeter of the halftone exposure portion may surround a perimeter of the anode exposure opening in a plan view of the light emitting display device. The perimeter of the halftone exposure portion may be surrounded by a perimeter of the color filter in the plan view of the light emitting display device.

The light emitting display device may include a spacer positioned between the black pixel definition layer and the cathode. The spacer may include a first portion and a second portion shorter than the first portion in a direction perpendicular to the substrate and integrally formed with the first portion.

An embodiment may be related to a method for manufacturing a light emitting display device. The method may include the following steps: forming a conductive part that overlaps a substrate; forming a conductive layer that overlaps the substrate; forming a first organic layer covering the conductive layer; forming a second organic layer covering the first organic layer; forming an anode on the second organic layer; forming a black pixel definition layer including an anode exposure opening that exposes an exposed portion of the anode; forming a cathode on the black pixel definition layer and the anode; forming an encapsulation layer covering the cathode; forming a first-layer exposure portion and a green-pixel exposure portion in the first organic layer using a mask that may include slits; and forming a second-layer exposure portion in the second organic layer using the mask. The second-layer exposure portion may overlap the first-layer exposure portion. The first-exposure portion may overlap the conductive layer. The green-pixel exposure portion may overlap the conductive part.

No exposure portion of the second organic layer is formed using the mask and overlaps the green-pixel exposure portion.

The method may include forming a red color filter, forming a green color filter, and forming a blue color filter. The red color filter or the blue filter may overlap the second-layer exposure portion. The green filter may overlap the green-pixel exposure portion.

The first organic layer may include a first neighboring portion that neighbors the first-layer exposure portion and does not overlap the conductive layer. The second organic layer may include a second neighboring portion that neighbors the second-layer exposure portion and does not overlap the conductive layer. A face of the first exposure portion may be spaced from the substrate by a first distance. A face of the first neighboring portion may be spaced from the substrate by a second distance. A face of the second exposure portion may be spaced from the substrate by a third distance. A face of the second neighboring portion may be spaced from the substrate by a fourth distance. A difference between the first distance and the second distance or a difference between the third distance and the fourth distance may be equal to or less than 30 nm.

Each of the first-layer exposure portion and the second-layer exposure portion may overlap the exposed portion of the anode.

The first organic layer may include a first opening. The second organic layer may include a second opening. The first organic layer may include a stepped structure that is exposed by the second opening.

An exposure amount for exposing the first organic layer to form the first-layer exposure portion and the green-pixel exposure portion may be smaller than an exposure amount for exposing the second organic layer to form the second-layer exposure portion.

According to embodiments, the flatness of the organic layer positioned under the anode is improved so that the anode is sufficiently flat to prevent reflected light from spreading asymmetrically. Advantageously, satisfactory image display quality may be attained. According to embodiments, the reflectivity of the external light may be minimized by the black pixel definition layer that separates the emission layers from each other without requiring a polarizer. Advantageously, the thickness of the display device may be minimized.

BRIEF DESCRIPTION OF THE DRAWINGS

Each of FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20.

Each of FIG. 24A, FIG. 24B, FIG. 24C.

Each of FIG. 25, FIG. 26, FIG. 27, FIG. 28A.

Each of FIG. 29A, FIG. 29B, and FIG. 29C.

DETAILED DESCRIPTION

Figure 1:
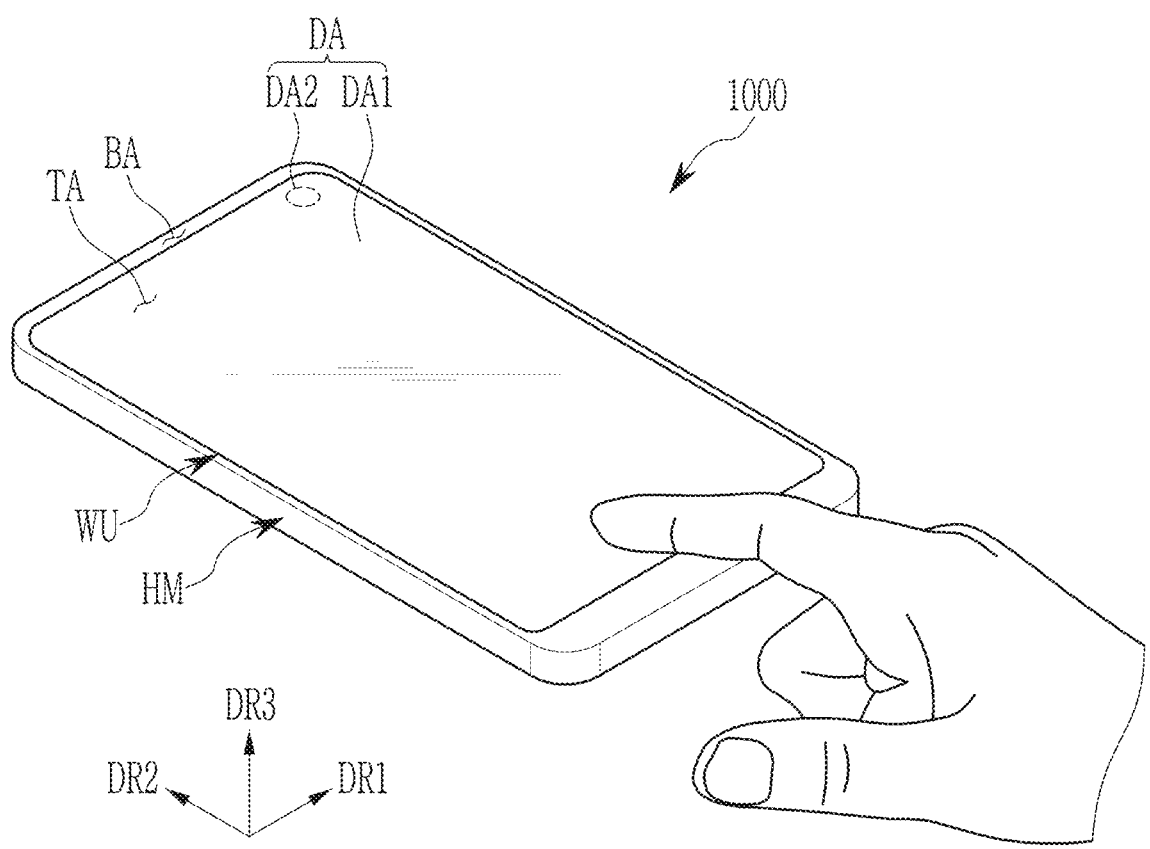
FIG. 1 is a schematic perspective view showing a display device according to an embodiment (and used by a user).

Examples of embodiments are described with reference to the accompanying drawings. The described embodiments may be modified in various ways. Like reference numerals may designate like elements.

In the drawings, dimensions may be exaggerated for clarity.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on" a second element, the first element can be directly on the second element, or one or more intervening elements may be present between the first element and the second element. When a first element is referred to as being "directly on" a second element, there are no intervening elements (except for environmental elements such as air) present between the first element and the second element.

Unless explicitly described to the contrary, the word "comprise", and variations such as "comprises" or "comprising", may indicate the inclusion of stated elements but may not imply the exclusion of any other elements.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The term "defined" may mean "formed" or "provided." The expression that a space or opening overlaps an object may mean that (the position of) the space or opening overlaps with (the position of) the object and/or that the space or opening exposes the object. The term "overlap" may be equivalent to "be overlapped by." The expression that a first element overlaps with a second element in a plan view may mean that the first element overlaps the second element in direction perpendicular to a substrate. The term "area" may mean "part" or "portion." The height of an element may mean the distance of the element from a substrate or the distance from the substrate to the element.

Figure 2:
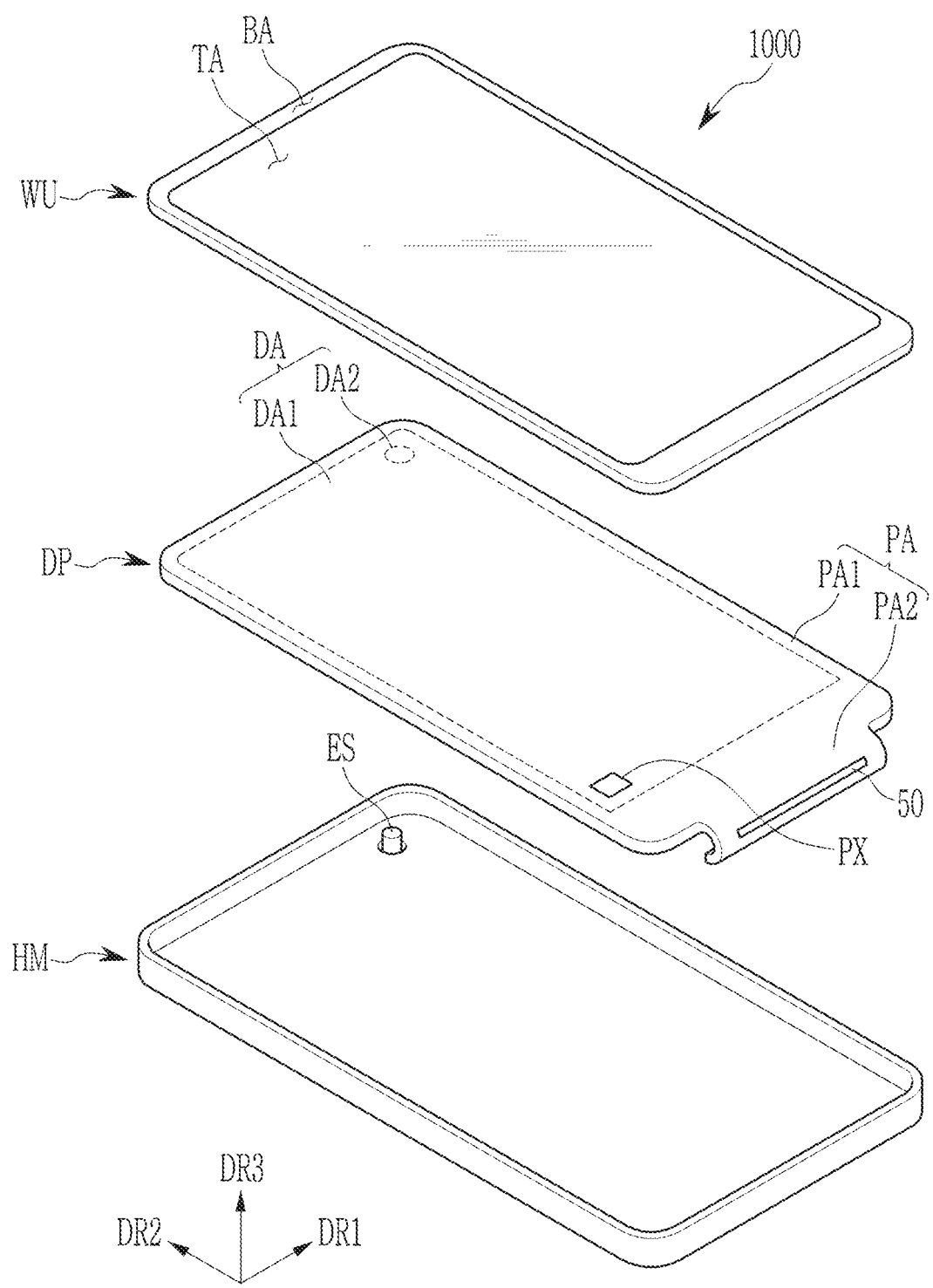
FIG. 2 is an exploded perspective view of a display device according to an embodiment.
Figure 3:
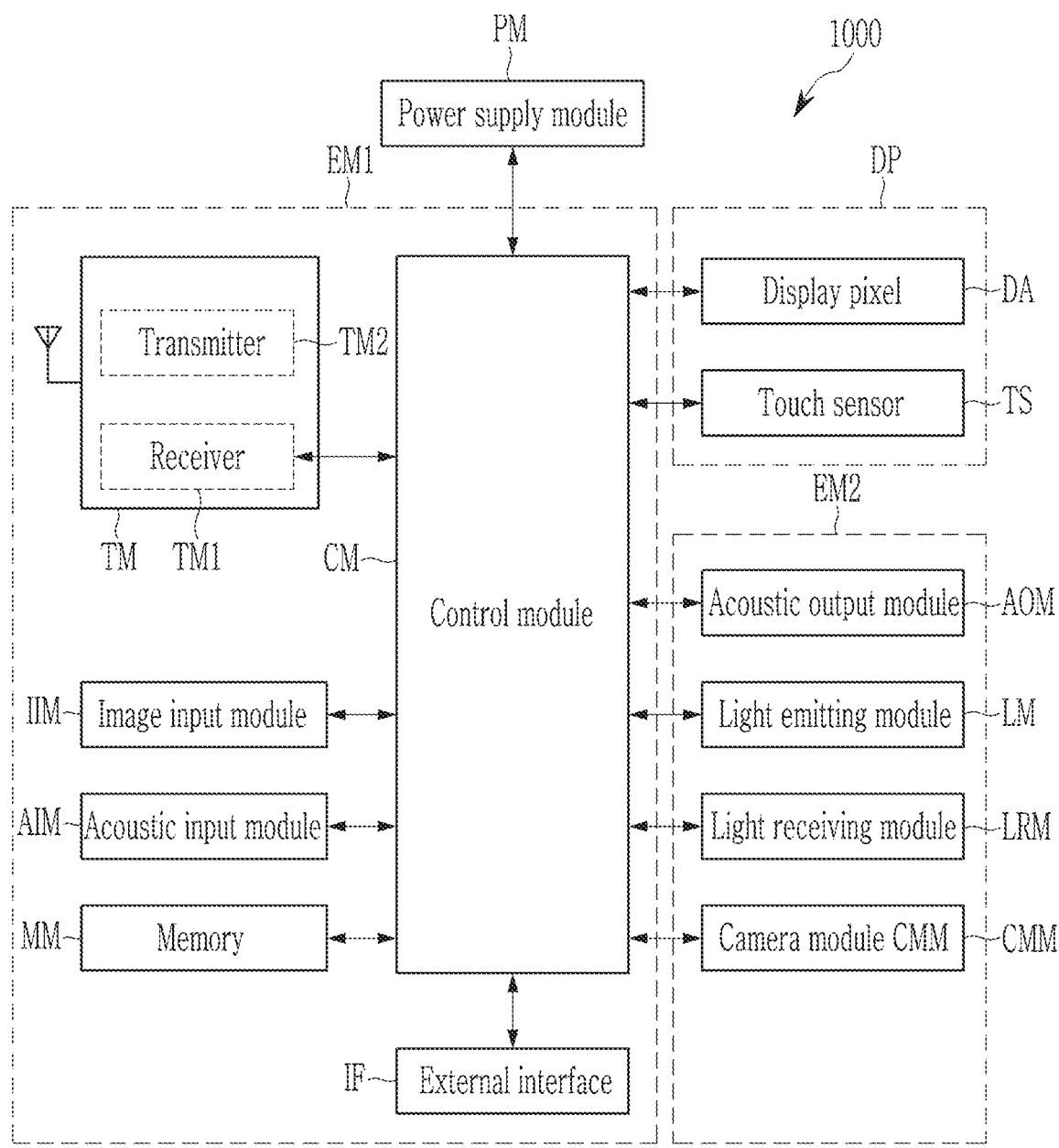
FIG. 3 is a block diagram of a display device according to an embodiment.

FIG. 1 is a schematic perspective view showing a display device 1000 according to an embodiment and used by a user. FIG. 2 is an exploded perspective view of a display device according to an embodiment. FIG. 3 is a block diagram of a display device according to an embodiment.

The light emitting display device 1000 may display a motion picture and/or a static image, and may be (used as a display screen of) an electronic device, such as a television, a laptop, a monitor, a billboard, an internet of things (IOT), a mobile phone, a smart phone, a tablet personal computer, a mobile communication terminal, an electronic notebook, an electronic book, a portable multimedia player (PMP), a navigation device, an ultra-mobile PC (UMPC), Ta smart watch, a watch phone, a spectacle display, a head mounted display (HMD), an instrument panel of a vehicle, a center fascia of a vehicle or a center information display (CID) disposed on a dashboard, a mirror display instead of a side mirror of a vehicle, or a display disposed at a rear surface of a front seat. The light emitting display device 1000 may be a smartphone.

Referring to FIG. 1, FIG. 2, and FIG. 3, the light emitting display device 1000 may display the image toward a third direction DR3 on a display surface respectively perpendicular to a first direction DR1 and a second direction DR2. The display surface on which the image is displayed may correspond to the front surface of the light emitting display device 1000 and may correspond to the front surface of the cover window WU. The images may include static images as well as dynamic images.

The front (or a top) and the back (or a bottom) of each member are defined based on the direction in which the image is displayed. The front and rear surfaces may be opposed to each other in the third direction DR3, and the normal directions of the front and rear surfaces may be parallel to the third direction DR3. The separation distance in the third direction DR3 between the front and rear surfaces may correspond to the thickness in the third direction DR3 of the light emitting display panel DP.

The light emitting display device 1000 according to an embodiment may detect the user's input (refer to a hand in FIG. 1) applied from the outside. The user's input may include various types of external inputs such as a part of the user's body, light, heat, or pressure. The user's input is shown with the user's hand applied to the front. The user's input may be provided in various forms, and the light emitting display device 1000 may sense the user's input applied to the side or rear of the light emitting display device 1000 according to the structure of the light emitting display device 1000.

The light emitting display device 1000 may include a display area DA and non-display area PA disposed around the display area DA. Meanwhile, the display area DA may be largely divided into a first display area DA1 and a first element area DA2, hereinafter also referred to as a component area or a second display area, and The first display area DA1 may include a plurality of pixels for displaying an image, and the first element area DA2 may include a light transmission area LTA, and additionally may also include a pixel that displays the image. The first element area DA2 may be an area overlapping at least partially with an optical element ES such as a camera or an optical sensor. FIG. 1 shows that the first element area DA2 is provided in a circle shape on the upper right side of the light emitting display device 1000, but the present invention is not limited thereto. The first element area DA2 may be provided in various numbers and shapes according to the number and shape of the optical element ES.

The light emitting display device 1000 may receive an external signal required for the optical element ES through the first element area DA2, or may externally provide a signal output from the optical element ES. In an embodiment, since the first element area DA2 is provided to overlap the light transmitting area LTA, the area of the blocking area BA for forming the light transmitting area LTA may be reduced. The blocking area BA is an area having relatively low light transmittance, and may include a bezel area.

The light emitting display device 1000 may include a cover window WU, a housing HM, a light emitting display panel DP, and an optical element ES. The cover window WU and the housing HM may be combined to constitute the appearance of the light emitting display device 1000.

The cover window WU may include an insulating panel. For example, the cover window WU may be made of glass, plastic, or a combination thereof.

The front surface of the cover window WU may define the front surface of the light emitting display device 1000. The transmitting area TA may be an optically transparent area. For example, the transmitting area TA may be an area having visible ray transmittance of about 90% or more.

The blocking area BA may define the shape of the transmitting area TA. The blocking area BA may be adjacent to the transmitting area TA and may surround the transmitting area TA. The blocking area BA may be an area having relatively low light transmittance compared to the transmitting area TA. The blocking area BA may include an opaque material that blocks light. The blocking area BA may have a predetermined color. The blocking area BA may be defined by a transparent substrate defining the transmitting area TA and a bezel layer provided separately, or by an ink layer formed by being inserted or colored into the transparent substrate.

The light emitting display panel DP may include a display panel DP for displaying the image, a touch sensor TS for detecting an external input, and a driving unit 50. The light emitting display panel DP may include a front surface including a display area DA and a non-display area PA. The display area DA may be an area in which a pixel operates and emits light according to an electrical signal.

The display area DA is an area where the image is displayed by including a pixel, and simultaneously may be an area where the touch sensor TS is positioned on the upper side in the third direction DR3 of the pixel and an external input is sensed.

The transmitting area TA of the cover window WU may overlap at least partially with the display area DA of the light emitting display panel DP. For example, the transmitting area TA may overlap the entire surface of the display area DA or may overlap at least a part of the display area DA. Accordingly, the user may view the image through the transmitting area TA or provide an external input based on the image. For example, in the display area DA, the area in which the image is displayed and the area in which the external input is detected may be separated from each other.

The non-display area PA of the light emitting display panel DP may at least partially overlap with the blocking area BA of the cover window WU. The non-display area PA may be an area covered by the blocking area BA. The non-display area PA is adjacent to the display area DA and may surround the display area DA. The image is not displayed in the non-display area PA, and a driving circuit or driving wiring for driving the display area DA may be disposed there. The non-display area PA may include a first peripheral area PA1 positioned outside the display area DA and a second peripheral area PA2 including a driving unit 50, connection wiring, and a bending area. In the embodiment of FIG. 2, the first peripheral area PA1 is positioned on three sides of the display area DA, and the second peripheral area PA2 is positioned on the other side of the display area DA.

The light emitting display panel DP may be assembled in a flat state such that the display area DA and the non-display area PA face the cover window WU. A part of the non-display area PA of the light emitting display panel DP may be bent. In this case, a portion of the non-display area PA faces the rear surface of the light emitting display device 1000, so that the blocking area BA shown on the front surface of the light emitting display device 1000 may be reduced, and as shown in FIG. 2, the second peripheral area PA2 is bent to be positioned on the back surface of the display area DA and then assembled.

The display area DA may include a first display area DA1 and a first element area DA2. The first element area DA2 may have relatively high light transmittance compared to the first display area DA1 by including the light transmitting area LTA. The first element area DA2 may have a relatively smaller area than the first display area DA1. The first element area DA2 may be defined as an area overlapping the area where the optical element ES is disposed inside the housing HM among the light emitting display panel DP. The first element area DA2 is shown with a circle shape, but the present invention is not limited thereto, and the first element area DA2 may have various shapes such as polygons, ellipses, and figures with at least one curved line.

The first display area DA1 may be adjacent to the first element area DA2. The first display area DA1 may surround the entirety of the first element area DA2. The first display area DA1 may partially surround the first element area DA2.

Referring to FIG. 3, the light emitting display panel DP may include a display area DA including a display pixel and a touch sensor TS. The light emitting display panel DP may be visually recognized by the user from the outside through the transmitting area TA, including the pixel that generates the image. In addition, the touch sensor TS may be positioned on the upper part of the pixel, and may sense the external input applied from the outside. The touch sensor TS may detect an external input provided to the cover window WU.

Again referring to FIG. 2, the second peripheral area PA2 may include a bent part. The display area DA and the first peripheral area PA1 may have a flat state while being substantially parallel to the plane defined by the first direction DR1 and the second direction DR2, and one side of the second peripheral area PA2 is extended from the flat state and may again have the flat state after passing the bending part. As a result, at least a part of the second peripheral area PA2 may be bent and assembled to be positioned on the back side of the display area DA. At least part of the second peripheral area PA2 overlaps the display area DA in a plan view when being assembled, so that the blocking area BA of the light emitting display device 1000 may be reduced. For example, the second peripheral area PA2 may not be bent.

The driving unit 50 may be mounted on the second peripheral area PA2, mounted on the bending part, or positioned on one of both sides of the bending part. The driving unit 50 may be provided in a form of a chip.

The driving unit 50 may be electrically connected to the display area DA to transmit an electrical signal to the display area DA. For example, the driving unit 50 may provide data signals to the pixels PX disposed in the display area DA. Alternatively, the driving unit 50 may include a touch driving circuit and may be electrically connected to the touch sensor TS disposed in the display area DA. Meanwhile, the driving unit 50 may include various circuits in addition to the above-described circuits or may be designed to provide various electrical signals to the display area DA.

On the other hand, a pad part may be positioned on the end of the second peripheral area PA2, and the light emitting display device 1000 may be electrically connected to a flexible printed circuit board (FPCB) including the driving chip by the pad part. The driving chip positioned on the flexible printed circuit board may include various driving circuits for driving the light emitting display device 1000 or connectors for power supply. According to an embodiment, instead of the flexible printed circuit board, a rigid printed circuit board (PCB) may be used.

The optical element ES may be disposed under the light emitting display panel DP. The optical element ES may receive an external input transmitted through the first element area DA2 or may output a signal through the first element area DA2. The first element area DA2 having relatively high transmittance is provided inside the display area DA, so that the optical element ES may be disposed to overlap the display area DA, and accordingly, the area (or the size) of the blocking area BA may be reduced.

Referring to FIG. 3, light emitting display device 1000 may include a light emitting display panel DP, a power supply module PM, a first electric module EM1, and a second electric module EM2. The light emitting display panel DP, the power supply module PM, the first electric module EM1, and the second electric module EM2 may be electrically connected to each other. In FIG. 3, the display pixel and the touch sensor TS positioned in the display area DA among the configuration of the light emitting display panel DP are illustrated as an example.

The power supply module PM may supply the power required for the overall operation of the light emitting display device 1000. The power supply module PM may include a common battery module.

The first electric module EM1 and the second electric module EM2 may include various functional modules for operating the light emitting display device 1000. The first electric module EM1 may be directly mounted on a motherboard electrically connected to the display panel DP or mounted on a separate substrate to be electrically connected to the motherboard through a connector (not shown).

The first electric module EM1 may include a control module CM, a wireless communication module TM, an image input module IIM, an acoustic input module AIM, a memory MM, and an external interface IF. Some of the modules are not mounted on the motherboard, but may be electrically connected to the motherboard through the flexible printed circuit board connected thereto.

The control module CM may control the overall operation of the light emitting display device 1000. The control module CM may be a microprocessor. For example, the control module CM activates or deactivates the display panel DP. The control module CM may control other modules such as the image input module IIM or the acoustic input module AIM based on the touch signal received from the display panel DP.

The wireless communication module TM may transmit/receive a wireless signal with another terminal by using a Bluetooth or Wi-Fi line. The wireless communication module TM may transmit/receive a voice signal using a general communication line. The wireless communication module TM includes a transmitter TM1 that modulates and transmits a signal to be transmitted, and a receiver TM2 that demodulates a received signal.

The image input module IIM may process the image signal to be converted into image data that can be displayed on the light emitting display panel DP. The acoustic input module AIM may receive an external sound signal input by a microphone in a recording mode, a voice recognition mode, etc. to be converted into electrical voice data.

The external interface IF may serve as an interface connected to an external charger, a wired/wireless data port, a card socket (e.g., a memory card, SIM/UIM card), and the like.

The second electric module EM2 may include an acoustic output module AOM, a light emitting module LM, a light receiving module LRM, and a camera module CMM, and at least some of these may be positioned on the back of the display area DA as the optical element ES as shown in FIG. 1 and FIG. 2. The optical element ES may include the light emitting module LM, the light receiving module LRM, and the camera module CMM. In addition, the second electric module EM2 may be directly mounted on the motherboard or mounted on a separate substrate to be electrically connected to the light emitting display panel DP through a connector (not shown), or electrically connected to the first electric module EM1.

The acoustic output module AOM may convert the acoustic data received from the wireless communication module TM or the acoustic data stored in the memory MM to be output to the outside.

The light emitting module LM may generate and output light. The light emitting module LM may output infrared light. For example, the light emitting module LM) may include an LED element. For example, the light-receiving module LRM may detect infrared light. The light receiving module LRM may be activated when infrared light above a certain level is detected. The light receiving module LRM may include a CMOS sensor. After the infrared light generated by the light emitting module LM is output, the light may be reflected by an external subject (e.g., a user's finger or a face), and the reflected infrared light may be incident on the light receiving module LRM. The camera module CMM may take external images.

The optical element ES may additionally include an optical detecting sensor or a thermal detecting sensor. The optical element ES may detect an external object received through the front surface or may provide a sound signal such as a voice through the front surface to the outside. The optical element ES may include a plurality of configurations, and is not limited to any one embodiment.

Again referring to FIG. 2, the housing HM may be combined with the cover window WU. The cover window WU may be disposed in front of the housing HM. The housing HM may be combined with the cover window WU to provide a predetermined accommodation space. The light emitting display panel DP and the optical element ES may be accommodated in a predetermined accommodation space provided between the housing HM and the cover window WU.

The housing HM may include a material with relatively high stiffness. For example, the housing HM may include a plurality of frames and/or plates made of glass, plastic, or metal, or a combination thereof. The housing HM may reliably protect the components of the light emitting display device 1000 housed in the interior space from external impact.

Figure 4:
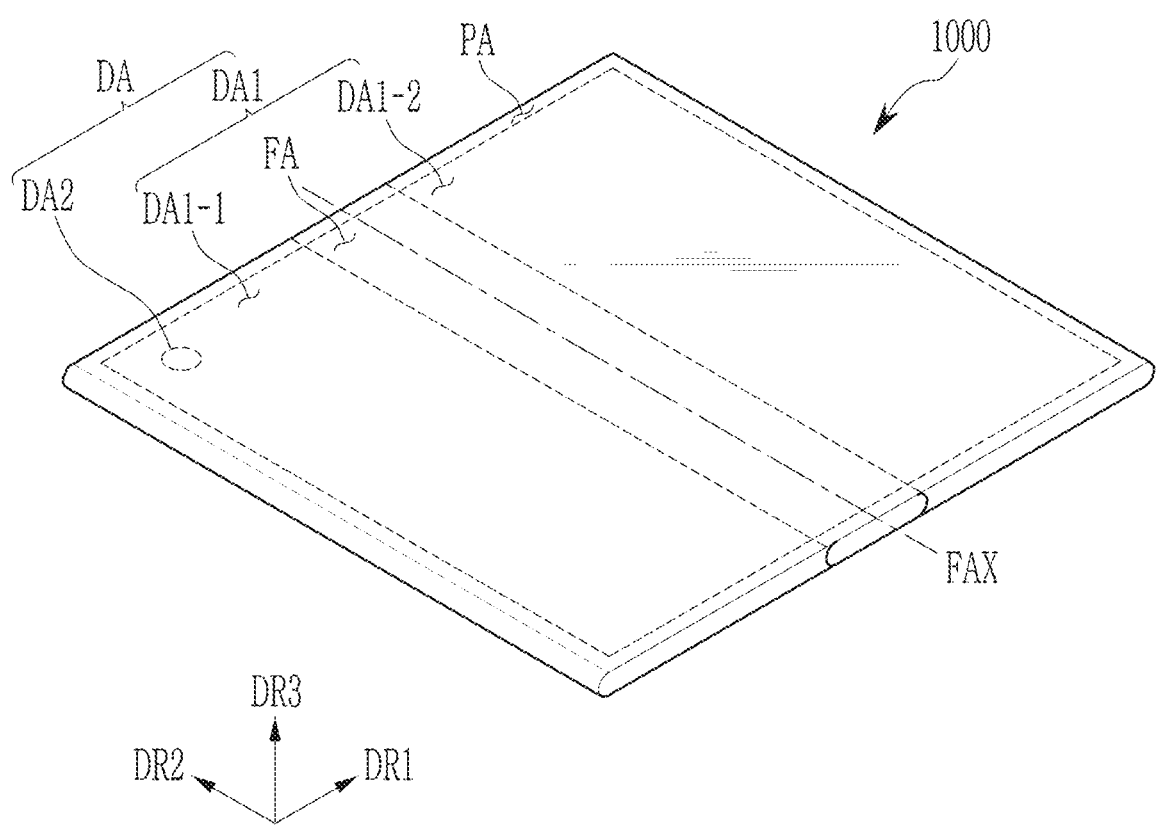
FIG. 4 is a perspective view schematically illustrating a light emitting display device according to an embodiment.

FIG. 4 is a perspective view schematically showing a light emitting display device according to an embodiment.

The embodiment FIG. 4 shows a foldable light emitting display device in which the light emitting display device 1000 is folded through a folding line FAX.

In the foldable light emitting display device, the first element area DA2 (hereinafter referred to as a component area) may be disposed on an edge of one side as shown in FIG. 4.

The optical element such as a camera or an optical sensor is positioned on the back of the first element area DA2 of FIG. 4, and the light transmitting area LTA is positioned in the first element area DA2. The light transmitting area LTA may have a structure described later.

Referring to FIG. 4, The light emitting display device 1000 may be the foldable light emitting display device. The light emitting display device 1000 may be folded outward or inward based on the folding axis FAX. When being folded outward based on the folding axis FAX, the display surfaces of the light emitting display device 1000 are respectively positioned on the outside in the third direction DR3, so that the images may be displayed in both directions. When being folded inward based on the folding axis FAX, the display surface may not be visually recognized from the outside.

The light emitting display device 1000 may include the housing, the light emitting display panel, and the cover window.

The light emitting display panel may include the display area DA and the non-display area PA. The display area DA is an area in which the image is displayed and may simultaneously be an area in which an external input is sensed. The display area DA may include pixels for displaying images.

The display area DA may include the first display area DA1 and the first element area DA2. The first display area DA1 may be divided in to a first/first display area DA1-1, a first/second display area DA1-2, and a folding area FA. The first/first display area DA1-1 and the first/second display area DA1-2 may be positioned on the left and right sides, respectively, with respect to (or based on) the folding axis FAX, and the folding area FA may be positioned between the first/first display area DA1-1 and the first/second display area DA1-. At this time, when being folded outward based on the folding axis FAX, the first/first display area DA1-1 and the first/second display area DA1-2 are positioned on both sides in the third direction DR3, and the images may be displayed in both directions. In addition, when being folded inward based on the folding axis FAX, the first/first display area DA1-1 and the first/second display area DA1-2 may not be visually recognized from the outside.

The light emitting display panel DP may have a second element area OPS, hereinafter also referred to as an optical sensor area, adjacent to the first element area DA2 of the first display area DA1.

Figure 5:
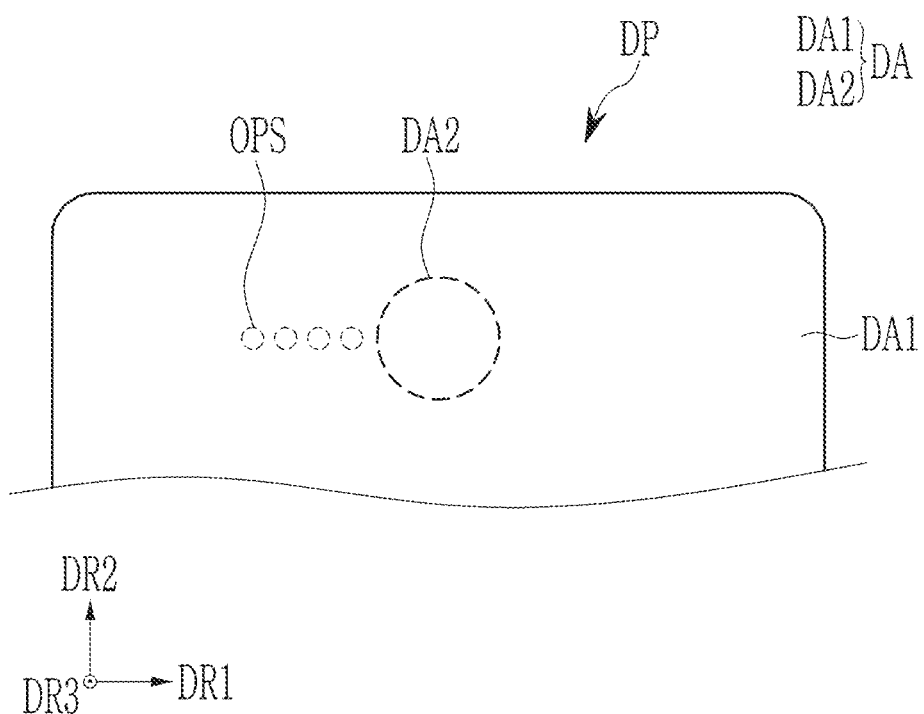
FIG. 5 is a top plan view showing a partial area of a light emitting display device according to an embodiment.

FIG. 5 is a top plan view showing an enlarged partial area of a light emitting display device according to an embodiment.

FIG. 5 shows a part of the light emitting display panel DP of the light emitting display device according to an embodiment using the display panel for a mobile phone.

The light emitting display device DP is disposed on the entire surface of the display area DA, and the display area DA is largely divided into a first display area DA1 (hereafter referred to as a main display area) and a first element area DA2 (hereafter referred to as a component area). Additionally, in the embodiment of FIG. 5, the second element area OPS is positioned in the first display area DA1 in a position adjacent to the first element area DA2. In the embodiment FIG. 5, the second element area OPS is positioned on the left of the first element area DA2. Referring to FIG. 5, the display area DA further include a second element area OPS disposed near the first element area DA2. In FIG. 5, the corresponding optical element for the first element area DA2 may be a camera, and the corresponding optical element for the second element area OPS may be an optical sensor. The second element area OPS may be made only by light transmitting parts, and may not display an image. The second element area OPS and a pixel disposed adjacent to the second element area OPS may be called together as a third display area. The position and number of the second element area OPS may vary according to embodiments.

The first display area DA1 includes a plurality of light emitting diodes (LED), and a plurality of pixel circuit units generating a light emitting current to be transmitted to a plurality of light emitting diodes (LED). Here, one light emitting diode (LED) and one pixel circuit unit are referred to as a pixel PX. In the first display area DA1, one pixel circuit unit and one light emitting diode (LED) are formed one-to-one. The first display area DA1 is hereinafter also referred to as a 'normal display area'. In FIG. 5, the structure of the light emitting display panel DP under the cut line is not shown, but the first display area DA1 may be positioned under the cut line.

The second element area OPS consists of only a transparent layer to allow light to pass through, and there is no conductive layer or semiconductor layer positioned, and an opening (hereinafter also referred to as an additional opening) may be formed at the position corresponding to the second element area OPS in the black pixel definition layer 380, the light blocking layer 220, and the color filter 230 to have a structure that does not block light.

The light emitting display device DP according to the embodiment may be largely divided into a lower panel layer and an upper panel layer. The lower panel layer is the part where the light emitting diode (LED) and the pixel circuit unit constituting the pixel are positioned, and may include up to the encapsulation layer 400 covering them. The lower panel layer extends from the substrate (referring to 110 of FIG. 22) to the encapsulation layer and also includes an anode (Anode), a black pixel definition layer (referring to FIG. 380), an emission layer (referring to EML of FIG. 22), a spacer (referring to 385 in FIG. 22), a functional layer (referring to FL of FIG. 22), and a cathode (referring to as Cathode of FIG. 22), and includes an insulating layer, a semiconductor layer, and a conductive layer between the substrate and the anode. The upper panel layer is a portion positioned on the encapsulation layer, includes a sensing insulating layer capable of sensing a touch (referring to 501, 510, 511 of FIG. 22) and a plurality of sensing electrodes (referring to 540, 541 in FIG. 22), and may include a light blocking layer (referring to 220 in FIG. 22), a color filter (referring to 230 in FIG. 22), and a planarizing layer (referring to 550 in FIG. 22), and the like.

The structure of the lower panel layer of the first display area DA1 is described with reference to FIG. 11 to FIG. 22.

Although not shown in FIG. 5, a peripheral area may be further positioned outside the display area DA. Also, FIG. 5 shows a display panel for a mobile phone, but if it is a display panel where an optical element may be positioned on the back of the display panel, the present embodiment may be applied, and it may also be a flexible display device. In the case of the flexible display device among the display device, the position of the first element area DA2 and the second element area OPS may be different from the position in FIG. 5.

Hereinafter, the structure of the pixel positioned on the lower panel layer of the light emitting display panel DP is described with reference to FIG. 6 to FIG. 23 in detail.

The following pixel structure may be a pixel structure of the first display area DA1 and/or the first element area DA2 including the second element area OPS.

The circuit structure of the pixel is described with reference to FIG. 6.

Figure 6:
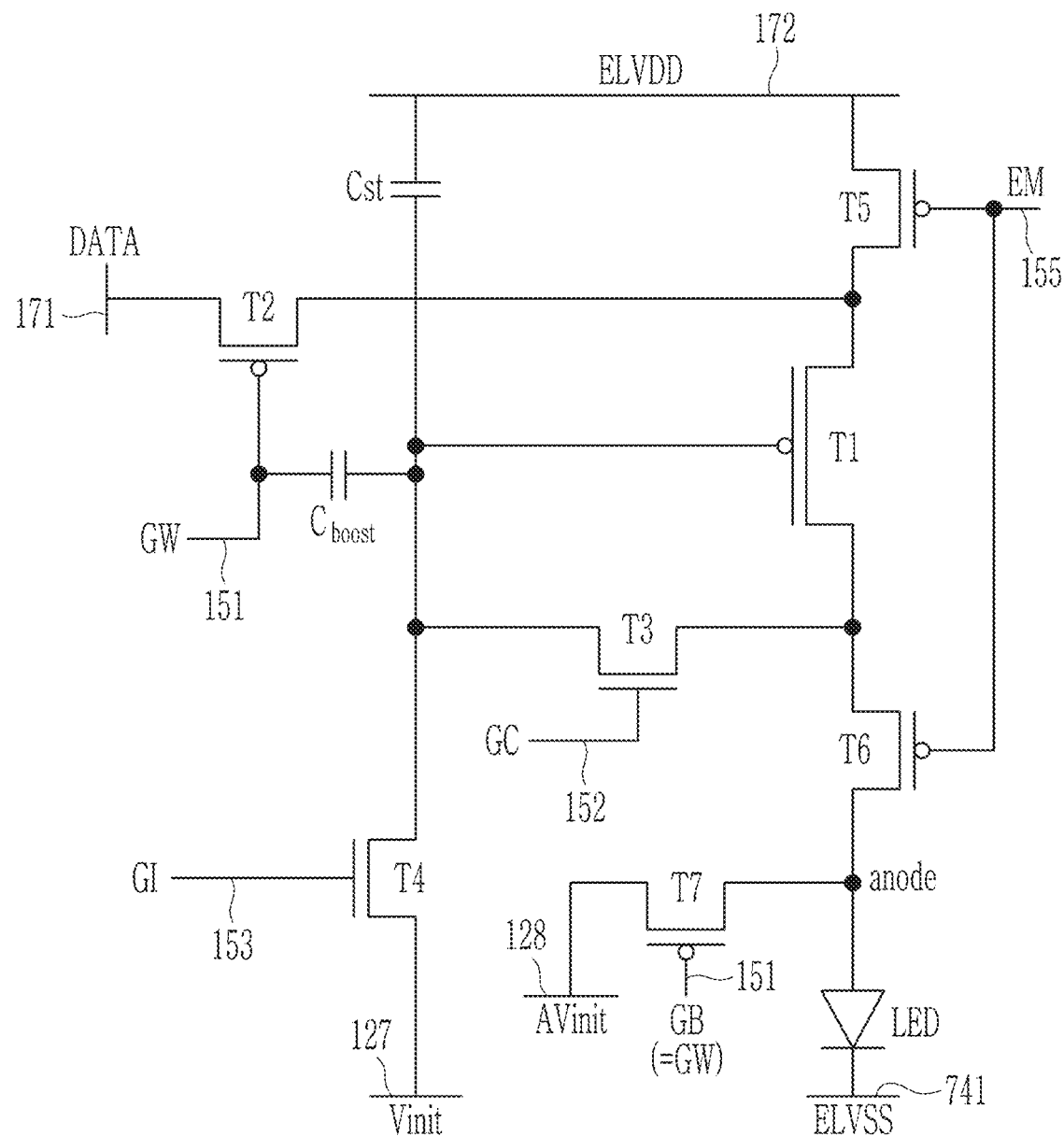
FIG. 6 is a circuit diagram of one pixel included in a light emitting display device according to an embodiment.

FIG. 6 is a circuit diagram of one pixel included in a light emitting display device according to an embodiment.

The circuit structure shown in FIG. 6 is a circuit structure of the pixel circuit unit and the light emitting diode (LED) formed in the first display area DA1 and the first element area DA2.

One pixel according to an embodiment incudes a plurality of transistors T1, T2, T3, T4, T5, T6, and T7, a storage capacitor Cst, a boost capacitor $C_{boost}$, and a light emitting diode (LED), which are connected to several wires 127, 128, 151, 152, 153, 155, 171, 172, and 741. The transistors and the capacitors except for the light emitting diode (LED) constitute the pixel circuit unit. The boost capacitor $C_{boost}$ may be omitted.

A plurality of wires 127, 128, 151, 152, 153, 155, 171, 172, and 741 are connected to one pixel PX. The plurality of wires include a first initialization voltage line 127, a second initialization voltage line 128, a first scan line 151, a second scan line 152, an initialization control line 153, a light emitting control line 155, a data line 171, a driving voltage line 172, and a common voltage line 741. The first scan line 151 connected to the seventh transistor T7 is also connected to the second transistor T2, and The seventh transistor T7 may be connected by a separate bypass control line unlike the second transistor T2.

The first scan line 151 is connected to a scan driver (not shown) to transmit a first scan signal GW to the second transistor T2 and the seventh transistor T7. A voltage of an opposite polarity to the voltage applied to the first scan line 151 may be applied to the second scan line 152 at the same timing as the signal of the first scan line 151. For example, when a negative voltage is applied to the first scan line 151, a positive voltage may be applied to the second scan line 152. The second scan line 152 transmits a second scan signal GC to the third transistor T3. The initialization control line 153 transmits an initialization control signal GI to the fourth transistor T4. The light emission control line 155 transmits a light emission control signal EM to the fifth transistor T5 and the sixth transistor T6.

The data line 171 is a wire transmitting a data voltage DATA generated from a data driver (not shown), and a luminance emitted by the light emitting diode (LED) is changed depending on a change of the magnitude of the light emitting current transmitted to the light emitting diode LED. The driving voltage line 172 applies the driving voltage ELVDD. The first initialization voltage line 127 transmits the first initialization voltage Vinit, and the second initialization voltage line 128 transmits the second initialization voltage AVinit. The common voltage line 741 applies a common voltage ELVSS to the cathode of the light emitting diode LED. The voltages applied to the driving voltage line 172, the first and second initialization voltage lines 127 and 128, and the common voltage line 741 may be a constant voltage, respectively.

The driving transistor (T1: also called a first transistor) is a p-type transistor and has a silicon semiconductor as a semiconductor layer. It is a transistor that adjusts the magnitude of the light emitting current output to the anode of the light emitting diode LED according to the magnitude of the voltage (i.e., the voltage stored in the storage capacitor Cst) of the gate electrode of the driving transistor T1. Since the brightness of the light emitting diode LED is adjusted according to the magnitude of the light emitting current output to the anode of the light emitting diode LED, the light emitting luminance of the light emitting diode LED may be adjusted according to the data voltage DATA applied to the pixel. For this purpose, the first electrode of the driving transistor T1 is disposed to receive the driving voltage ELVDD and is connected to the driving voltage line 172 through the fifth transistor T5. For this purpose, the first electrode of the driving transistor T1 is disposed to receive the driving voltage ELVDD and is connected to the driving voltage line 172 through the fifth transistor T5. Meanwhile, the second electrode of the driving transistor T1 outputs the light emitting current to the light emitting diode LED and is connected to the anode of the light emitting diode LED via the sixth transistor T6 (hereinafter referred to as an output control transistor). In addition, the second electrode of the driving transistor T1 is also connected to the third transistor T3, and the data voltage DATA applied to the first electrode is transferred to the third transistor T3. Meanwhile, the gate electrode of the driving transistor T1 is connected to one electrode (hereinafter referred to as 'a second storage electrode') of the storage capacitor Cst. The voltage of the gate electrode of the driving transistor T1 changes according to the voltage stored in the storage capacitor Cst, and accordingly, the light emitting current output by the driving transistor T1 is changed. The storage capacitor Cst serves to keep the voltage of the gate electrode of the driving transistor T1 constant for one frame. Meanwhile, the gate electrode of the driving transistor T1 may also be connected to the third transistor T3 so that the data voltage DATA applied to the first electrode of the driving transistor T1 may be transmitted to the gate electrode of the driving transistor T1 through the third transistor T3. Meanwhile, the gate electrode of the driving transistor T1 is also connected to the fourth transistor T4, and may be initialized by receiving the first initialization voltage Vinit.

The second transistor T2 is a p-type transistor and has a silicon semiconductor as a semiconductor layer. The second transistor T2 is a transistor that receives the data voltage DATA into the pixel. The gate electrode of the second transistor T2 is connected to the first scan line 151 and one electrode (hereinafter referred to as 'a lower boost electrode') of the boost capacitor $C_{boost}$. The first electrode of the second transistor T2 is connected to the data line 171. The second electrode of the second transistor T2 is connected to the first electrode of the driving transistor T1. When the second transistor T2 is turned on by the negative voltage of the first scan signal GW transmitted through the first scan line 151, the data voltage DATA transferred through the data line 171 is transmitted to the first electrode of the driving transistor T1, and finally the data voltage DATA is transmitted to the gate electrode of the driving transistor T1 and stored in the storage capacitor Cst.

The third transistor T3 is an n-type transistor and has an oxide semiconductor as a semiconductor layer. The third transistor T3 electrically connects the second electrode of the driving transistor T1 and the gate electrode of the driving transistor T1. As a result, it is a transistor that allows the data voltage DATA to be compensated by the threshold voltage of the driving transistor T1 and then stored in the second storage electrode of the storage capacitor Cst. The gate electrode of the third transistor T3 is connected to the second scan line 152, and the first electrode of the third transistor T3 is connected to the second electrode of the driving transistor T1. The second electrode of the third transistor T3 is connected to the second storage electrode of the storage capacitor Cst, the gate electrode of the driving transistor T1, and the other electrode (hereinafter referred to as 'an upper boost electrode') of the boost capacitor $C_{boost}$. The third transistor T3 is turned on by the positive voltage of the second scan signal GC transmitted through the second scan line 152 to connect the gate electrode of the driving transistor T1 and the second electrode of the driving transistor T1 and to transmit the voltage applied to the gate electrode of the driving transistor T1 to the second storage electrode of the storage capacitor Cst to be stored to the storage capacitor Cst. At this time, the voltage stored in the storage capacitor Cst is stored in a state in which the voltage of the gate electrode of the driving transistor T1 when the driving transistor T1 is turned off is stored, so that the threshold voltage Vth of the driving transistor T1 is compensated.

The fourth transistor T4 is an n-type transistor and has an oxide semiconductor as a semiconductor layer. The fourth transistor T4 initializes the gate electrode of the driving transistor T1 and the second storage electrode of the storage capacitor Cst. The gate electrode of the fourth transistor T4 is connected to the initialization control line 153, and the first electrode of the fourth transistor T4 is connected to the first initialization voltage line 127. The second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by the positive voltage of the initialization control signal GI received through the initialization control line 153, and in this case, the first initialization voltage Vinit is transmitted to the gate electrode of the driving transistor T1, the second storage electrode of the storage capacitor Cst, and the upper boost electrode of the boost capacitor $C_{boost}$ to be initialized.

The fifth transistor T5 and the sixth transistor T6 are p-type transistors, and have a silicon semiconductor as a semiconductor layer.

The fifth transistor T5 serves to transmit the driving voltage ELVDD to the driving transistor T1. The gate electrode of the fifth transistor T5 is connected to the light emitting control line 155, the first electrode of the fifth transistor T5 is connected to the driving voltage line 172, and the second electrode of the fifth transistor T5 is connected to the first electrode of the driving transistor T1.

The sixth transistor T6 serves to transmit the light emitting current output from the driving transistor T1 to the light emitting diode LED. The gate electrode of the sixth transistor T6 is connected to the light emitting control line 155, the first electrode of the sixth transistor T6 is connected to the second electrode of the driving transistor T1, and the second electrode of the sixth transistor T6 is connected to the anode of the light emitting diode LED.

The seventh transistor T7 is a p-type or n-type transistor, and the semiconductor layer has a silicon semiconductor or an oxide semiconductor. The seventh transistor T7 initializes the anode of the light emitting diode LED. The gate electrode of the seventh transistor T7 is connected to first scan line 151, the first electrode of the seventh transistor T7 is connected to the anode of the light emitting diode LED, and the second electrode of the seventh transistor T7 is connected to the second initialization voltage line 128. When the seventh transistor T7 is turned on by the negative voltage of the first scan line 151, the second initialization voltage AVinit is applied to the anode of the light emitting diode LED to be initialized. The gate electrode of the seventh transistor T7 may be connected to a separate bypass control line and may be controlled by the first scan line 151 and separate wiring. Also, The second initialization voltage line 128 to which the second initialization voltage AVinit is applied may be the same as the first initialization voltage line 127 to which the first initialization voltage Vinit is applied.

Although it has been described that one pixel PX includes seven transistors T1 to T7 and two capacitors (the storage capacitor Cst and the boost capacitor $C_{boost}$), the present invention is not limited thereto, and the boost capacitor $C_{boost}$ may be excluded according to an embodiment. Also, although the embodiment in which the third transistor and the fourth transistor are formed of the n-type transistor is described, only one of them may be formed as an n-type transistor or the other transistor may be formed as an n-type transistor. Also, according to an embodiment, seven transistors (T1 to T7) may be all formed as the p-type transistor.

In the above, the circuit structure of the pixel formed in the display area DA was described with reference to FIG. 6.

Hereinafter, the detailed planar structure and stacked structure of the pixel formed in the display area DA are described with reference to FIG. 7 to FIG. 22, and the pixel of the embodiment below includes the second element area OPS.

First, the planar structure of each layer according to the manufacturing sequence is described with reference to FIG. 7 to FIG. 21. The pixel structure shown here may be a pixel structure of the first display area DA1 and/or the first element area DA2 including the second element area OPS.

FIG. 7 to FIG. 21 are views specifically showing a structure of each layer according to a manufacturing order of a lower panel layer among a light emitting display device according to an embodiment.

Figure 7:
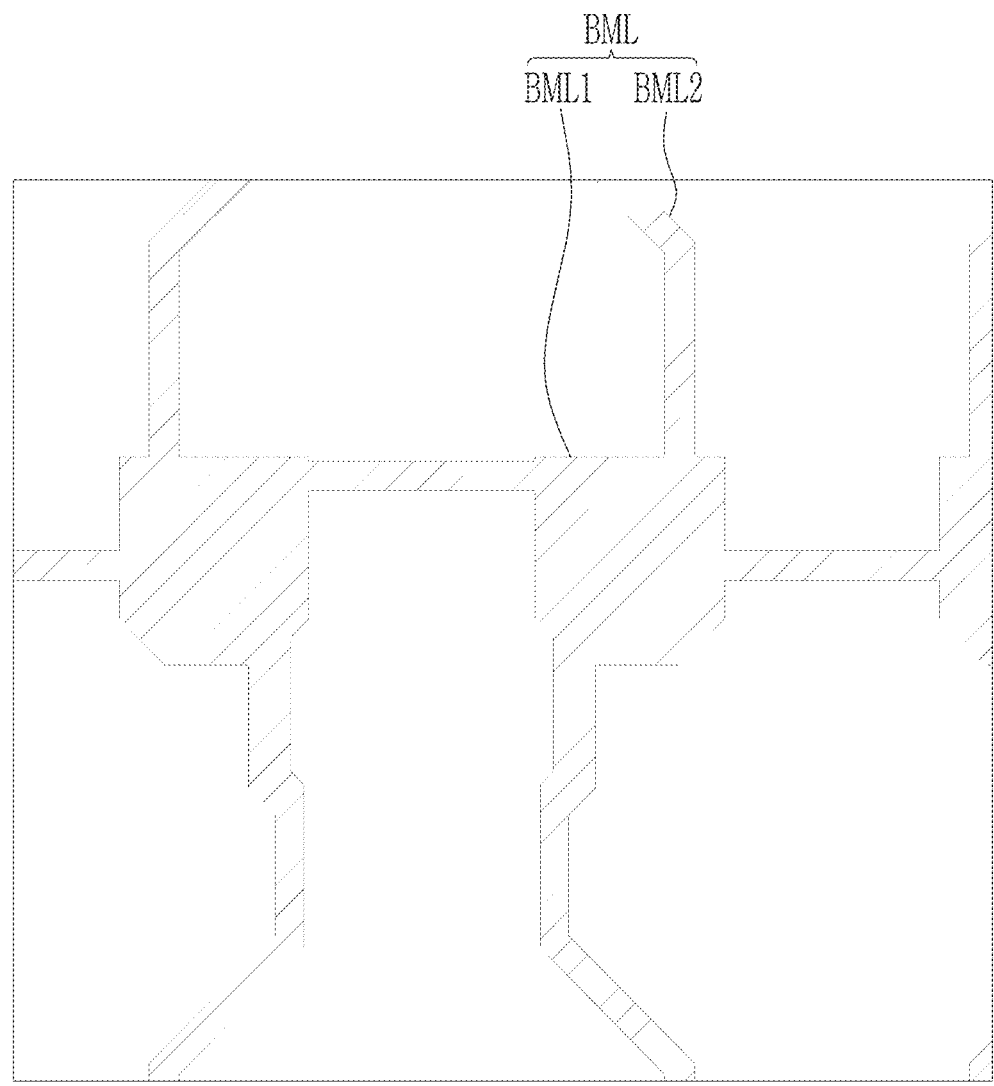

Referring to FIG. 7, a metal layer BML is positioned on a substrate 110.

The substrate 110 may include a material that does not bend due to a rigid characteristic such as glass, or a flexible material that can be bent, such as plastic or polyimide. In the case of the flexible substrate, as shown in FIG. 22, it may have a structure that a double-layered structure of polyimide and a barrier layer formed of an inorganic insulating material thereon is formed double.

The metal layer BML includes a plurality of expansion parts BML1 and a connection part BML2 connecting a plurality of expansion parts BML1 to each other. The expansion part BML1 of the metal layer BML may be formed at a position overlapping with the channel 1132 of the driving transistor T1 in a plan view among the first semiconductor layer formed later. The metal layer BML is also called a lower shielding layer, may include a metal or a metal alloy such as copper (Cu), molybdenum (Mo), aluminum (Al), titanium (Ti), etc., and may additionally include amorphous silicon and may consist of a single layer or multiple layers.

Figure 22:
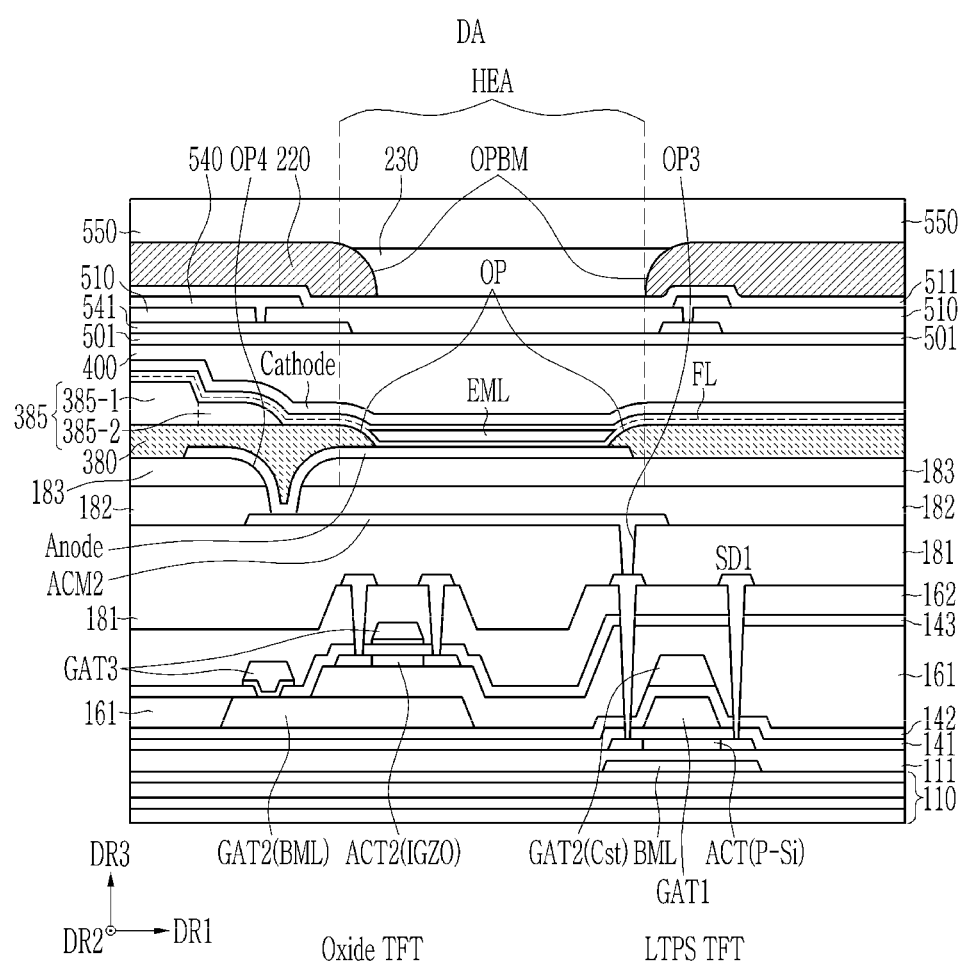
FIG. 22 is a cross-sectional view of a light emitting display device according to an embodiment.

Referring to FIG. 22, a buffer layer 111 covering the substrate 110 and the metal layer BML is disposed on the substrate 110 and the metal layer BML. The buffer layer 111 serves to block penetration of impurity elements into the first semiconductor layer 130, and may be an inorganic insulating layer including a silicon oxide (SiOx), a silicon nitride (SiNx), a silicon oxynitride (SiOxNy), or the like.

Figure 8:
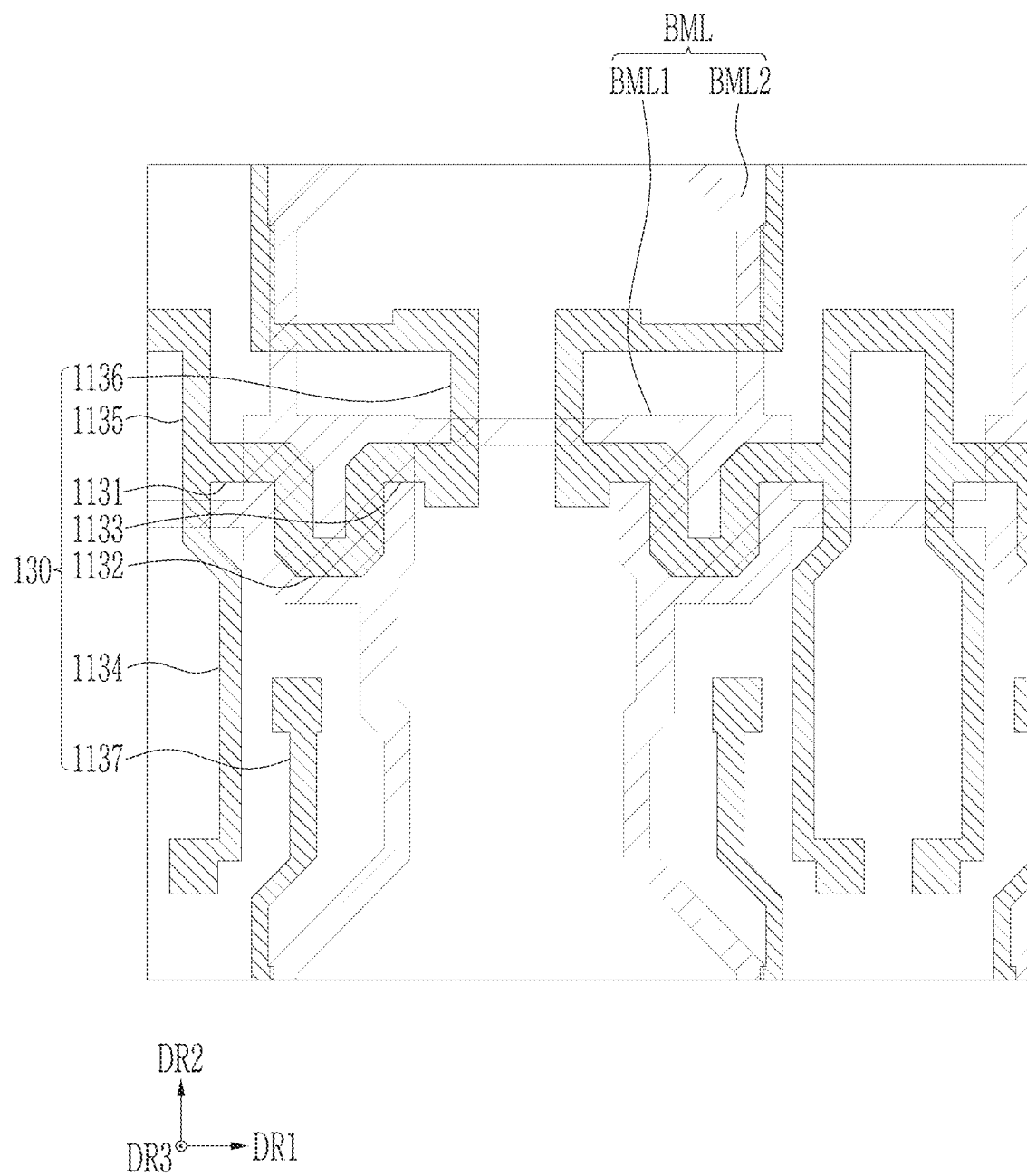

On the buffer layer 111, as shown in FIG. 8, a first semiconductor layer 130 formed of a silicon semiconductor (e.g., a polycrystalline semiconductor) is positioned. The first semiconductor layer 130 includes a channel 1132, a first area 1131, and a second area 1133 of the driving transistor T1. In addition, the first semiconductor layer 130 includes channels of the second transistor T2, the fifth transistor T5, the sixth transistor T6, and the seventh transistor T7 as well as driving transistor T1, and has areas having a conductive layer characteristic by plasma processing or doping on both sides of each channel to serve as the first and second electrodes.

The channel 1132 of the driving transistor T1 may have a curved shape in a plan view. However, the shape of channel 1132 of the driving transistor T1 is not limited thereto, and may be variously changed. For example, the channel 1132 of the driving transistor T1 may be bent into a different shape or may have a bar shape. A first area 1131 and a second area 1133 of the driving transistor T1 may be positioned on both sides of the channel 1132 of the driving transistor T1. The first area 1131 and the second area 1133 positioned in the first semiconductor layer serve as the first electrode and the second electrode of the driving transistor T1.

A channel, a first area, and a second area of the second transistor T2 are positioned in the portion 1134 extending downward from the first area 1131 of the driving transistor T1 in the first semiconductor layer 130. A channel, a first area, and a second area of the fifth transistor T5 are positioned in the portion 1135 extending upward from the first area 1131 of the driving transistor T1. A channel, a first area, and a second area of the sixth transistor T6 are positioned in the portion 1136 extending upward from the second area 1133 of the driving transistor T1. A channel, a first area, and a second area of the seventh transistor T7 are positioned in the portion 1137 that is further extended while being bent from the portion 1136 of the first semiconductor layer 130.

Referring to FIG. 22, a first gate insulating layer 141 may be positioned on the first semiconductor layer 130 including the channel 1132, the first area 1131, and the second area 1133 of the driving transistor T1. The first gate insulating layer 141 may be an inorganic insulating layer including a silicon oxide (SiOx), a silicon nitride (SiNx), a silicon oxynitride (SiOxNy), or the like.

Figure 9:
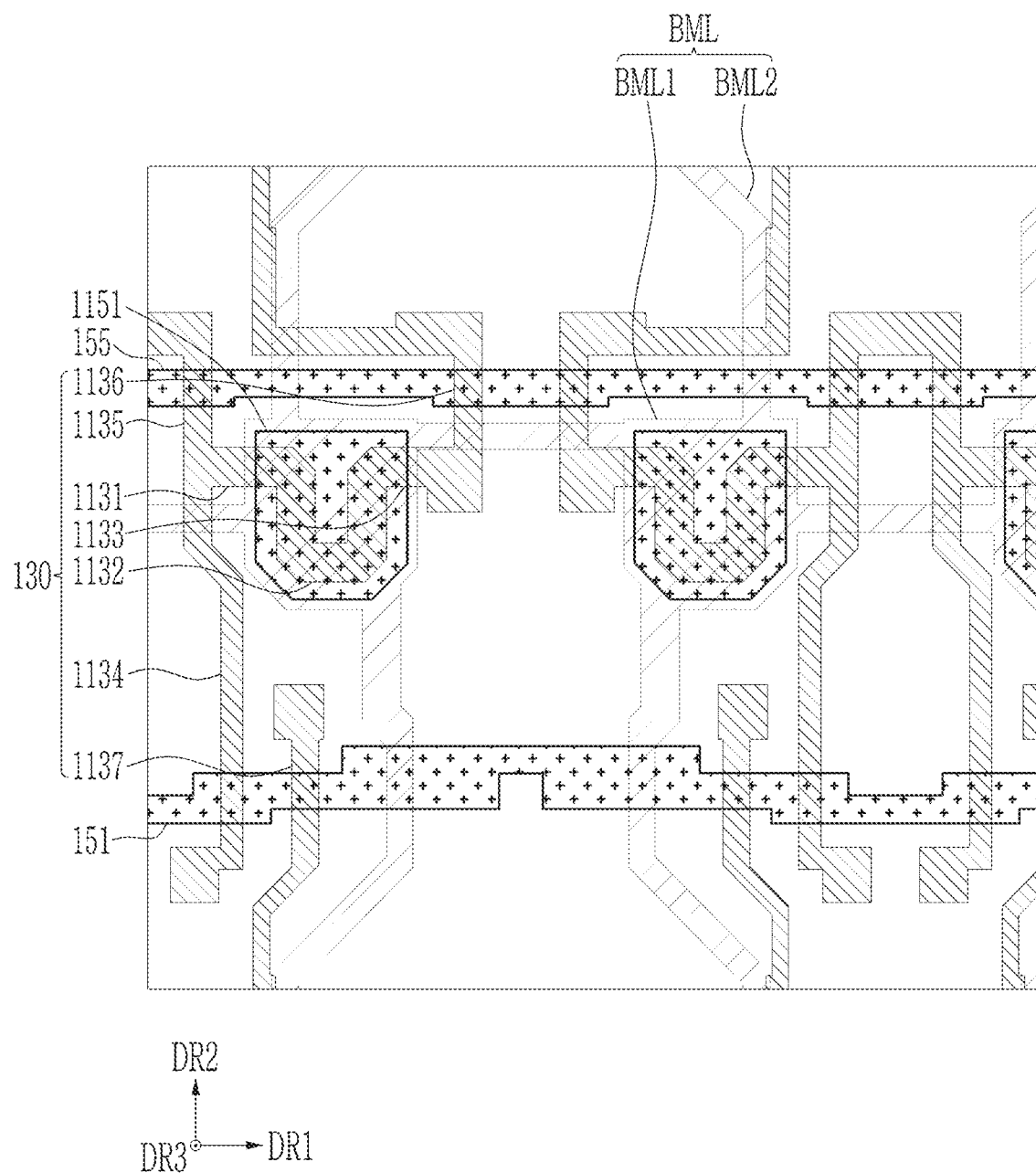

Referring to FIG. 9, a first gate conductive layer including a gate electrode 1151 of the driving transistor T1 may be positioned on the first gate insulating layer 141. The first gate conductive layer includes a gate electrode of each of the second transistor T2, the fifth transistor T5, the sixth transistor T6, and the seventh transistor T7 as well as the driving transistor T1. The gate electrode 1151 of the driving transistor T1 may overlap the channel 1132 of the driving transistor T1. The channel 1132 of driving transistor T1 is covered by the gate electrode 1151 of the driving transistor T1.

The first gate conductive layer may further include a first scan line 151 and a light emission control line 155. The first scan line 151 and the light emission control line 155 may extend in an approximately horizontal direction (hereinafter also referred to as a first direction DR1). The first scan line 151 may be connected to the gate electrode of the second transistor T2. The first scan line 151 may be formed integrally with the gate electrode of the second transistor T2. The first scan line 151 is also connected to the gate electrode of the seventh transistor T7 of the pixel of the rear stage. Meanwhile, the light emission control line 155 may be connected to the gate electrode of the fifth transistor T5 and the gate electrode of the sixth transistor T6, and the light emission control line 155 and the gate electrode of the fifth transistor T5 and the sixth transistor T6 may be integrally formed.

The first gate conductive layer may include a metal such as copper (Cu), molybdenum (Mo), aluminum (Al), titanium (Ti), or a metal alloy, and may be configured as a single layer or multiple layers.

After the first gate conductive layer including the gate electrode 1151 of the driving transistor T1 is formed, a plasma treatment or a doping process is performed to make the exposed area of the first semiconductor layer conductive. The first semiconductor layer covered by the first gate conductive layer is not conductive, and the portion of the first semiconductor layer not covered by the first gate conductive layer may have the same characteristic as the conductive layer. As a result, the transistor including the conductive portion has a p-type transistor characteristic, and the driving transistor T1, the second transistor T2, the fifth transistor T5, the sixth transistor T6, and the seventh transistor T7 may be p-type or n-type transistors.

Referring to FIG. 22, a second gate insulating layer 142 may be positioned on the first gate conductive layer including the gate electrode 1151 of the driving transistor T1 and the first gate insulating layer 141. The second gate insulating layer 142 may be an inorganic insulating layer including a silicon oxide (SiOx), a silicon nitride (SiNx), a silicon oxynitride (SiOxNy), or the like.

Figure 10:
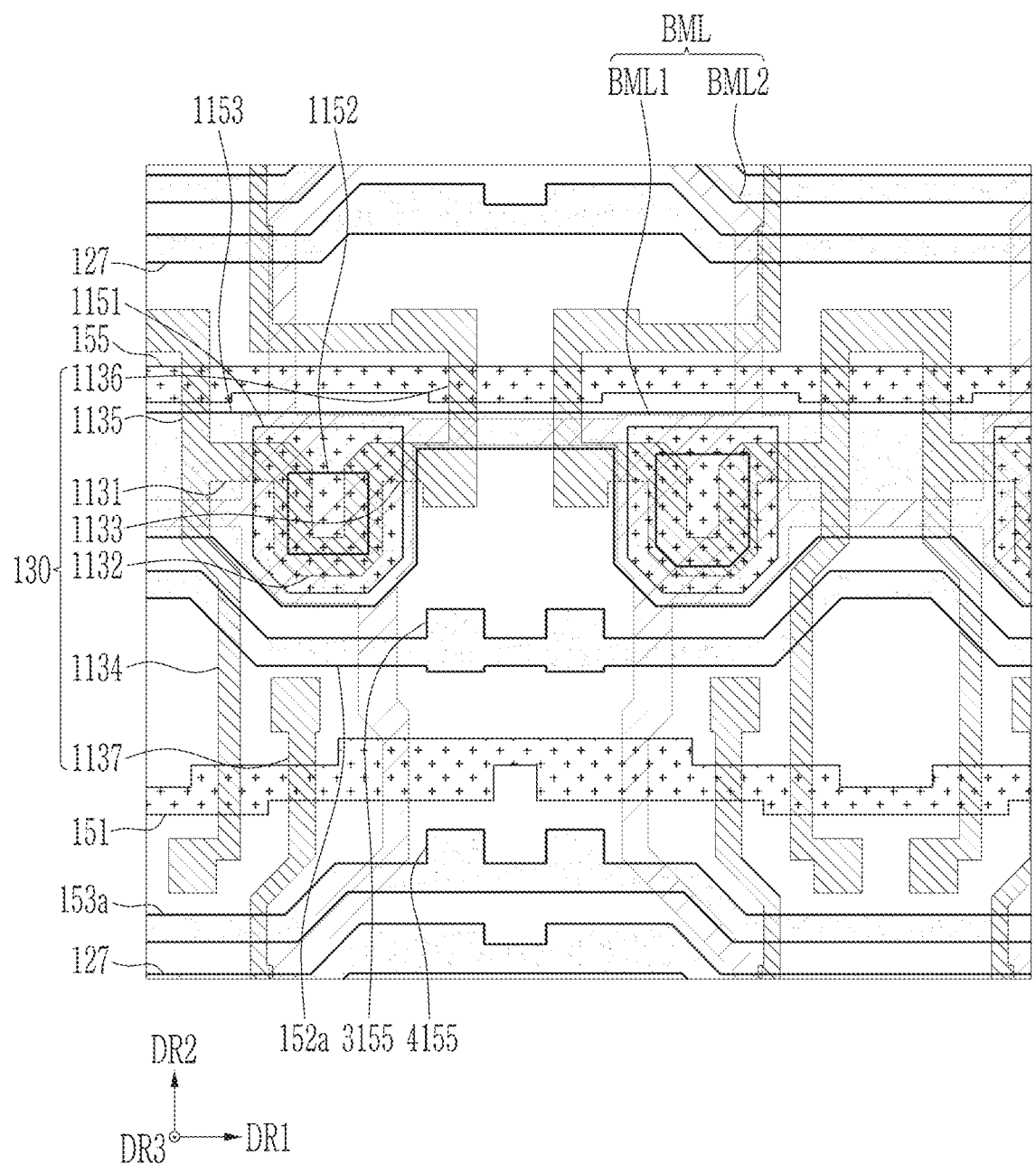

Referring to FIG. 10, a second gate conductive layer including a first storage electrode 1153 of a storage capacitor Cst, a lower shielding layer 3155 of a third transistor T3, and a lower shielding layer 4155 of a fourth transistor T4 may be positioned on the second gate insulating layer 142. The lower shielding layers 3155 and 4155 are positioned below the channels of the third transistor T3 and the fourth transistor T4, respectively, and may serve to shield from optical or electromagnetic interference provided to the channel from the lower side.

The first storage electrode 1153 overlaps the gate electrode 1151 of the driving transistor T1 to form a storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The first storage electrode 1153 is extended in the horizontal direction (the first direction DR1) and is connected to the adjacent first storage electrode 1153.

The lower shielding layer 3155 of the third transistor T3 may overlap the channel 3137 and the gate electrode 3151 of the third transistor T3. The lower shielding layer 4155 of the fourth transistor T4 may overlap the channel 4137 and the gate electrode 4151 of the fourth transistor T4.

The second gate conductive layer may further include a lower second scan line 152a, a lower initialization control line 153a, and a first initialization voltage line 127. The lower second scan line 152a, the lower initialization control line 153a, and the first initialization voltage line 127 may extend approximately in the horizontal direction (first direction DR1). The lower second scan line 152a may be connected to the lower shielding layer 3155 of the third transistor T3. The lower second scan line 152a may be formed integrally with the lower shielding layer 3155 of the third transistor T3. The lower initialization control line 153a may be connected to the lower shielding layer 4155 of the fourth transistor T4. The lower initialization control line 153a may be formed integrally with the lower shielding layer 4155 of the fourth transistor T4.

The second gate conductive layer GAT2 may include a metal or a metal alloy such as copper (Cu), molybdenum (Mo), aluminum (Al), or titanium (Ti), and may be a single layer or multiple layers.

Referring to FIG. 22, a first interlayer insulating layer 161 may be positioned on the second gate conductive layer including the first storage electrode 1153 of the storage capacitor Cst, the lower shielding layer 3155 of the third transistor T3, and the lower shielding layer 4155 of the fourth transistor T4. The first interlayer insulating layer 161 may include an inorganic insulating layer including a silicon oxide (SiOx), a silicon nitride (SiNx), a silicon oxynitride (SiOxNy), and the like, and an inorganic insulating material may be thickly formed according to an embodiment.

Figure 11:
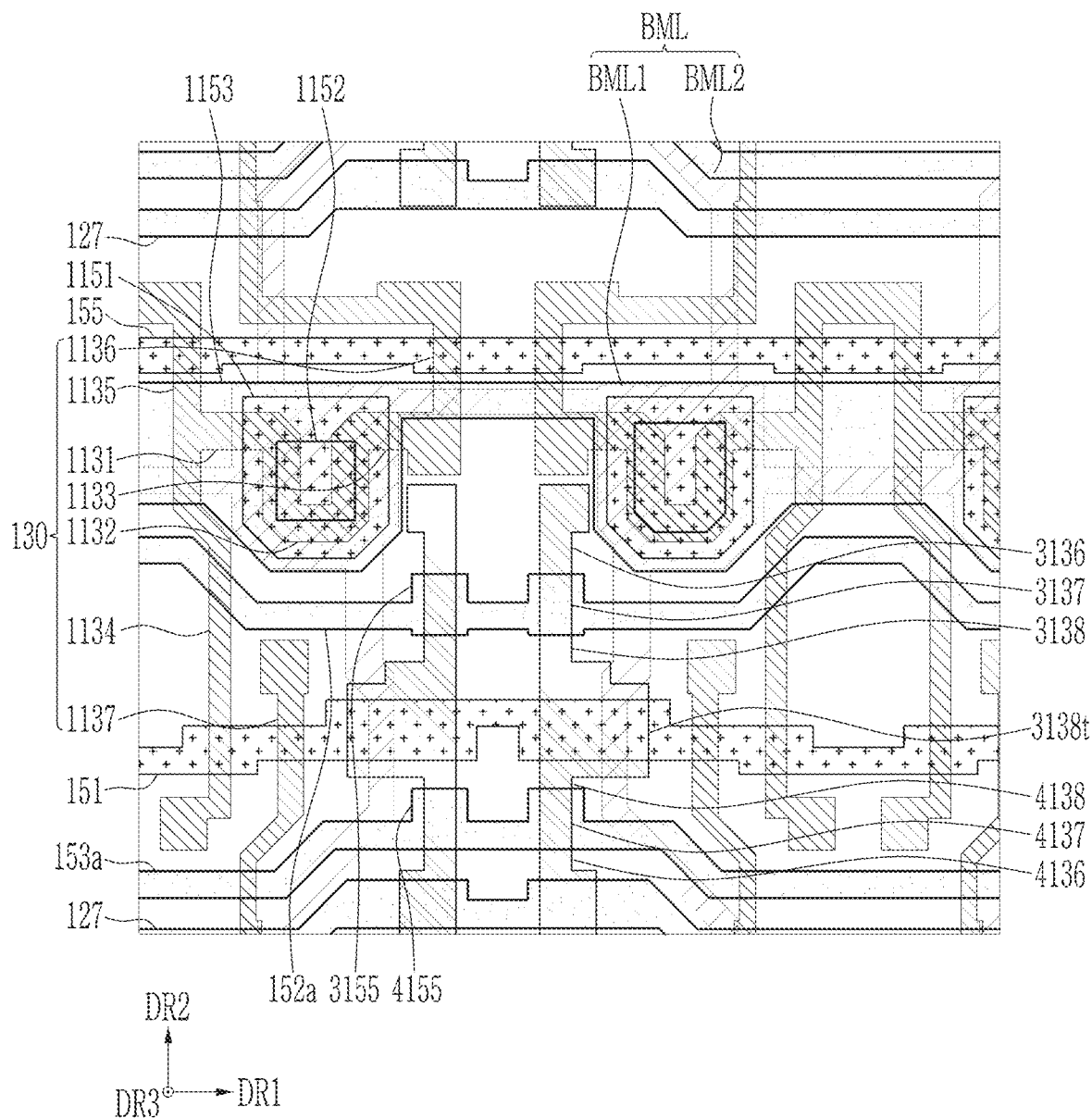

Referring to FIG. 11, on the first interlayer insulating layer 161, an oxide semiconductor layer including a channel 3137, a first area 3136, and a second area 3138 of the third transistor T3, and a channel 4137, a first area 4136, and a second area 4138 of the fourth transistor T4 may be positioned. The oxide semiconductor layer may include an upper boost electrode 3138t of the capacitor $C_{boost}$.

The channel 3137, the first area 3136, and the second area 3138 of the third transistor T3, and the channel 4137, the first area 4136, and the second area 4138 of the fourth transistor T4 may be connected to each other to form an integral body. The first area 3136 and the second area 3138 of third transistor T3 are positioned on both sides of the channel 3137 of the third transistor T3, and the first area 4136 and the second area 4138 of the fourth transistor T4 are positioned on both sides of the channel 4137 of the fourth transistor T4. The second area 3138 of the third transistor T3 is connected to the second area 4138 of the fourth transistor T4. The channel 3137 of the third transistor T3 overlaps the lower shielding layer 3155, and the channel 4137 of the fourth transistor T4 overlaps the lower shielding layer 4155.

The upper boost electrode 3138t of the capacitor $C_{boost}$ is positioned between the second area 3138 of the third transistor T3 and the second area 4138 of the fourth transistor T4. The upper boost electrode 3138t of the boost capacitor $C_{boost}$ overlaps a part of the first scan line 151 (also referred to as a lower boost electrode of the boost capacitor $C_{boost}$) such that the boost capacitor $C_{boost}$ is formed.

Referring to FIG. 22, on the oxide semiconductor layer including the channel 3137, the first area 3136, and the second area 3138 of the third transistor T3, the channel 4137, the first area 4136, and the second area 4138 of the fourth transistor T4, and the upper boost electrode 3138t of the boost capacitor $C_{boost}$, a third gate insulating layer 143 may be positioned.

The third gate insulating layer 143 may be positioned on the entire surface of the oxide semiconductor layer and the first interlayer insulating layer 161. Accordingly, the third gate insulating layer 143 may cover the upper surface and the side of the channel 3137, the first area 3136 and the second area 3138 of the third transistor T3, the channel 4137, the first area 4136 and the second area 4138 of the fourth transistor T4, and the upper boost electrode 3138t of the boost capacitor $C_{boost}$. However, the present embodiment is not limited thereto, and the third gate insulating layer 143 may not be positioned on the entire surface of the oxide semiconductor layer and the first interlayer insulating layer 161. For example, the third gate insulating layer 143 may overlap the channel 3137 of the third transistor T3 and may not overlap the first area 3136 and the second area 3138. The third gate insulating layer 143 may overlap the channel 4137 of the fourth transistor T4 and may not overlap the first area 4136 and the second area 4138.

The third gate insulating layer 143 may include an inorganic insulating layer including a silicon oxide (SiOx), a silicon nitride (SiNx), a silicon oxynitride (SiOxNy), or the like.

Figure 12:
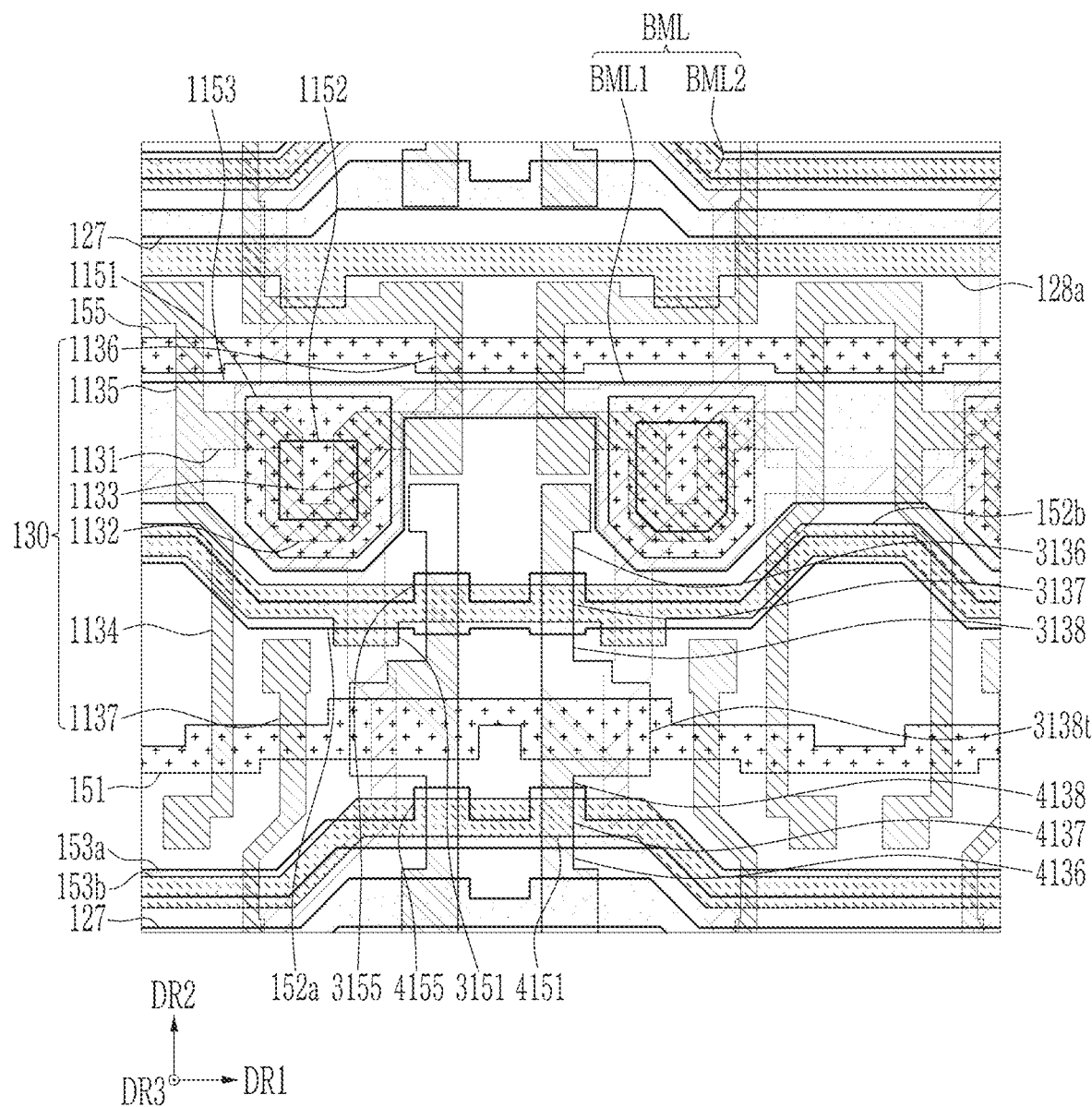

Referring to FIG. 12, on the third gate insulating layer 143, a third gate conductive layer including a gate electrode 3151 of the third transistor T3 and a gate electrode 4151 of the fourth transistor T4 may be positioned.

The gate electrode 3151 of the third transistor T3 may overlap the channel 3137 of the third transistor T3. The gate electrode 3151 of the third transistor T3 may overlap the lower shielding layer 3155 of the third transistor T3.

The gate electrode 4151 of the fourth transistor T4 may overlap the channel 4137 of the fourth transistor T4. The gate electrode 4151 of the fourth transistor T4 may overlap the lower shielding layer 4155 of the fourth transistor T4.

The third gate conductive layer may further include an upper second scan line 152b and an upper initialization control line 153b.

The upper second scan line 152b and the upper initialization control line 153b may extend in an approximately horizontal direction (first direction DR1). The upper second scan line 152b forms the second scan line 152 together with the lower second scan line 152a. The upper second scan line 152b may be connected to the gate electrode 3151 of the third transistor T3. The upper second scan line 152b may be formed integrally with the gate electrode 3151 of the third transistor T3. The upper initialization control line 153b together with the lower initialization control line 153a constitutes the initialization control line 153. The upper initialization control line 153b may be connected to the gate electrode 4151 of the fourth transistor T4. The upper initialization control line 153b may be formed integrally with the gate electrode 4151 of the fourth transistor T4.

In addition, the third gate conductive layer may further include a lower second initialization voltage line 128a. The lower second initialization voltage line 128a may extend in approximately the horizontal direction (first direction DR1), and a second initialization voltage AVinit is applied.

The third gate conductive layer GAT3 may include a metal or a metal alloy such as copper (Cu), molybdenum (Mo), aluminum (Al), or titanium (Ti), and may be composed of a single layer or multiple layers.

After forming the third gate conductive layer including the gate electrode 3151 of the third transistor T3 and the gate electrode 4151 of the fourth transistor T4, the portion of the oxide semiconductor layer covered by the third gate conductive layer is formed into the channel through a plasma treatment or a doping process, and the portion of the oxide semiconductor layer not covered by the third gate conductive layer becomes conductive. The channel 3137 of the third transistor T3 may be positioned under the gate electrode 3151 to overlap the gate electrode 3151. The first area 3136 and the second area 3138 of the third transistor T3 may not overlap the gate electrode 3151. The channel 4137 of the fourth transistor T4 may be positioned under the gate electrode 4151 to overlap the gate electrode 4151. The first area 4136 and the second area 4138 of the fourth transistor T4 may not overlap the gate electrode 4151. The upper boost electrode 3138t may not overlap the third gate conductive layer. The transistor including an oxide semiconductor layer may have characteristics of an n-type transistor.

Referring to FIG. 22, a second interlayer insulating layer 162 may be positioned on the third gate conductive layer including the gate electrode 3151 of the third transistor T3 and the gate electrode 4151 of the fourth transistor T4. The second interlayer insulating layer 162 may have a single-layer or multi-layered structure. The second interlayer insulating layer 162 may include an inorganic insulating material such as a silicon nitride (SiNx), a silicon oxide (SiOx), or a silicon oxynitride (SiOxNy), and may include an organic material according to an embodiment.

Figure 13:
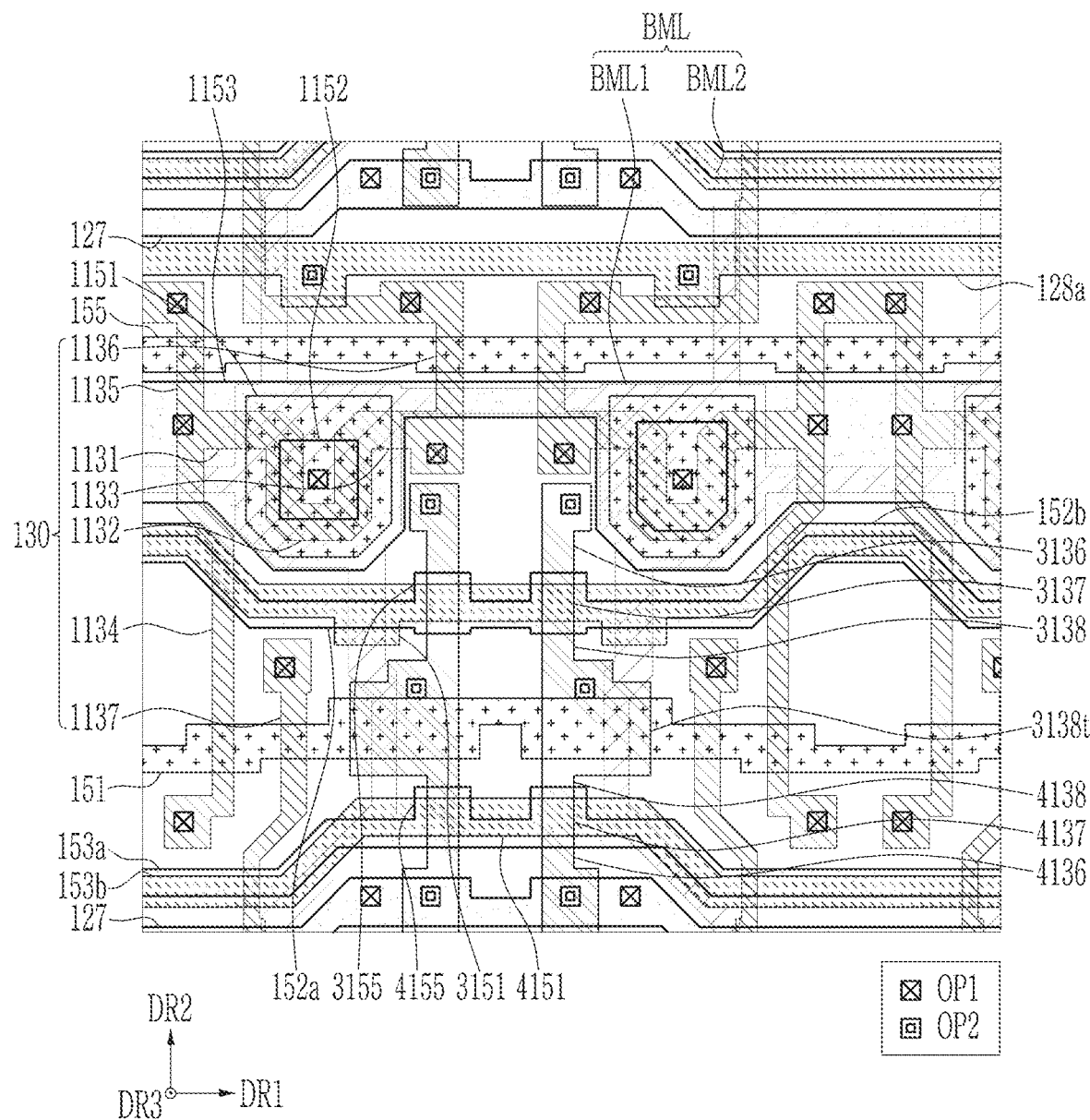

Referring to FIG. 13, two types of openings OP1 and OP2 may be formed in the second interlayer insulating layer 162. Two types of openings OP1 and OP2 may be formed using different masks.

The opening OP1 is an opening formed in at least one of the second interlayer insulating layer 162, the third gate insulating layer 143, the first interlayer insulating layer 161, the second gate insulating layer 142, and the first gate insulating layer 141 and may expose the first semiconductor layer 130, the first gate conductive layer, or the second gate conductive layer.

The opening OP2 is an opening formed in the second interlayer insulating layer 162 and/or the third gate insulating layer 143 and may expose the oxide semiconductor layer or the third gate conductive layer.

One of the opening OP1 overlaps at least a portion of the gate electrode 1151 of the driving transistor T1, and may also be formed in the third gate insulating layer 143, the first interlayer insulating layer 161, and the second gate insulating layer 142. In this case, one of the openings OP1 may overlap the opening 1152 of the first storage electrode 1153, and may be positioned inside the opening 1152 of the first storage electrode 1153.

One of the openings OP2 may overlap at least a portion of the boost capacitor $C_{boost}$, and may be further formed in the third gate insulating layer 143.

Another one of the openings OP1 overlaps at least a part of the second area 1133 of the driving transistor T1, and the third opening 3165 may be formed in the third gate insulating layer 143, the first interlayer insulating layer 161, the second gate insulating layer 142, and the first gate insulating layer 141.

Another one of the openings OP2 overlaps at least a part of the first area 3136 of the third transistor T3 and may be formed in the third gate insulating layer 143.

Figure 14:
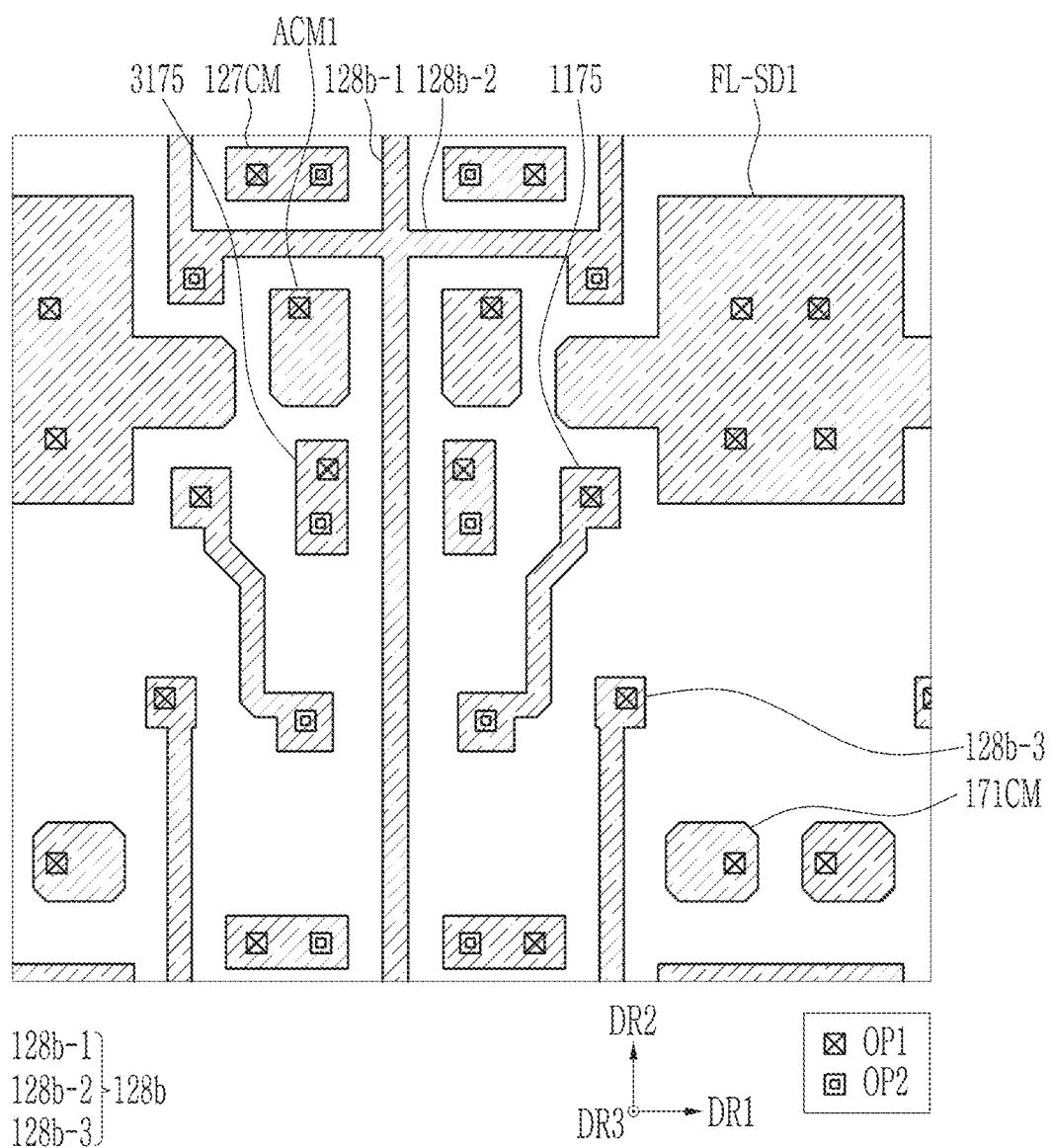
Figure 15:
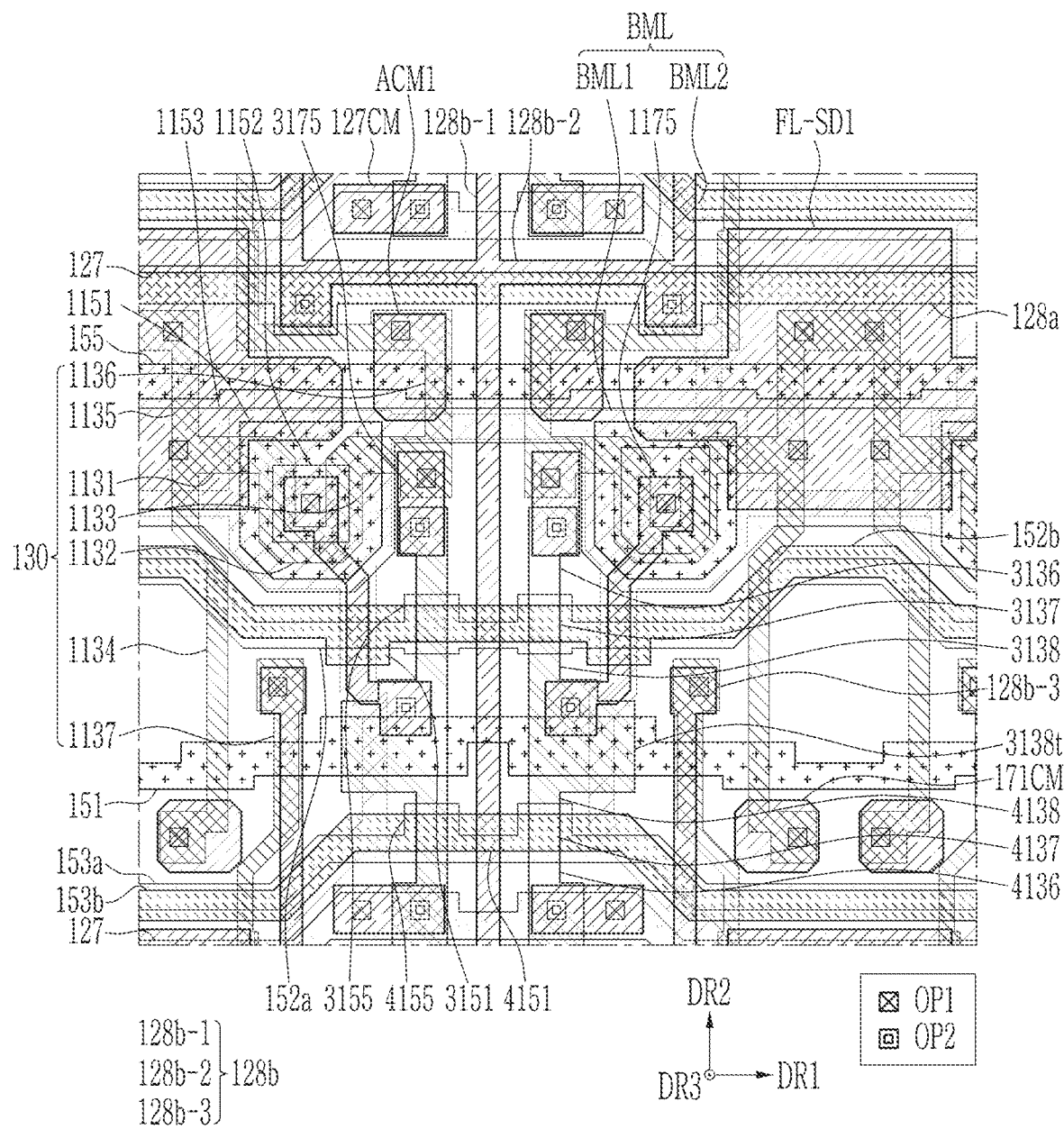

Referring to FIG. 14 and FIG. 15, a first data conductive layer including a first connection electrode 1175 and a second connection electrode 3175 may be positioned on the second interlayer insulating layer 162. FIG. 14 is a top plan view showing only the first data conductive layer, opening OP1, and opening OP2 since it may be difficult to easily recognize the first data conductive layer in FIG. 15, and FIG. 15 is a top plan view showing all layers below the first data conductive layer.

The first connection electrode 1175 may overlap the gate electrode 1151 of the driving transistor T1. The first connection electrode 1175 may be connected to the gate electrode 1151 of the driving transistor T1 through the opening OP1 and the opening 1152 of the first storage electrode 1153. The first connection electrode 1175 may overlap the boost capacitor $C_{boost}$. The first connection electrode 1175 may be connected to the upper boost electrode 3138t of the boost capacitor $C_{boost}$ through the opening OP2. Accordingly, the gate electrode 1151 of the driving transistor T1 and the upper boost electrode 3138t of the boost capacitor $C_{boost}$ may be connected by the first connection electrode 1175. In this case, the gate electrode 1151 of the driving transistor T1 may also be connected to the second area 3138 of the third transistor T3 and the second area 4138 of the fourth transistor T4 by the first connection electrode 1175.

The second connection electrode 3175 may overlap the second area 1133 of the driving transistor T1. The second connection electrode 3175 may be connected to the second area 1133 of the driving transistor T1 through the opening OP1. The second connection electrode 3175 may overlap the first area 3136 of the third transistor T3. The second connection electrode 3175 may be connected to the first area 3136 of the third transistor T3 through the opening OP2. Accordingly, the second area 1133 of the driving transistor T1 and the first area 3136 of the third transistor T3 may be connected by the second connection electrode 3175.

The first data conductive layer may further include a second initialization voltage line 128b.

The second initialization voltage line 128 has a wiring part 128b-1 extending in a vertical direction (a second direction DR2) and a first extending part 128b-2 protruding at both sides of the horizontal direction (the first direction DR1) from the wiring part 128b-1, and includes a second extending part 128b-3 positioned while again bending in the vertical direction (the second direction DR2) from the first extending part 128b-2. In the portion where the first extending part 128b-2 and the second extending part 128b-3 meet, it is electrically connected to the second initialization voltage line 128a positioned on the third gate conductive layer through the opening OP2. As a result, the second initialization voltage AVinit is transmitted in the horizontal direction (the first direction DR1) through the second initialization voltage line 128a positioned on the third gate conductive layer, and the first data conductive layer transmits it in the vertical direction (the second direction DR2) through the second initialization voltage line 128b.

The end of the second extending part 128b-3 is electrically connected to a portion 1137 of the first semiconductor layer 130 through the opening OP1.

The first data conductive layer may further include a connection part (127CM and 171CM), an anode connecting part ACM1, and an expansion part FL-SD1 (hereinafter referred to as a first expansion part).

The connection part 127CM is connected to the first initialization voltage line 127 of the second gate conductive layer through the opening OP1, and is connected to a portion 4136 of the second semiconductor layer (the oxide semiconductor layer) through the opening OP2 to transmit the first initialization voltage Vinit flowing through the first initialization voltage line 127 to the fourth transistor T4 of the oxide semiconductor layer.

The connection part 171CM is electrically connected to one portion 1137 of the first semiconductor layer 130, i.e., the second transistor T2, through the opening OP1.

The anode connecting part ACM1 is electrically connected to one portion 1136 of the first semiconductor layer 130, the sixth transistor T6, through the opening OP1.

The expansion part FL-SD1 is widely formed in order to planarize the anode positioned overlying it. The expansion part FL-SD1 is connected to a portion 1135 of the first semiconductor layer 130 through the opening OP1, the fifth transistor T5, and is also electrically connected to the first storage electrode 1153 through the opening OP1.

The first data conductive layer SD1 may include a metal such as aluminum (Al), copper (Cu), molybdenum (Mo), titanium (Ti), or a metal alloy, and may be configured as a single layer or multiple layers.

Referring to FIG. 22, FIG. 14, and FIG. 15, a first organic layer 181 may be positioned on the first data conductive layer including the first connection electrode 1175 and the second connection electrode 3175. The first organic layer 181 may be an organic insulator including an organic material, and the organic material may include at least one of polyimide, polyamide, acryl resin, benzocyclobutene, and phenol resin.

Figure 16:
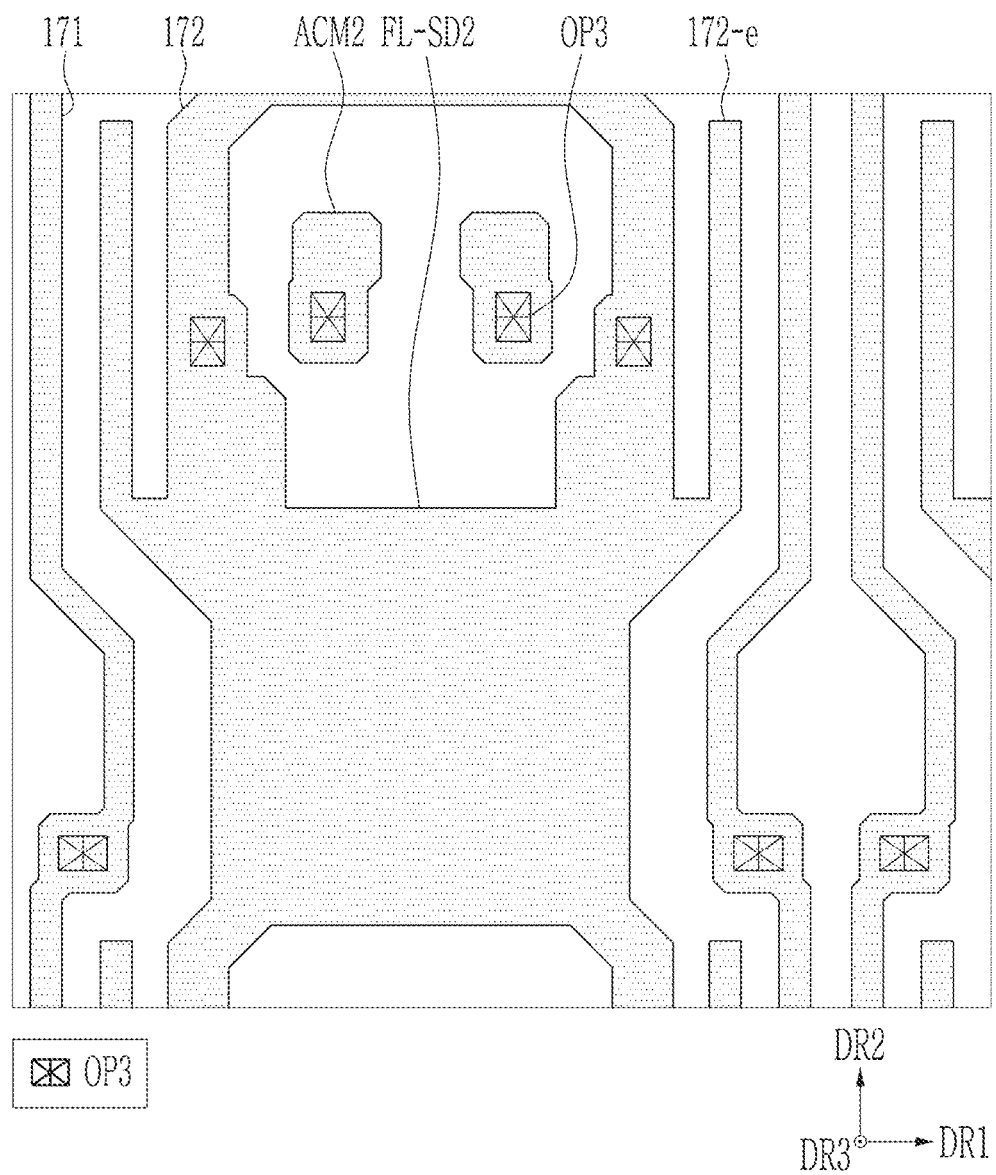
Figure 17:
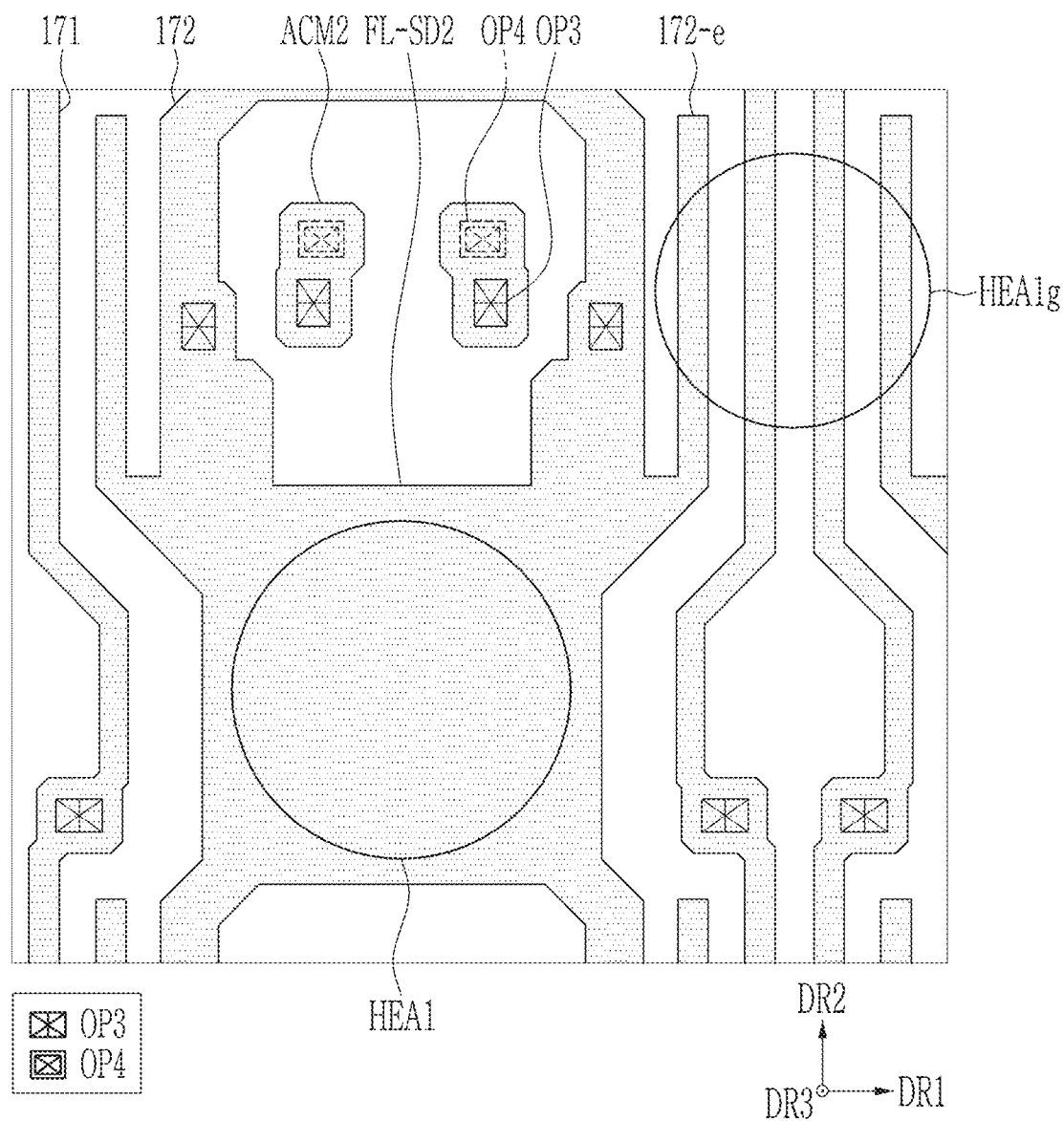
Figure 18:
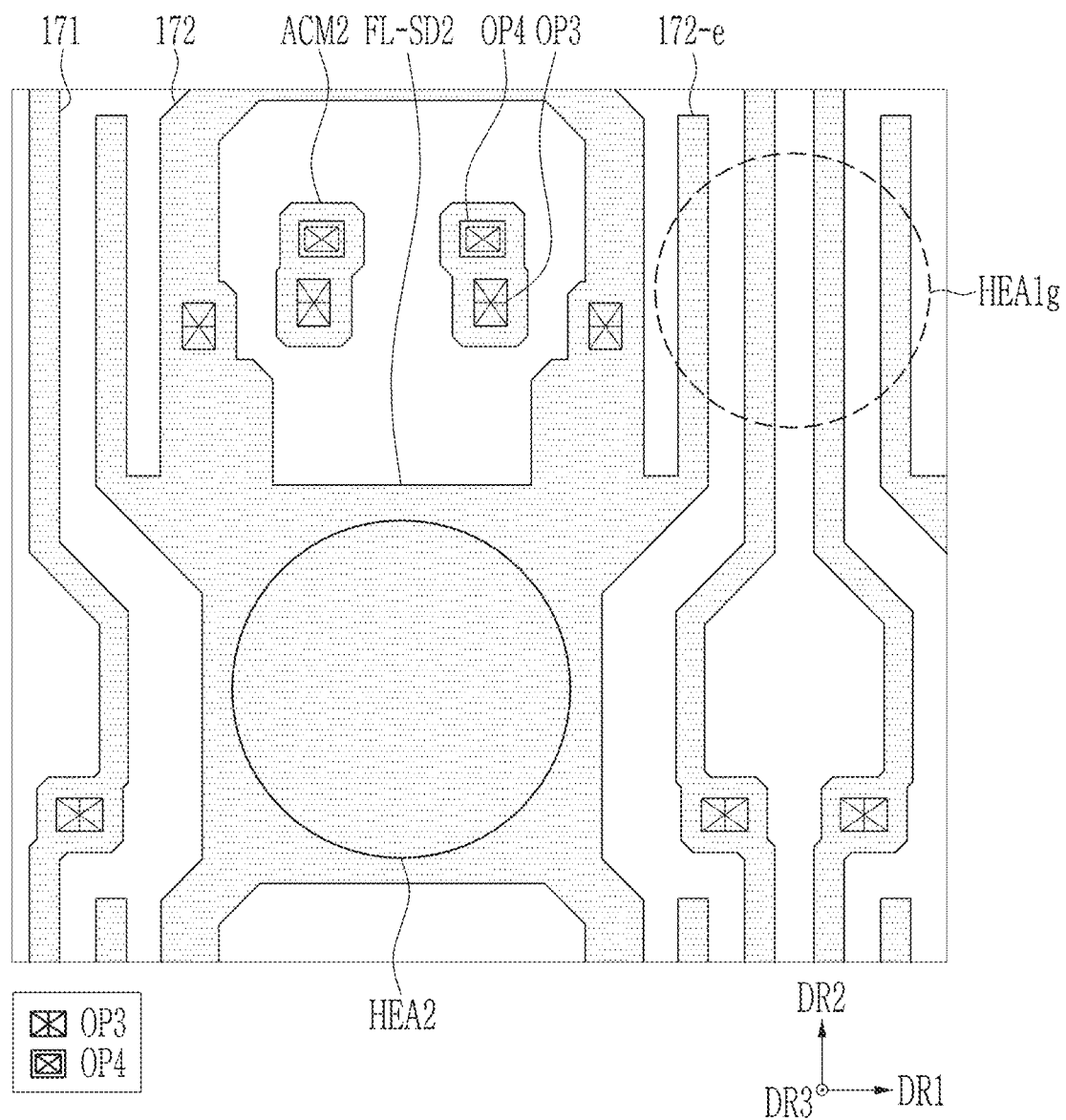
Figure 19:
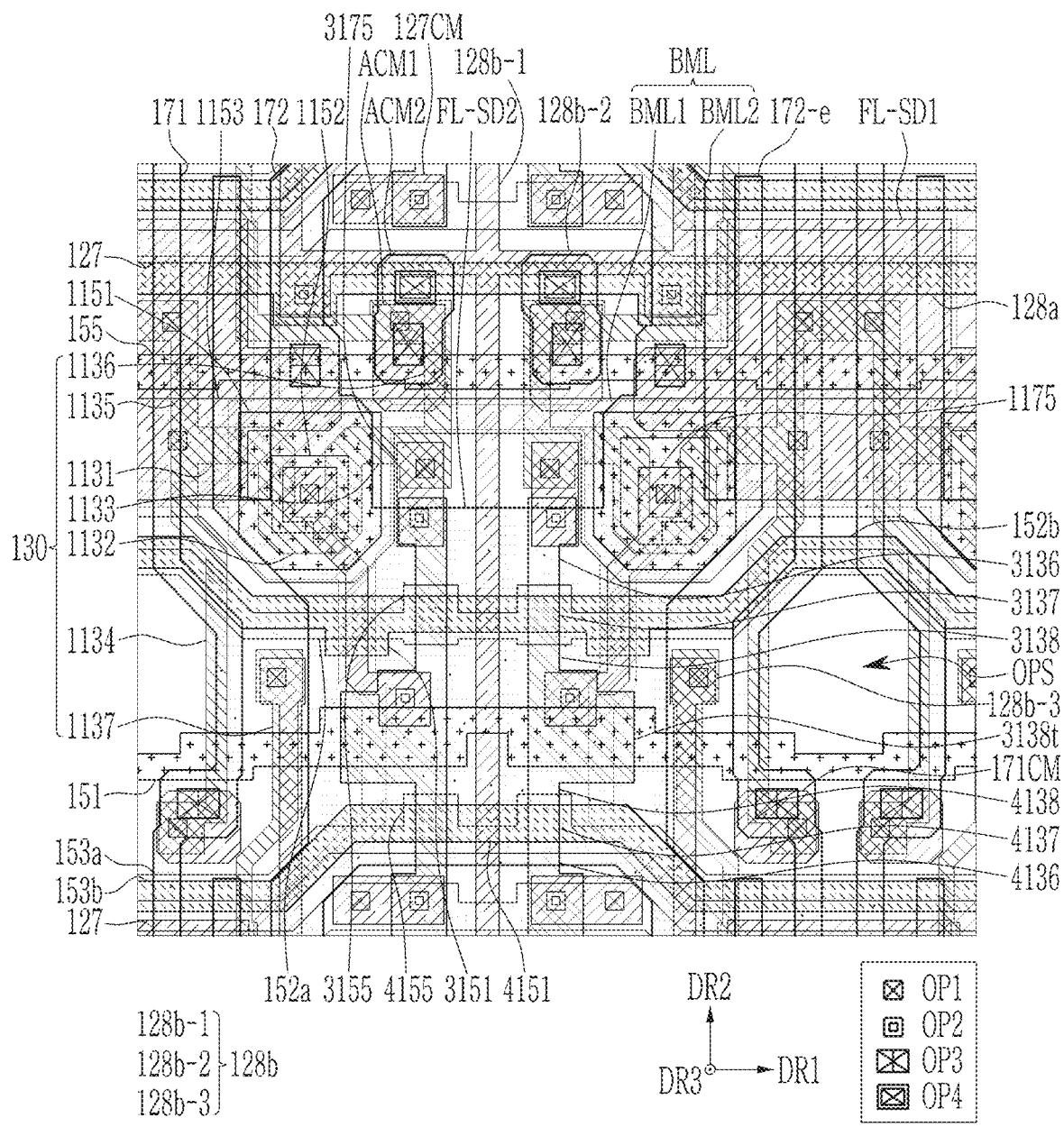

Referring to FIG. 16 to FIG. 19 and FIG. 22, the first organic layer 181 has an opening OP3. On the first organic layer 181, a second data conductive layer including a data line 171, a driving voltage line 172, and an anode connecting part ACM2 may be positioned. On the second data conductive layer, a second organic layer 182 (referred to as a lower organic layer), and a third organic layer 183 (referred to as an upper organic layer) are positioned, and the second organic layer 182 and the third organic layer 183 have an opening OP4 (hereinafter referred to as an anode connection opening). The anode connecting part ACM2 is electrically connected to the anode through the opening OP4. FIG. 16 to FIG. 18 are top plan views showing the second data conductive layer and the openings OP3 and OP4 since it is difficult to easily recognize the second data conductive layer in FIG. 19, and FIG. 16 is a top plan view showing the second data conductive layer and all surrounding layers. FIG. 16 shows the second data conductive layer and the opening OP3, FIG. 17 shows forming a second organic layer 182 in the structure of FIG. 16 and exposing the second organic layer 182 by using a slit mask to reduce an exposure amount of a partial area, and FIG. 18 shows forming a third organic layer 183 in FIG. 17 and exposing the third organic layer 183 by using a slit mask to reduce an exposure amount of a partial area. FIG. 17 and FIG. 18 also illustrate the openings OP4, which may expose the second data conductive layer and may be formed using the slit mask.

Referring to FIG. 15 and FIG. 16, the openings OP3 of the first organic layer 181 may overlap the connection part 171CM, the anode connecting part ACM1, and the expansion part FL-SD1 positioned in the first data conductive layer to expose them.

The second data conductive layer formed on the first organic layer 181 may include the data line 171, the driving voltage line 172, and the anode connecting part ACM2, and may have a structure connected to the first data conductive layer through the openings OP3 of the first organic layer 181.

The data line 171 and the driving voltage line 172 may extend in approximately a vertical direction (second direction DR2). The data line 171 is connected to the connection part 171CM of the first data conductive layer through the opening OP3, and is connected to the second transistor T2 through this. The driving voltage line 172 is electrically connected to the fifth transistor T5 and the first storage electrode 1153 through the expansion part FL-SD1 of the first data conductive layer through the opening OP3. The anode connecting part ACM2 is electrically connected to the anode connecting part ACM1 of the first data conductive layer through the opening OP3, and is electrically connected to the sixth transistor T6.

Referring to FIG. 16, the driving voltage line 172 includes the expansion part FL-SD2 (hereinafter referred to as a second expansion part) and the protruding wiring part 172-e, and has a structure that is not formed at the portion where the anode connecting part ACM2 is formed.

The expansion part FL-SD2 is formed wide in order to planarize the overlying anode.

Two protruding wiring parts 172-e of the driving voltage line 172 are formed on two sides of two data lines 171 in order to flatly form the overlying anode, so that a structure of a total of four wires 171 and 172-e is positioned below the anode.

The anode has a planarizing underlying structure including the expansion part FL-SD1 of the first data conductive layer, the wiring part 128b-1 of the first data conductive layer, the expansion part FL-SD2 of the second data conductive layer, the data line 171, the wiring part 172-e, and the organic layers 181, 182, and 183.

The expansion part FL-SD1 and the expansion part FL-SD2 are electrically connected to the driving voltage line 172 to transmit the driving voltage ELVDD.

The second data conductive layer SD2 may include a metal or a metal alloy such as aluminum (Al), copper (Cu), molybdenum (Mo), and/or titanium (Ti), and may be a single layer or multiple layers.

Referring to FIG. 22, the second organic layer 182 and the third organic layer 183 are positioned on the second data conductive layer. Two organic layers 182 and 183 are formed on the second data conductive layer so that the anode is planarized.

Even if two organic layers 182, and 183 are formed on the upper part, the complete planarizing structure cannot be readily obtained due to the conductive layer (e.g., the first data conductive layer or the second data conductive layer, etc.) positioned underneath. Referring to FIG. 26, even if two organic layers (shown as a double VIA) are used, it may be confirmed that the difference in height between the high and low portions of the upper surface, occurs by at least 50 nm. In order to prevent display quality deterioration due to reflective color bands, it is necessary to lower the height difference, and it is necessary to form a height difference value of 30 nm or less (referring to FIG. 25 to FIG. 28). Halftone exposure areas may be formed by reducing the exposure amount to some areas of at least one of the two organic layers 182 and 183. A halftone exposure area may overlap the opening of the black pixel definition layer or the anode (Anode) in a plan view, and the halftone exposure area may be wider than the opening of the black pixel definition layer or the anode (Anode).

Halftone exposure areas according to an embodiment are shown in FIG. 17 and FIG. 18.

FIG. 17 shows first halftone exposure areas HEA1 and HEA1g formed in the second organic layer 182 on the second data conductive layer. FIG. 18 shows a second halftone exposure area HEA2 formed in the third organic layer 183 positioned on the second organic layer 182.

Referring to FIG. 17 and FIG. 22, the second organic layer 182 is stacked on the second data conductive layer and is exposed by using a slit mask (for reducing the exposure amount on the partial area) to form the first halftone exposure areas HEA1 and HEA1g. Each of the first halftone exposure areas HEA1 and HEA1g may overlap the entire corresponding opening of the black pixel definition layer in a plan view and may overlap at least a part of the anode in the plan view, corresponding to the position where the opening of the black pixel definition layer and the anode (Anode) are formed in the subsequent process. The first halftone exposure area HEA1 of the second organic layer 182 may be overlapped by a red or blue emission layer and overlapped by the exposed portion of the anode (Anode) of a red or blue light emitting diode (LED) (exposed by the corresponding opening of the black pixel definition layer 380). The first halftone exposure area HEA1g of the second organic layer 182 may be overlapped by a green emission layer and overlapped by the exposed portion the anode (Anode) of the green light emitting diode (LED) (exposed the corresponding opening of the black pixel definition layer 380). The first halftone exposure area HEA1 may be referred to as the first halftone exposure area HEA1 of red or blue, and the first halftone exposure area HEA1g may be referred to as the first halftone exposure area HEA1g of green.

Referring to FIG. 17, the first halftone exposure area HEA1 of red or blue overlaps the expansion part FL-SD2 of the second data conductive layer of the second data conductive layer in a plan view. The first halftone exposure area HEA1g of green may overlap two data lines 171 and two wiring part 172-e of the second data conductive layer, a total of four wires. The first halftone exposure area HEA1g of green has a structure that overlaps the expansion part FL-SD1 of the first data conductive layer (illustrated in FIG. 14 and FIG. 15) in a plan view.

The second organic layer 182 may be an organic insulator, and may include at least one of polyimide, polyamide, acryl resin, benzocyclobutene, and phenol resin. The thickness of the second organic layer 182 may be about 1.5 μm, and may be greater than 1 μm and less than 2 μm. If the thickness of the second organic layer 182 is 1 μm, even if the thicknesses of two organic layers are formed to be 1 μm each, the planarizing characteristic may not be good. If two organic layers each have the thickness of 2 μm or more, the flatness is improved, but the flatness deteriorates as the thickness of the organic layer decreases due to an outgas phenomenon in which a gas escapes in a cure process described with reference to FIG. 24D.

Referring to FIG. 17, the second organic layer 182 has the openings OP4 for exposing the second data conductive layer. In FIG. 17, the openings OP4 are shown with dotted lines, which indicate that the openings OP4 are incomplete. In the subsequent process, the openings OP4 are completed in the third organic layer 183, and the second data conductive layer is exposed.

Referring to FIG. 18 and FIG. 22, the third organic layer 183 is stacked on the second organic layer 182 and then is exposed by using a slit mask (for reducing the exposure amount in some areas) to form the second halftone exposure area HEA2. The second halftone exposure area HEA2 of the third organic layer 183 may overlap the first halftone exposure area HEA1 of red or blue. No second halftone exposure area of the third organic layer 183 may overlap the first halftone exposure area HEA1g of green. The second halftone exposure area HEA2 may overlap the entire corresponding opening of the black pixel definition layer in a plan view and may overlap at least the exposed part of the anode (Anode) of the corresponding red or blue LED (formed in the following process) in a plan view. The second halftone exposure area HEA2 may be referred to as the second halftone exposure area HEA2 of red or blue.

The second halftone exposure area HEA2 of the third organic layer 183 may overlap the first halftone exposure area HEA1 of the second organic layer 182. The first halftone exposure area HEA1 of red or blue and the second halftone exposure area HEA2 of red or blue overlap each other in a plan view. One may be wider than the other and may include the other one in a plan view. The slit mask forming the first halftone exposure area HEA1 of red or blue and the slit mask forming the second halftone exposure area HEA2 of red or blue may be the same, such that the areas HEA1 and HEA2 may substantially have the same size and the same shape.

In FIG. 18, the green first halftone exposure area HEA1g is shown with a dotted line, indicating that the first halftone exposure area HEA1g is in the second organic layer 182, but not in the third organic layer 183.

Referring to FIG. 17 and FIG. 18, the second halftone exposure area HEA2 of red or blue overlaps the expansion part FL-SD2 and the first halftone exposure area HEA1 of the second data conductive layer in a plan view.

The third organic layer 183 may be an organic insulator, and may include at least one of polyimide, polyamide, acryl resin, benzocyclobutene, and phenol resin. The thickness of the third organic layer 183 may be about 1.5 μm, and may have be greater than 1 μm and less than 2 μm. If the thickness of the third organic layer 183 is 1 μm, even if the thicknesses of the two organic layers 182 and 183 are each 1 μm, the planarizing characteristic may not be good. If the two organic layers 182 and 183 each have the thickness of 2 μm or more, the flatness is improved, but in the curing process described with reference to FIG. 24D, the flatness deteriorates as the thickness of the organic layer decreases due to the outgas phenomenon in which the gas escapes.

Referring to FIG. 17 and FIG. 18, the second organic layer 182 and the third organic layer 183 have the openings OP4 exposing the second data conductive layer. T The anode connecting part ACM2 of the second data conductive layer is exposed through the opening OP4 of the second organic layer 182 and the third organic layer 183 so that the subsequently formed anode (Anode) and the exposed anode connecting part ACM2 are electrically connected to each other.

The positions, numbers, and/or proportions of red, green, blue pixels may be configured according to embodiments. There may be two green pixels for one red pixel and one blue pixel. One halftone exposure area may correspond to each of the red pixel and the blue pixel. Two halftone exposure areas may correspond to the two green pixels.

FIG. 19 shows the structures that are described with reference to FIG. 16 to FIG. 18.

Referring to FIG. 22, the anode (Anode) is formed on the third organic layer 183. The anode (Anode) may further include an extension part Anode-e to receive a current from the pixel circuit unit through the opening OP4.

Figure 20:
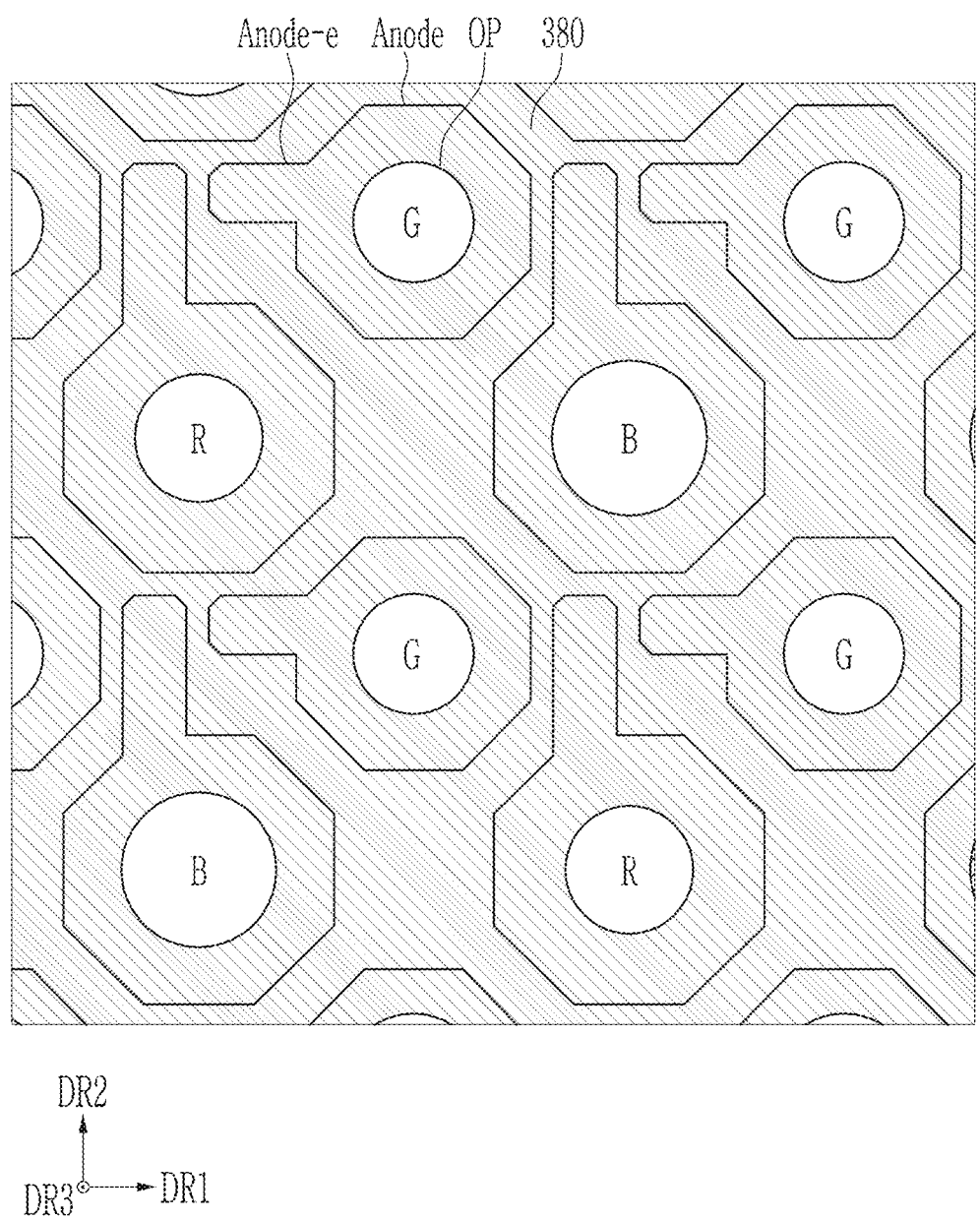

Referring to FIG. 20 and FIG. 22, the black pixel definition layer 380 is positioned on the anode (Anode), and the opening OP of the black pixel definition layer 380 is formed to overlap the anode (Anode).

Figure 21:
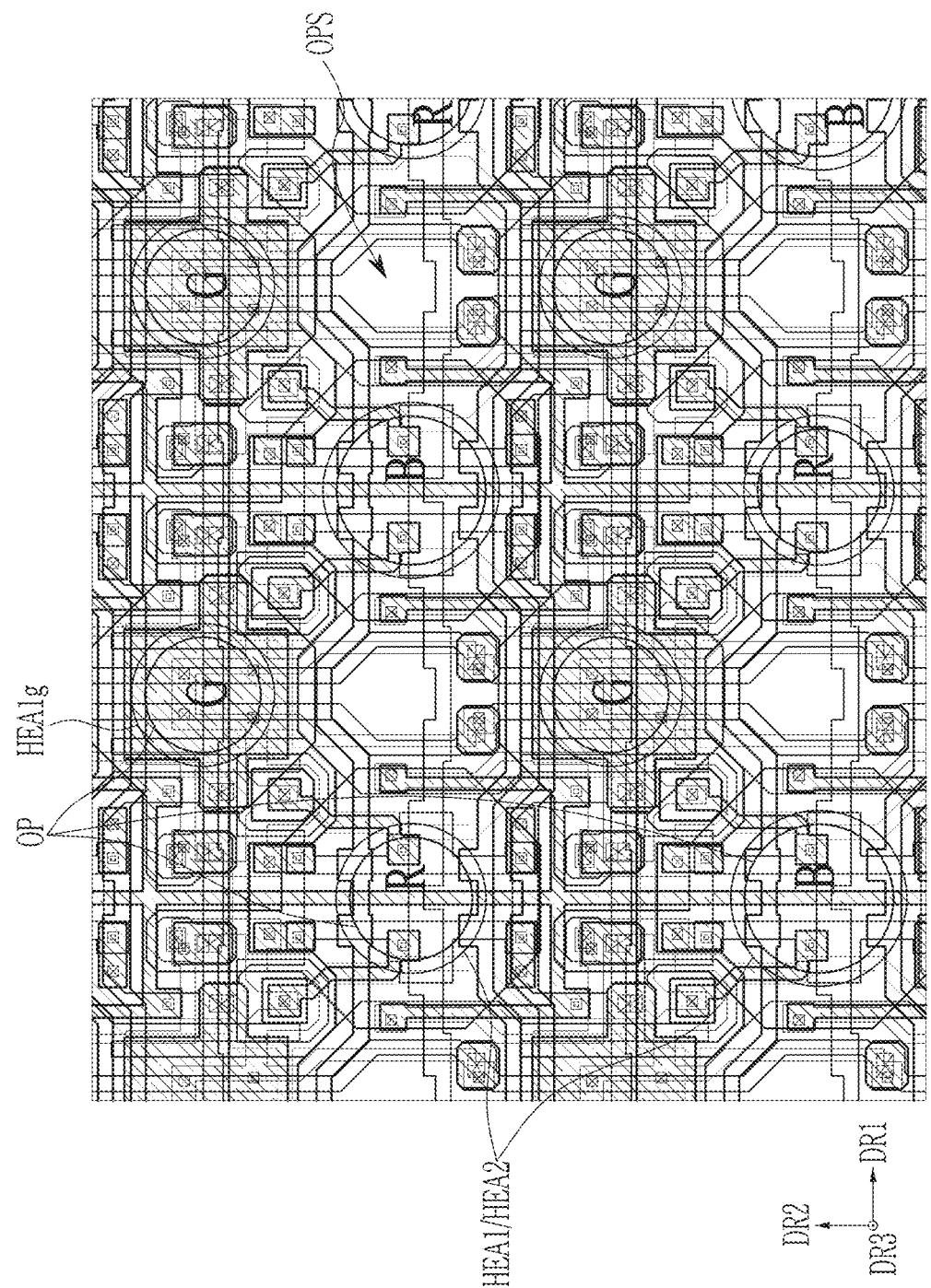
FIG. 21 is a plan view schematically showing a structure of one or more layers of a lower panel layer in a light emitting display device according to an embodiment.

A stacked structure including the structures of FIG. 19 and FIG. 20 is shown in FIG. 21.

By forming the halftone exposure areas HEA1, HEA1g, and HEA2 in two organic layers 182 and 183 positioned between the second data conductive layer and the anode, the height difference of 30 nm or less (refer to FIG. 25 to FIG. 28) is formed, and the overlying anode (Anode) may be sufficiently flat, thereby improving display quality by preventing occurrences of color spread, color separation, and/or reflective color bands in which the light reflected from the anode spreads asymmetrically.

Two organic layers, the second organic layer 182 and the third organic layer 183, are formed on the second data conductive layer, the expansion part FL-SD2 is formed in the second data conductive layer, and the expansion part FL-SD1 is formed in the first data conductive layer. As a result, the anode (Anode) may be sufficiently flat.

Referring to FIG. 5, FIG. 19, and FIG. 21, when the light emitting display device DP has the second element area OPS, each conductive layer or the semiconductor layer positioned on the lower panel layer has a structure through which light can be transmitted because no pattern is formed in the second element area OPS. The conductive layer or the semiconductor layer is not positioned in the second element area OPS, and all insulating layers such as inorganic and organic layers can be stacked. Some of all inorganic and organic layers of the lower panel layer may be optional.

If additional openings are formed in the light blocking layer 220 and/or the red color filter 230R at the position corresponding to the second element area OPS in the upper panel layer, the photosensor on the back side may sense light received through the front side of the light emitting display device.

FIG. 22 is a cross-sectional view of a light emitting display device according to an embodiment.

The display area DA may be a stacked structure of the pixels positioned in the main display area (also referred to as the first display area) and the component area (also referred to as the second display area). The pixel circuit unit may refer to the structure positioned below the second organic layer 182 and the third organic layer 183, and the light emitting diode (LED) may refer to a structure positioned above the third organic layer 183 and below the encapsulation layer 400. The layer set up to the encapsulation layer 400 is called the lower panel layer, and the layer set formed on the encapsulation layer 400 is called the upper panel layer.

A metal layer BML is positioned on the substrate 110 and may overlap the channel of a first semiconductor layer ACT1. A buffer layer 111 covering the metal layer BML is positioned on the metal layer BML, and the first semiconductor layer ACT1 is positioned on the buffer layer 111. The first semiconductor layer ACT1 includes a channel area and a first area and a second area positioned on opposite sides of the channel area.

The first gate insulating layer 141 may cover the first semiconductor layer ACT1 or overlap only the channel area of the first semiconductor layer ACT1. A first gate conductive layer GAT1 is positioned on the first gate insulating layer 141 and includes a gate electrode of a transistor (LTPS TFT) including a silicon semiconductor. The area of the first semiconductor layer ACT overlapping the gate electrode may be the channel area. The gate electrode may serve as one electrode of the storage capacitor. The transistor (LTPS TFT) includes the first semiconductor layer ACT1 and a gate electrode of a first gate conductive layer GAT1.

The first gate conductive layer GAT1 is covered by the second gate insulating layer 142, and a second gate conductive layer GAT2 is positioned on the second gate insulating layer 142. The second gate conductive layer GAT2 may include a first storage electrode of the storage capacitor (which overlaps the gate electrode) and may include a lower shielding layer for an oxide semiconductor transistor positioned under the oxide semiconductor layer ACT2.

The second gate conductive layer GAT2 is covered by the first interlayer insulating layer 161. The oxide semiconductor layer ACT2 is positioned on the first interlayer insulating layer 161. The oxide semiconductor layer ACT2 includes a channel area, and includes a first area and a second area positioned on opposite sides of the channel area.

The oxide semiconductor layer ACT2 is covered by the third gate insulating layer 143, and a third gate conductive layer GAT3 is positioned on the third gate insulating layer 143. The third gate conductive layer GAT3 may include a gate electrode of the oxide semiconductor transistor Oxide TFT and a connecting part connected to a lower shielding layer of the oxide semiconductor transistor. The oxide semiconductor transistor Oxide TFT includes the oxide semiconductor layer ACT2 and the gate electrode of the third gate conductive layer GAT3 overlapping it.

The third gate conductive layer GAT3 is covered by the second interlayer insulating layer 162, and a first data conductive layer SD1 is positioned on the second interlayer insulating layer 162. The first data conductive layer SD1 includes a connecting part, to provide a voltage or current to the first semiconductor layer ACT1 and the oxide semiconductor layer ACT2, or to transfer a voltage or current to another device.

The first data conductive layer SD1 is covered by a first organic layer 181, and a second data conductive layer SD2 is positioned on the first organic layer 181. The second data conductive layer SD2 may be connected to the first data conductive layer SD1 through the opening. The second data conductive layer SD2 is covered by the second organic layer 182 and the third organic layer 183.

The second organic layer 182 and the third organic layer 183 include the halftone exposure area (HEA) exposed with reduced exposure amount in some areas. The halftone exposure area HEA shown in FIG. 22 may represent one or more of the halftone exposure areas HEA1, HEA1g, and HEA2 shown in FIG. 17 and FIG. 18. Referring to FIG. 22, the halftone exposure area HEA may overlap the opening OP of the black pixel definition layer 380 and/or the anode (Anode) and may be wider than the opening OP the black pixel definition layer 380 and/or the exposed portion of the anode (Anode).

The anode (Anode) may be positioned on the third organic layer 183 and may be connected to the second data conductive layer SD2 through the opening OP4 positioned in the second organic layer 182 and the third organic layer 183.

The black pixel definition layer 380 may include an opening OP (hereinafter referred to as an anode exposure opening) partially exposing the anode (Anode) and may partially cover the anode (Anode). The black pixel definition layer 380 may include a light blocking material and an organic insulating material.

A spacer 385 is formed on the black pixel definition layer 380. The spacer 385 may have a step structure, including a taller (and narrower) first portion 385-1 and a shorter (and wider) second portion 385-2. The second portion 385-2 may be integrally formed with the first portion 385-1.

An emission layer EML is positioned within the opening OP of the black pixel definition layer 380 and on the anode (Anode). A functional layer FL is positioned on the spacer 385 and the exposed black pixel definition layer 380, and the functional layer FL may be formed on the entire surface of the light emitting display panel DP. The functional layer FL may include an electron injection layer, an electron transport layer, a hole transport layer, and a hole injection layer, and the functional layer FL may be positioned above and below the emission layer EML. The hole injection layer, the hole transport layer, the emission layer EML, the electron transport layer, the electron injection layer, and the cathode (Cathode) are sequentially positioned on the anode (Anode), the hole injection layer and the hole transport layer among the functional layer FL may be positioned under the emission layer EML, and the electron transport layer and the electron injection layer may be positioned under the emission layer EML.

The cathode may be a light-transmitting electrode or a reflecting electrode. The cathode may be integrally formed over the entire surface of the light emitting display panel DP except for the light transmitting area (or second element area).

An encapsulation layer 400 is positioned on the cathode (Cathode). The encapsulation layer 400 may include at least one inorganic layer and at least one organic layer, and may have a triple layer structure including a first inorganic encapsulation layer, an organic encapsulation layer, and a second inorganic encapsulation layer. The encapsulation layer 400 to protect the emission layer EML (formed of an organic material) from moisture or oxygen that may enter the display device from the outside. The encapsulation layer 400 may include inorganic layers and organic layers alternately stacked.

Sensing insulating layers 501, 510, and 511 and two sensing electrodes 540 and 541 for touch sensing are positioned on the encapsulation layer 400. The lower sensing insulating layer 501, the lower sensing electrode 541, the middle sensing insulating layer 510, the upper sensing electrode 540, and the upper sensing insulating layer 511 are sequentially stacked.

A light blocking layer 220 and a color filter 230 are positioned on the upper sensing insulating layer 511.

The light blocking layer 220 may overlap the detecting electrodes 540 and 541 and may not overlap the anode (Anode). The anode (Anode) and the emission layer EML may not be obscured by the light blocking layer 220 and the detecting electrodes 540 and 541.

Figure 23:
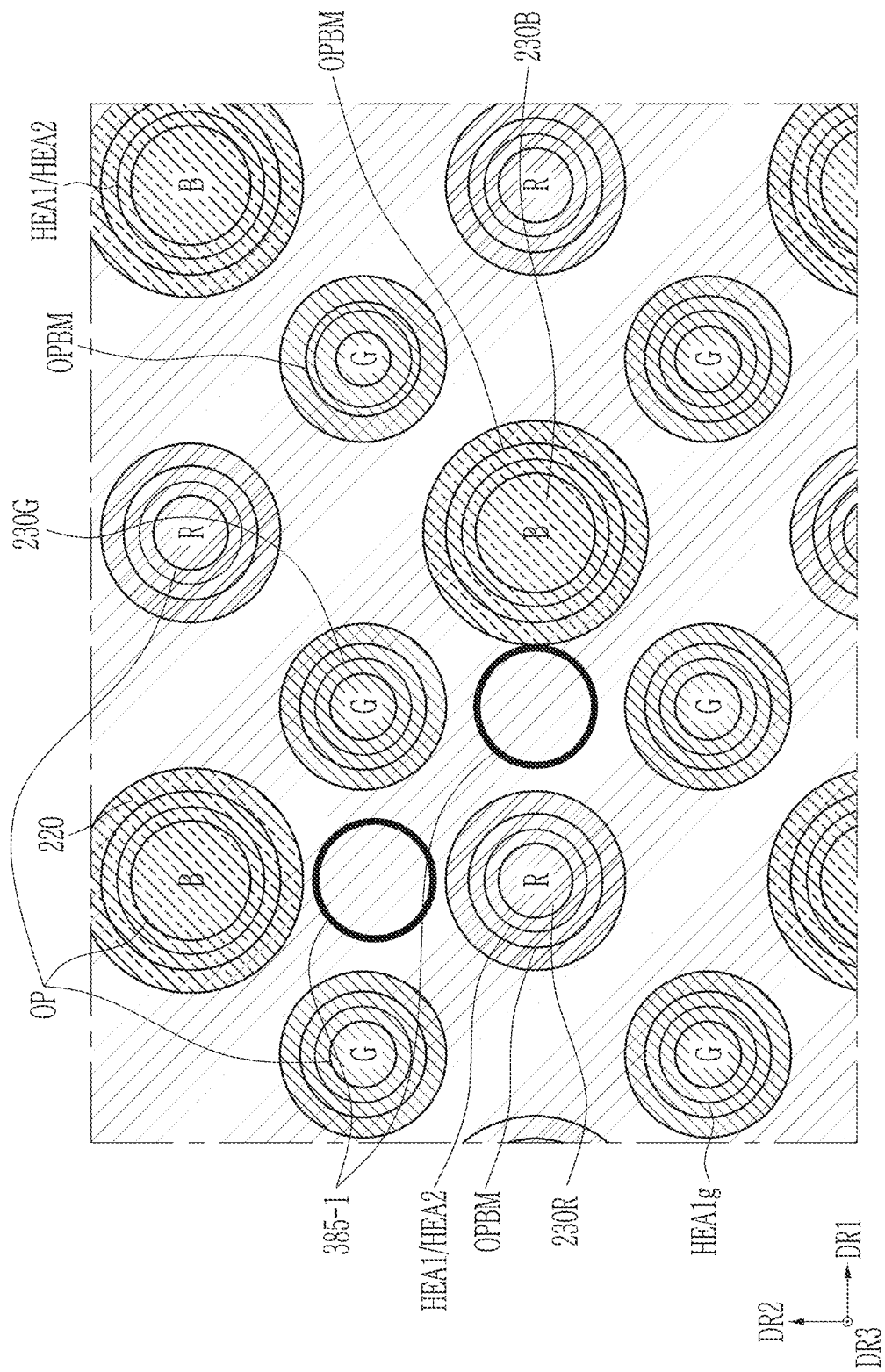
FIG. 23 is a top plan view of a part of an upper panel layer in a light emitting display device according to an embodiment.

The color filter 230 is positioned on the detecting insulating layer 511 and the light blocking layer 220. Referring to FIG. 23, the color filters 230 include a red color filter 230R that transmits red light, a green color filter 230G that transmits green light, and a blue color filter 230B that transmits blue light. Each of the color filters 230 may overlap the anode of a corresponding light emitting diode (LED). Light of the same color may be emitted from the emission layers EML and may be changed to particular colors by the color filters. The emission layer EMLs may emit light of different colors, and the displayed colors may be enhanced by color filters of the corresponding colors.

Portions of the light blocking layer 220 may be positioned between the color filters 230. The color filters 230R, 230G, and 230B may be replaced with color conversion layers or may further include color conversion layers. The color conversion layers may include quantum dots.

A planarization layer 550 covering the color filter 230 is positioned on the color filters 230. The planarization layer 550 may be a transparent organic insulator. On the planarization layer 550, a low refractive layer and an additional planarization layer may be provided to improve front visibility and light output efficiency of the display panel. Light may be refracted and/or reflected to the front by the low refractive layer and the additional planarization layer (which may have a high refractive characteristic). The low refractive layer and the additional planarization layer may be positioned directly on the color filter 230, and the planarization layer 550 may be optional.

A polarizer on the planarization layer 550 may be optional. A polarizer may prevent image deterioration as the external light is incident and reflected from the anode and the like. The black pixel definition layer 380 covers the side of the anode (Anode) to reduce the degree of reflection from the anode (Anode), and the light blocking layer 220 may reduce the incidence of light, such that deterioration of the display quality may be prevented. Therefore, there is no need to include a polarizer on the front of the light emitting display panel DP.

FIG. 23 is a top plan view of a part in an upper panel layer of a light emitting display device according to an embodiment.

In FIG. 23, in order to clearly show the relationship between the upper panel layer and the lower panel layer, the opening OP of the black pixel definition layer 380 positioned on the lower panel layer and the first portion 385-1 of the spacer 385 are shown. In FIG. 23, the halftone exposure areas HEA1, HEA1g, and HEA2 are shown.

The light blocking layer 220 includes an opening OPBM, and the opening OPBM may be wider than the opening OP and may overlap the opening OP in a plan view.

The color filters 230R, 230G, and 230B are positioned in the openings OPBM of the light blocking layer 220. The color filters 230R, 230G, and 230B fill the opening OPBM of the light blocking layer 220, and may be positioned on a portion of the upper surface and/or lateral surfaces of the light blocking layer 220. The remaining portion of the upper surface of the light blocking layer 220 may not be covered by the color filters 230R, 230G, and 230B. In FIG. 23, the color filters 230R, 230G, and 230B and the light blocking layer 220 are shown with different hatching so that they may be easily distinguished. One color filter of the color filters 230R, 230G, and 230B may have color filter openings, and the other two color filters may fill the color filter openings.

Referring to FIG. 23, the first portion 385-1 of the spacer 385 may overlap the light blocking layer 220 in a plan view. The first portion 385-1 of the spacer 385 is formed between the black pixel definition layer 380 and the light blocking layer 220 in the third direction DR3.

Each of the halftone exposure areas HEA1, HEA1g, and HEA2 is larger than the corresponding opening OP of the black pixel definition layer 380 and is smaller than the corresponding opening OPBM of the light blocking layer 220. The halftone exposure areas HEA1, HEA1g, and HEA2 overlap the color filters 230R, 230G, and 230B in a plan view.

One or more of the halftone exposure areas HEA1, HEA1g, and HEA2 may be larger than one or more of the openings OPBM of the light blocking layer 220.

The halftone exposure areas HEA1, HEA1g, and HEA2 are larger than the openings OP of the black pixel definition layer 380, so that the anodes exposed through the openings OP may be substantially flat. As a result, the light reflected from each anode does not spread asymmetrically, so the reflective color bands due to color separation caused by the reflected light are reduced, and the image display quality is improved. In the halftone exposure areas HEA1, HEA1g, and HEA2 of the third organic layer 183, the height difference may be 30 nm or less (referring to FIG. 25 to FIG. 28).

FIG. 24A, FIG. 24B, FIG. 24C, and FIG. 24D are cross-sectional views showing structures formed in a process of planarizing an organic layer of a light emitting display device using a slit mask according to an embodiment.

The organic layer indicated by reference numeral 182/183 may represent the second organic layer 182 and/or the third organic layer 183. The halftone exposure area HEA may represent one of the halftone exposure areas HEA1 and HEA1g of the second organic layer 182 or the halftone exposure area HEA2 of the third organic layer 183 described above. The forming of the halftone exposure area on the second organic layer 182 is mainly described, and the forming of the halftone exposure area on the third organic layer 183 may be substantially the same.

Figure 24A:
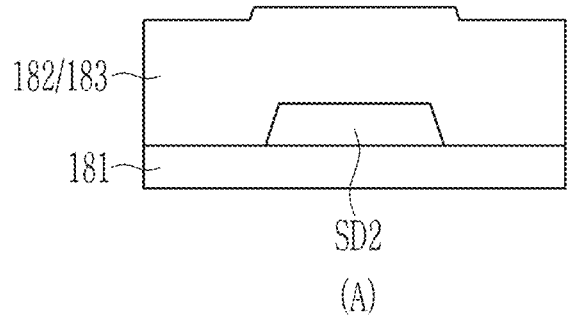
FIG. 24D is a cross-sectional view showing a structure formed in a step of planarizing an organic layer of a light emitting display device by using a slit mask according to an embodiment.

Referring to FIG. 24A, the second data conductive layer SD2 is formed on the first organic layer 181, and then the second organic layer 182 is formed on the second data conductor layer SD2.

A step is formed in the second organic layer 182 due to the height/thickness of the second data conductive layer SD2. When the third organic layer 183 is formed on the second organic layer 182, the step or height difference may be reduced. Nevertheless, referring to FIG. 26, the height difference of at least 50 nm occurs even when two organic layers (double VIA in FIG. 26) are used. In order to form the height difference (between the high portion or halftone exposure portion of the organic layer overlapping the layer SD2 and the low portion or neighboring portion of the organic layer not overlapping the layer SD2) to 30 nm or less, the steps shown in FIG. 24B, FIG. 24C, and FIG. 24D are performed.

Figure 24B:
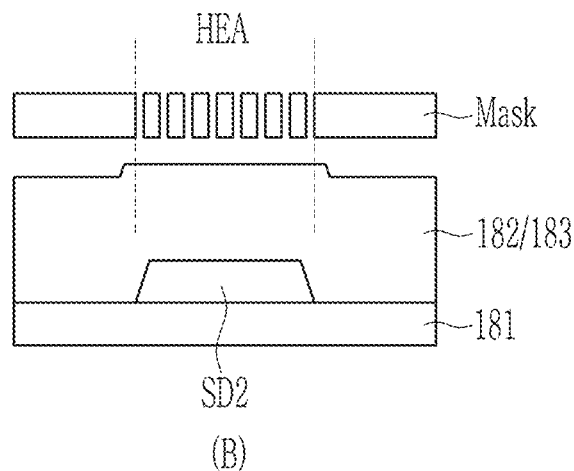

Referring to FIG. 24B, the second organic layer 182 is exposed by a mask Mask including slits. The slits of the mask Mask are positioned over the position for the halftone exposure area HEA of the second organic layer 182. The second organic layer 182 may have a positive characteristic so that exposed portions of the layer 182 are. Since the amount of the exposure is reduced by the mask material between the slits, the removed amount of the layer 182 is reduced. The material of the mask Mask may have transmittance of more than 0% and less than or equal to 15% of the transmittance of the slits of the mask Mask.

The halftone exposure area HEA formed in the organic layer (182/183) may be more precisely planarized by configuring the mask Mask. In general, the slits formed in the mask Mask may have a constant interval so that the transmitted light may be transmitted at a constant interval. The transmittance of (portions of) the mask Mask may be reduced by reducing the number and/or size(s) of the corresponding slits; the transmittance of (portions of) the mask Mask may be increased by increasing the number of the corresponding slits. The transmittance of a material portion of the mask Mask may be 1.5% or more and 7.7% or less of the transmittance of the slits. Before the exposure of the halftone exposure area HEA of the organic layer 182/183, the exposure amount required for the planarizing is calculated, the slit pattern is formed accordingly, and the exposure amount required for each portion in the halftone exposure area HEA is provided, such that the planarization may be optimized.

Figure 24C:
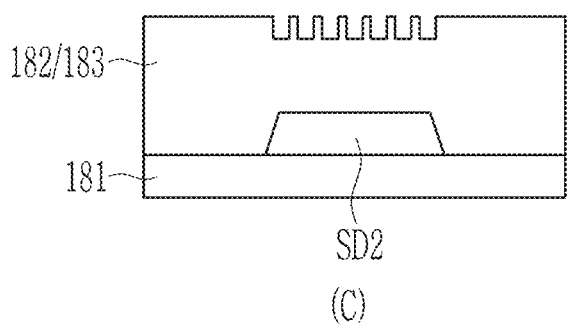
Figure 24D:
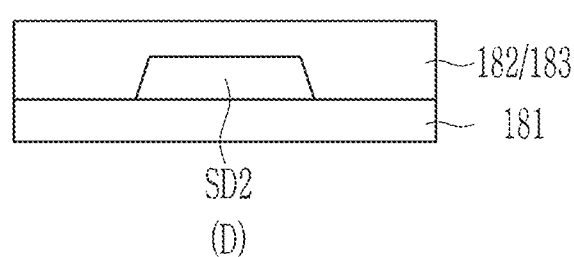

After the exposure/development is performed, referring to FIG. 24C, the portion of the layer 182/183 corresponding to the slits may have a slit pattern. The slit pattern may be substantially identical to, similar to, or different shape from the pattern of the slits of the mask Mask.

Referring to FIG. 24D, after a curing process is performed, as a gas exits the organic layer 182/183, the organic layer 182/183 contracts and has a reduced thickness. If the organic layer too thick, the amount of the generated gas increases, and the gas may significantly affect other elements, so the flatness of the organic layer may deteriorate.

The thickness of each of the second organic layer 182 and the third organic layer 183 may be about 1.5 μm, and may be greater than 1 μm and less than 2 μm. If the second organic layer 182 and the third organic layer 183 are each 1 μm or less, the planarizing characteristic may be unsatisfactory. If two organic layers 182 and 183 each have a thickness of 2 μm or more, the flatness is improved, but the flatness may deteriorate due to an outgas phenomenon in which gas escapes.

Through the configuration of the thicknesses of the organic layers and the process described with reference to FIG. 24A, FIG. 24B, FIG. 24C, and FIG. 24D, the top surface portion of the organic layer 182/183 overlapping the layer SD2 and the top surface portion of the organic layer 182/183 not overlapping the layer SD2 may have a height difference of 30 nm or less.

FIG. 25, FIG. 26, FIG. 27, FIG. 28A, and FIG. 28B are views showing a planarization characteristic and a reflective color band characteristic in a light emitting display device according to one or more embodiments.

Figure 25:
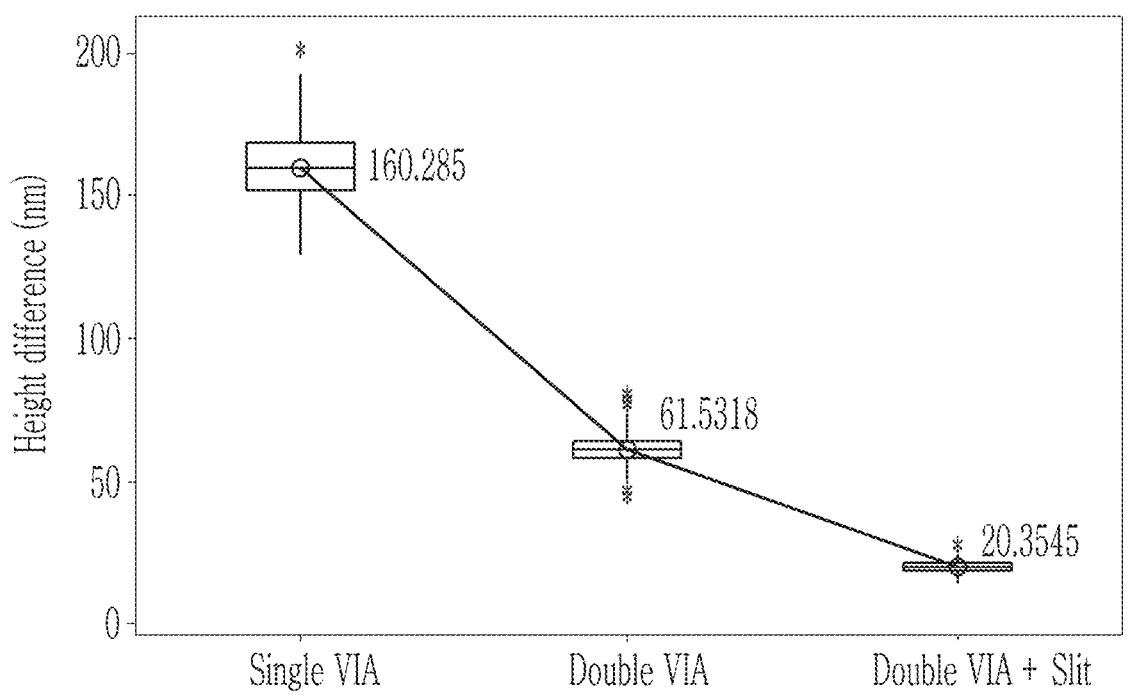
Figure 26:
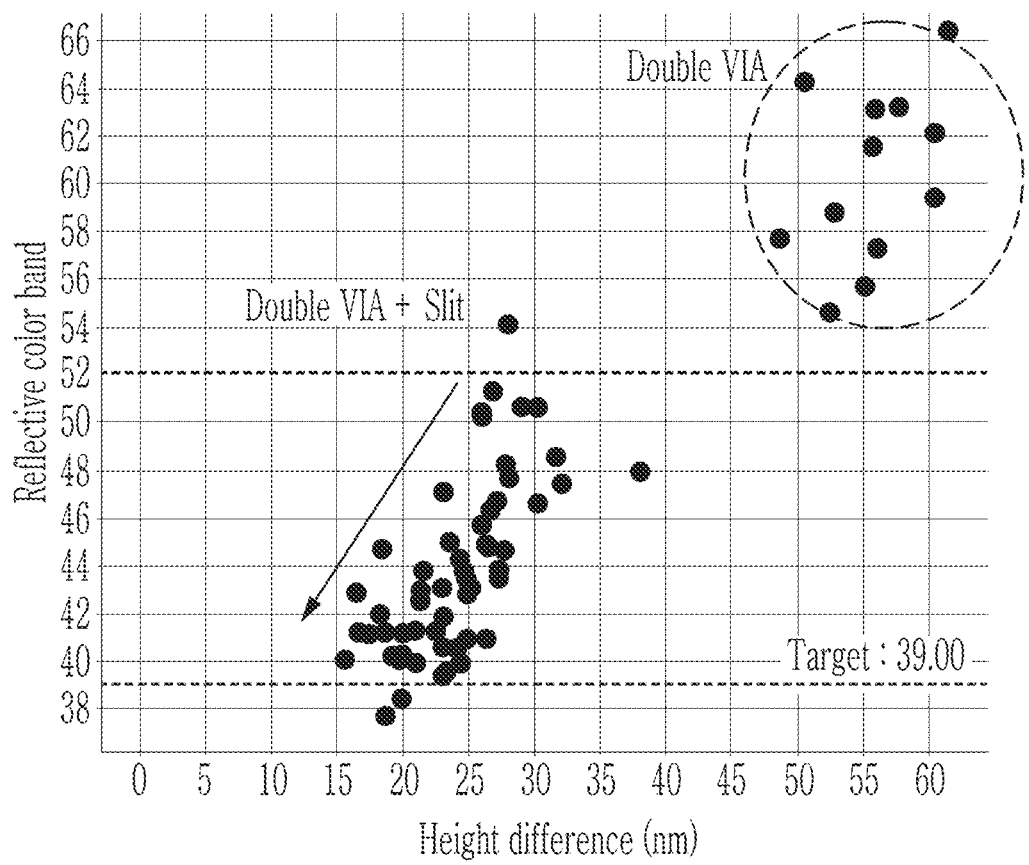

The height difference measured in FIG. 25 to FIG. 27 is difference between a highest point (referring to Max in FIG. 28A and FIG. 28B) and a lowest point (referring to Min in FIG. 28A and FIG. 28B) of the upper surface of the anode (Anode) formed on the organic layer and is significantly related to (and substantially equal to) the height difference between the highest point and lowest point of the upper surface of the organic layer. The larger the height difference, the worse the flatness; the smaller the height difference, the better the flatness.

The flatness characteristics for three examples are described with reference to FIG. 25.

In FIG. 25, "single VIA" is a case in which only one organic layer is formed on a second data conductive layer as a comparative example, and "double VIA" is a case in which two organic layers are formed on a second data conductive layer as a comparative example, and the two comparative examples in which a halftone exposure area is not formed. In FIG. 25, "double VIA+Slit" relates involves two organic layers formed on a second data conductive layer and a halftone exposure area formed for further planarizing.

FIG. 25 shows an average height difference of each tested example, wherein the average height difference of "single VIA" is 160.285 nm, the average height difference of "double VIA" is 61.5318 nm, and the average height difference of "double VIA+Slit" is 20.3545 nm. The flatness is optimized in "VIA+Slit."

FIG. 26 shows the relationship between the height difference and the reflective color band, and only the comparative example (double VIA) and the present embodiment (double VIA+Slit) are compared.

In FIG. 26, the reflective color band values are numerically expressed on a y-axis and represent the extents to which reflective color bands occur, that is, the extents to which one or more different colors other than a constant color appear. The larger the value of the reflective color band, the more severe the reflective color bands appear.

In FIG. 26, the relationship between the height difference on the x-axis and the reflective color bands on the y-axis is substantially in direct proportion. When the height difference is large, the value of the reflective color band is large; when the height difference is small, the value of the reflective color band is small.

Referring to FIG. 26, in "double VIA," the value of the reflective color band may be over 52. In "double VIA Slit," the value of the reflective color band may reach the target value of 39. The target value of 39 of the reflective color band may advantageously prevent the user from recognizing the reflective color band.

The planarizing characteristics and the reflective color bands taken in the comparative example and the embodiment are described with reference to FIG. 27.

In FIG. 27, Comparative Examples 1 and 2 are two comparative examples of "double VIA" of FIG. 25 and FIG. 26, and Embodiments 1 and 2 are two examples "double VIA+Slit" of FIG. 25 and FIG. 26. Comparative Example 1 is has the height difference is 60 nm, Comparative Example 2 has the height difference is 45 nm, Example Embodiment 1 has the height difference is 30 nm, and Example Embodiment 2 has the height difference is 20 nm.

Referring to FIG. 27, the flatness is generally lower in green (Green) than in red (Red) and blue (Blue). In Embodiment 2, the flatness is optimized (with the minimum height difference of 20 mm) for all colors Green, Blue, and Red.

When the flatness is poor in green (Green), a green component may appear large in the reflection color band.

In Embodiment 2, since the height difference is lowered, the flatness is improved, and the degree of appearance of the reflective color bands is reduced. Advantageously, the green component may not appear undesirably large.

Figure 28A:
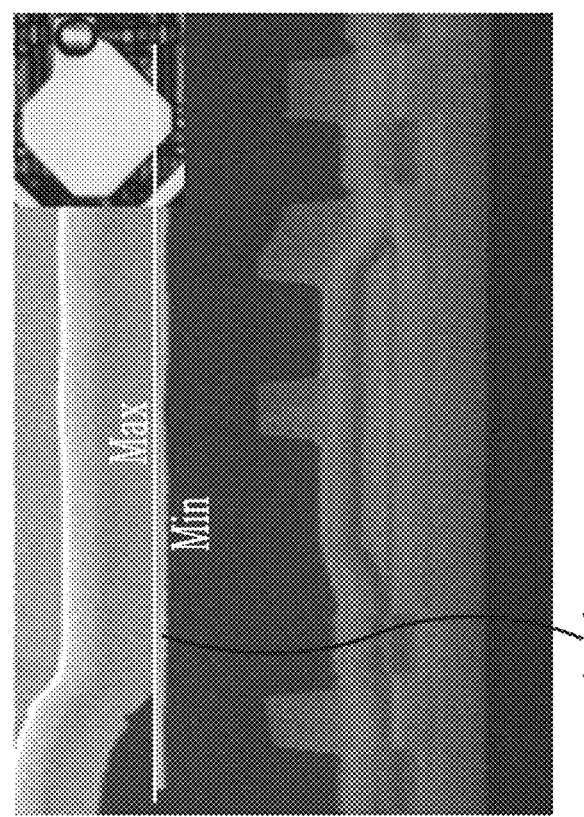
FIG. 28B shows a planarization characteristic and a reflective color band characteristic in a light emitting display device according to one or more embodiments.
Figure 28B:
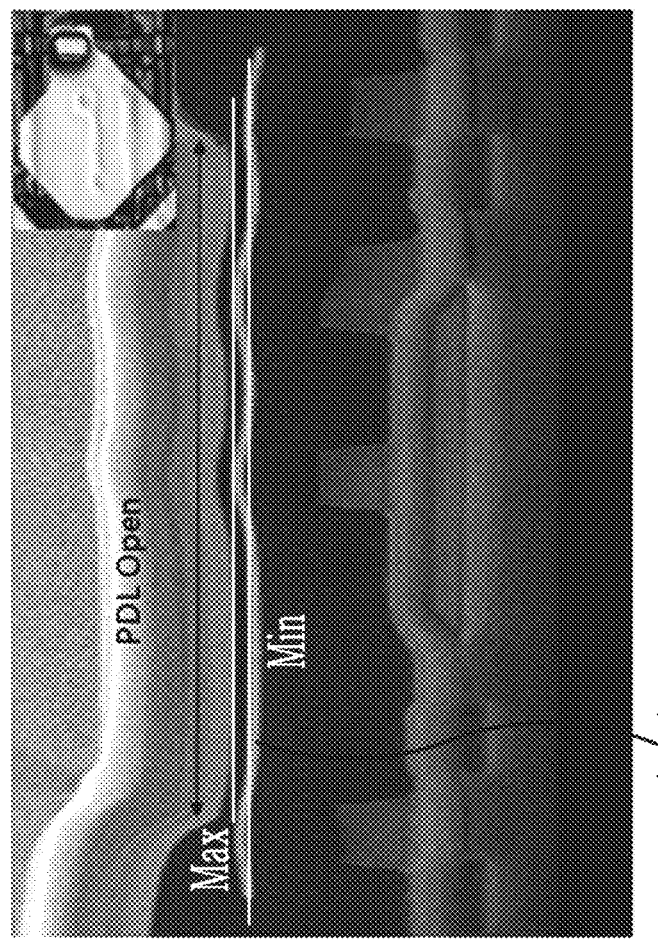

FIG. 28A is a comparative example of "double VIA", and FIG. 28B is an embodiment of "double VIA+Slit". In FIG. 28A and FIG. 28B, the highest point (referring to Max in FIG. 28A and FIG. 28B) and the lowest point (referring to Min in FIG. 28A and FIG. 28B) of the upper surface of the anode (Anode) based on the distances from the substrate are indicated by one or more lines. The height difference may be measured by the difference in height between Max and Min, and in FIG. 28A, as the measured height difference is large, Max and Min may be indicated by two different horizontal lines; in FIG. 28B, as the flatness is high, wherein the Max and Min are close to each other and are indicated by a single line.

Referring to FIG. 28A, as the second data conductive layer is thick, even if two organic layers are formed, a significant step occurs on the upper surface of the organic layer. Referring to FIG. 28B, the step is removed by forming the halftone exposure area through the halftone exposure.

As a result, the height difference of the halftone exposure area (and the neighboring area) of the organic layers may be less than 30 nm, and the anode (Anode) positioned on the organic layer may be sufficiently flat. Advantageously, the image display quality is improved by preventing the occurrence of the color spread, color separation, and/or reflective color band.

Each of FIG. 29A, FIG. 29B, FIG. 29C, and FIG. 30 is a cross-sectional view or a plan view showing a structure of an opening formed in an organic layer in a light emitting display device according to an embodiment.

Figure 29A:
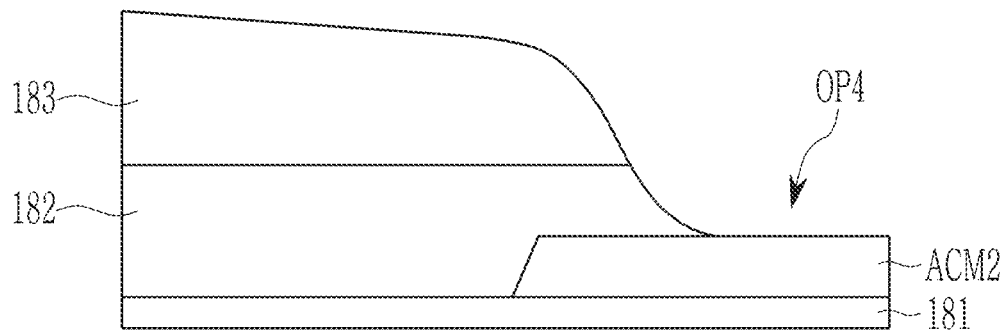
Figure 29B:
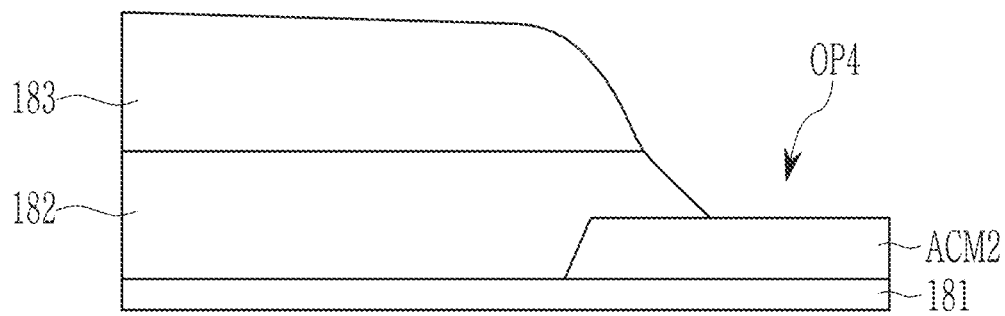
Figure 29C:
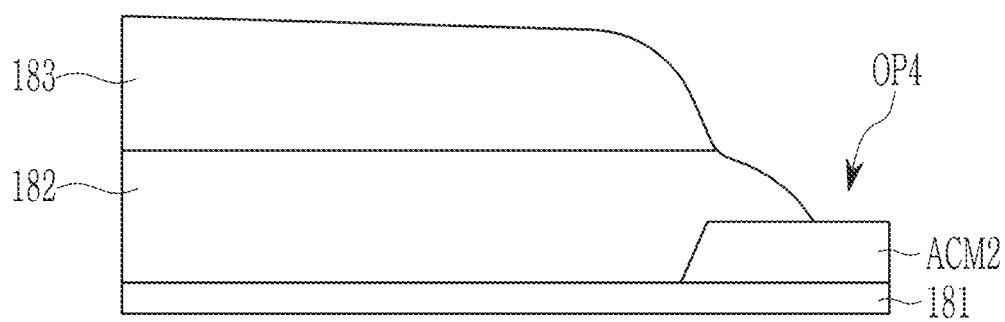

FIG. 29A, FIG. 29B, and FIG. 29C show the cross-sectional structures of three openings OP4 formed by setting different exposure amounts of a light source according to Table 1.

TABLE 1

|  | FIG. 29A | FIG. 29B | FIG. 29C |
|---|---|---|---|
| Third organic layer exposure amount | 100 mJ | 110 mJ | 120 mJ |
| Average value of OP4 | 3.91 μm | 4.04 μm | 4.19 μm |
| Reference deviation value | 0.26 | 0.15 | 0.12 |
| Number | 30 | 30 | 30 |

Figure 30:
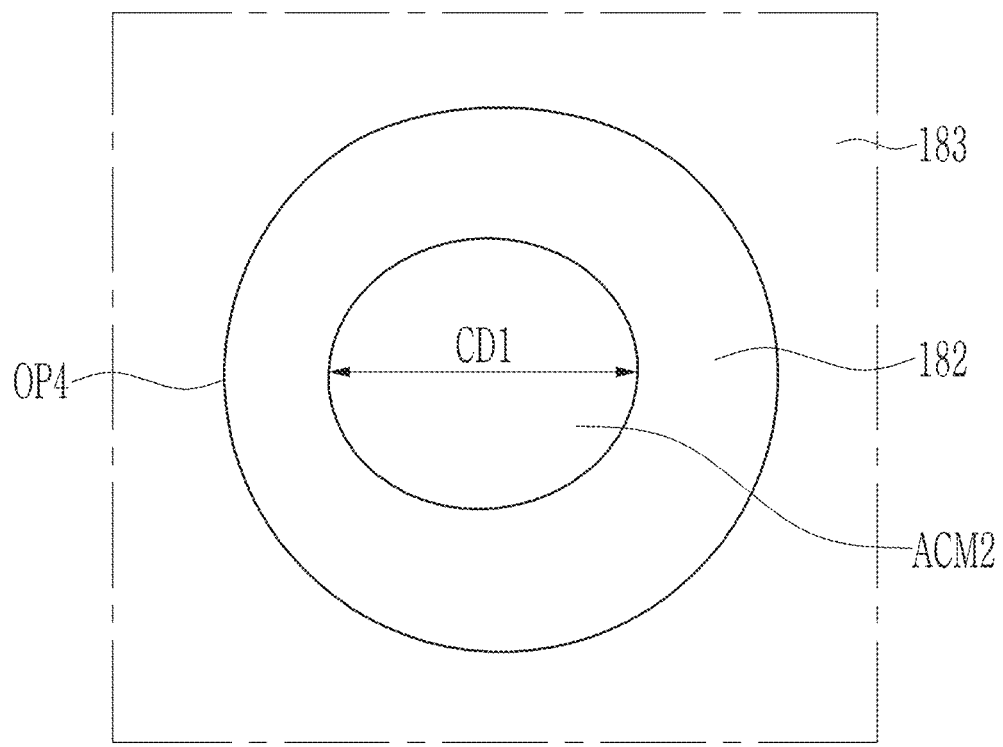
FIG. 30 is a cross-sectional view or a plan view showing a structure of an opening formed in an organic layer in a light emitting display device according to an embodiment.

In Table 1, the third organic layer exposure amount means an amount of light provided from the light source to form the third organic layer, a mask is provided with the corresponding exposure amount, and only a part of the light is transmitted in the slit area to form the halftone exposure area. The opening OP4 of the third organic layer 183 corresponds to a slit of the mask. In Table 1, "Average value of OP4" is an average value obtained by calculating the size of the opening OP4 in the third organic layer 183 when the third organic layer 183 is exposed with the particular exposure amount. Referring to FIG. 30, "Average value of OP4" may be related to an average value of diameter values CD1 of the opening of the second organic layer 182.

To form the halftone exposure area in the second organic layer 182, the amount of light provided by the light source has a value of 60 mJ or more and 70 mJ or less, which is smaller than the exposure amount for the third organic layer. When forming the halftone exposure area in the third organic layer 183, even if the same mask is used, since there is a merit that the flatness of the halftone exposure area is improved, the light amount for exposing the third organic layer 183 may be higher than the light amount for exposing the second organic layer 182.

Due to the difference between the exposure amount to form the opening OP4 in the second organic layer 182 and the exposure amount to form the opening OP4 in the third organic layer 183, the opening OP4 may have a narrower width (or area) toward the lower portion. Referring to FIG. 24C, the second organic layer 182 may have a stepped structure exposed through the opening OP4 of the third organic layer 183.

FIG. 29C and FIG. 30 show the opening OP4 having the stepped structure. A portion of the upper surface of the second organic layer 182 and a portion of the anode connecting part ACM2 are exposed through the opening OP4.

Referring to FIG. 29A and Table 1, when exposing the third organic layer 183 with the exposure amount of about 100 mJ, since the opening OP4 formed in the third organic layer 183 is not large, no step structure appears in the opening OP4. When the opening OP4 formed in the third organic layer 183 is formed with the exposure amount of 110 mJ, a slanted and relatively flat wall of the second organic layer 182 may be formed in the opening OP4. The opening OP4 may have a clearly stepped structure given the exposure amount of 120 mJ.

The stepped structure in the opening OP4 may advantageously improve the flatness of the halftone exposure area of the third organic layer 183.

In embodiments, two organic layers 182 and 183 are used, and the height difference associated with the halftone exposure area is 30 nm. In red and blue, two halftone exposure areas are included. In green, only one halftone exposure area is included.

Figure 31:
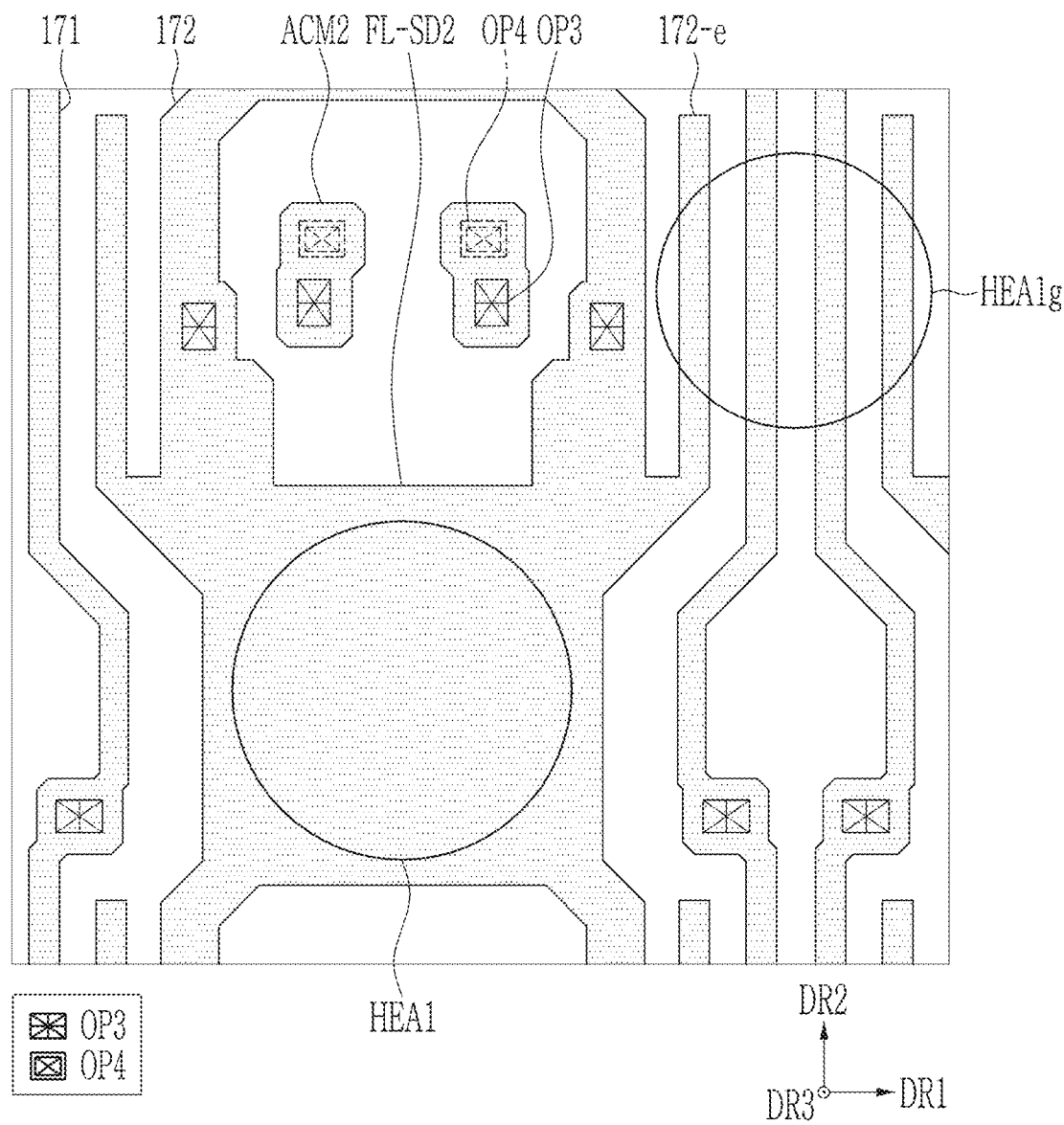
FIG. 31 and FIG. 32 are plan views showing an area for exposing an organic layer by a slit mask in a light emitting display device according to an embodiment.
Figure 32:
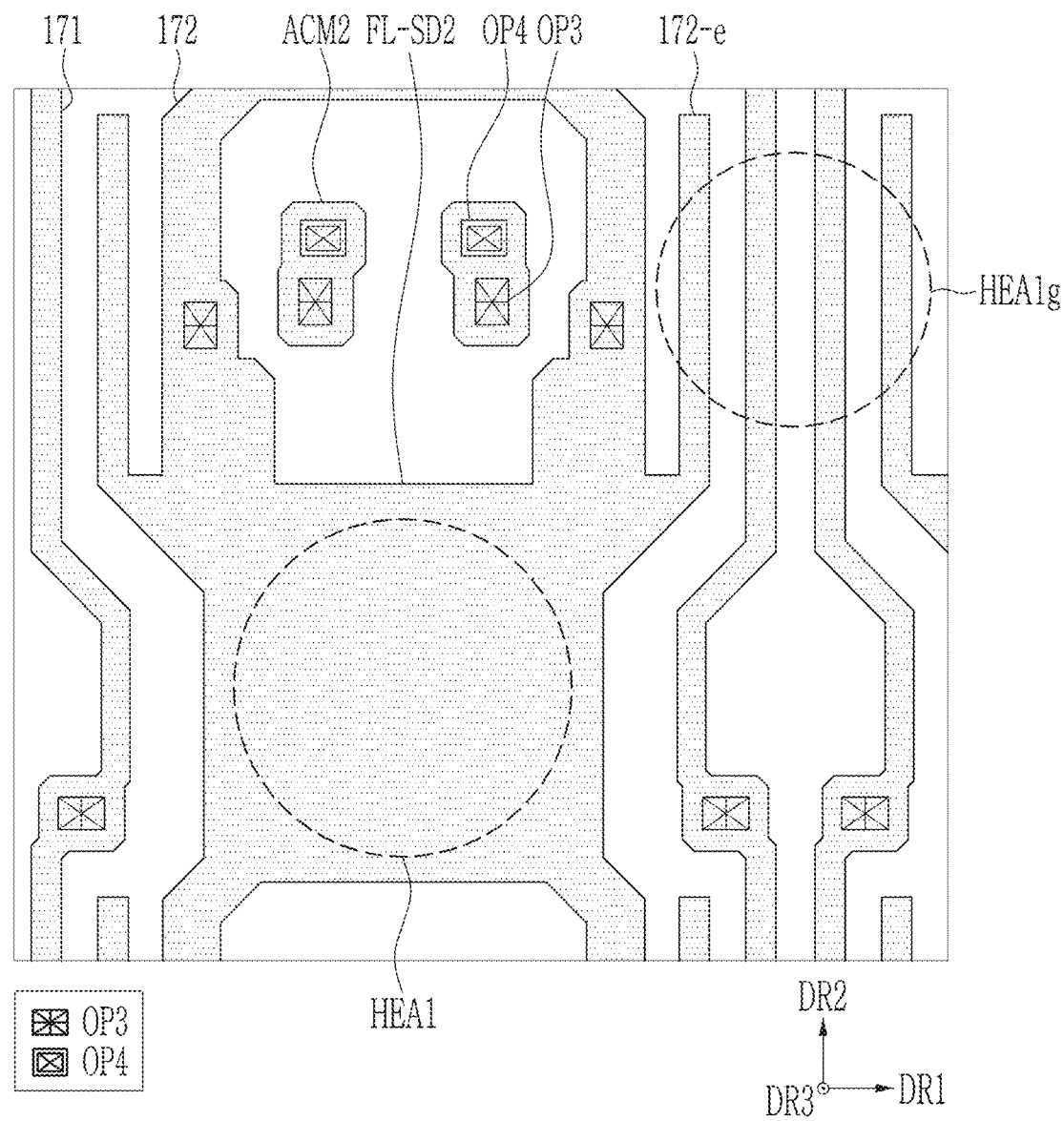

FIG. 31 and FIG. 32 are plan views showing an area for exposing an organic layer by a slit mask in a light emitting display device according to an embodiment.

FIG. 31 and FIG. 32 may include some features that are identical to or analogous to some features of FIG. 17 and FIG. 18.

Referring to FIG. 31, in the second organic layer 182 on the second data conductive layer, the first halftone exposure area HEA1 of red or blue and the first halftone exposure area HEA1g of green are formed. The thickness of the second organic layer 182 may be about 1.5 µm, and may have a value greater than 1 µm and less than 2 µm. If the second organic layer 182 is 1 µm, the planarizing characteristic may not be good even if two organic layers are each 1 µm, and when two organic layers each have the thickness of 2 µm or more, the flatness is improved, but the flatness deteriorates as the thickness of the organic layer decreases due to the outgas phenomenon in which the gas escapes in the cure process.

Referring to FIG. 31, the opening OP4 exposing the second data conductive layer is positioned in the second organic layer 182. The opening OP4 exposing the second data conductive layer is shown with a dotted line, which indicates that the opening OP4 is incomplete. In the subsequent process, after the opening OP4 is formed in the third organic layer 183, the opening OP4 is completed, and the second data conductive layer is exposed.

Referring to FIG. 32, after stacking the third organic layer 183 on the second organic layer 182, the opening OP4 is completed using a general mask, and no halftone exposure area is formed in the third organic layer 183. The opening OP4 in FIG. 32 may have the stepped structure described with reference to FIG. 29C and FIG. 30.

In FIG. 32, the first halftone exposure area HEA1 of red or blue and the first halftone exposure area HEA1g of green are indicated by dotted lines, indicating that that the second organic layer 182 has been halftone exposed, and that the third organic layer 183 is not halftone exposed. The thickness of the third organic layer 183 may be about 1.5 µm, and may have a value greater than 1 µm and less than 2 µm.

Referring to FIG. 31 and FIG. 32, the halftone exposure area is not formed in the third organic layer 183. The third organic layer 183 may not be further planarized. If the second organic layer 182 is sufficiently planarized by forming the halftone exposure area, there is no need to further planarize the third organic layer 183. Therefore, if the height difference of the upper surface of the third organic layer 183 is less than 30 nm with only the halftone exposure area in the second organic layer 182, no halftone exposure area may be required in the third organic layer 183.

The halftone exposure area may be formed only in the third organic layer 183, and no halftone exposure area may be formed in the second organic layer 182. No halftone exposure area may be required in the second organic layer 182 when the height difference of the upper surface of the third organic layer 183 is less than 30 nm.

When only one organic layer is positioned between the second data conductive layer and the anode (Anode), the halftone exposure area may be formed to form the height difference of 30 nm or less for each of the organic layer and the anode.

Figure 33:
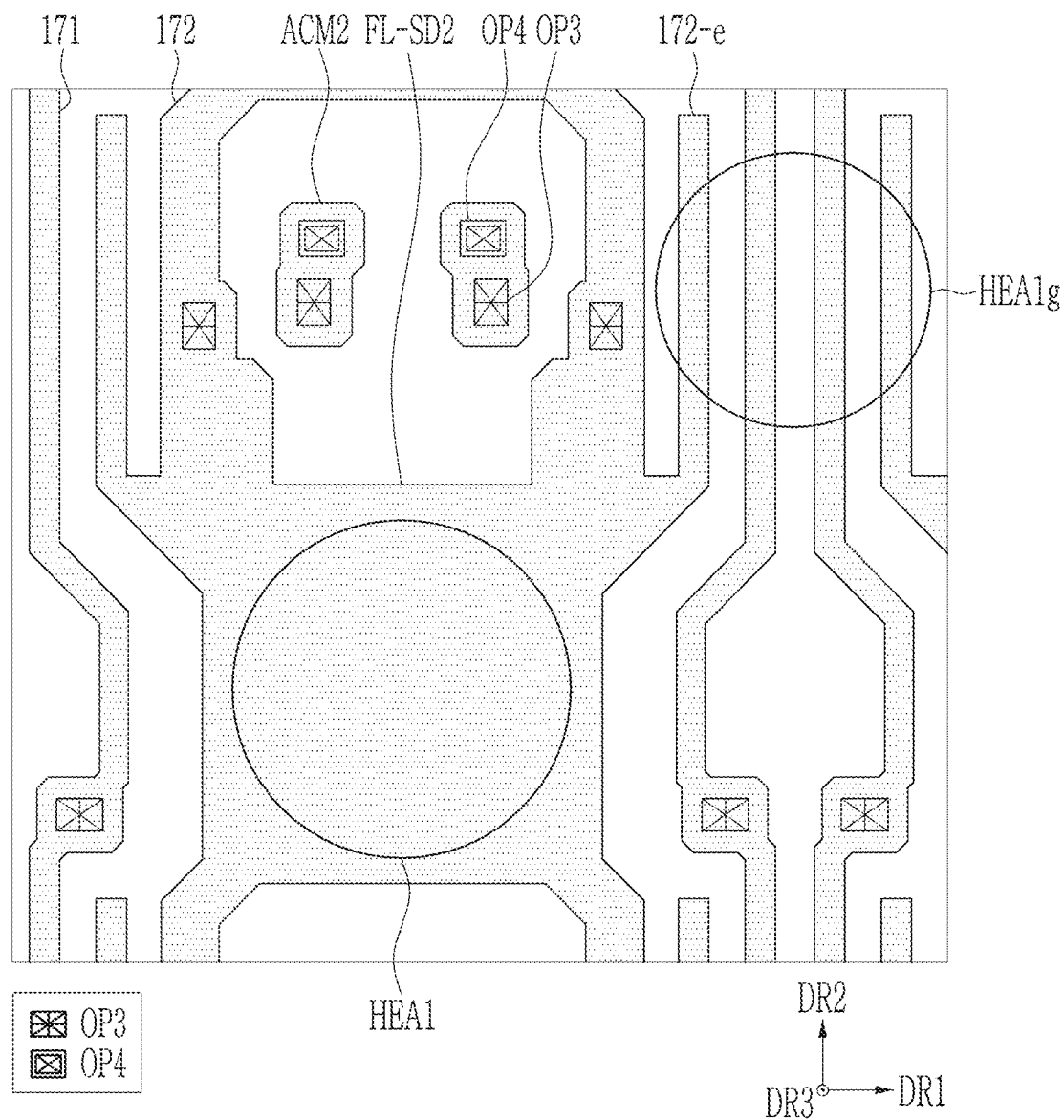
FIG. 33 is a plan view showing an area for exposing an organic layer by a slit mask in a light emitting display device according to an embodiment.
Figure 34:
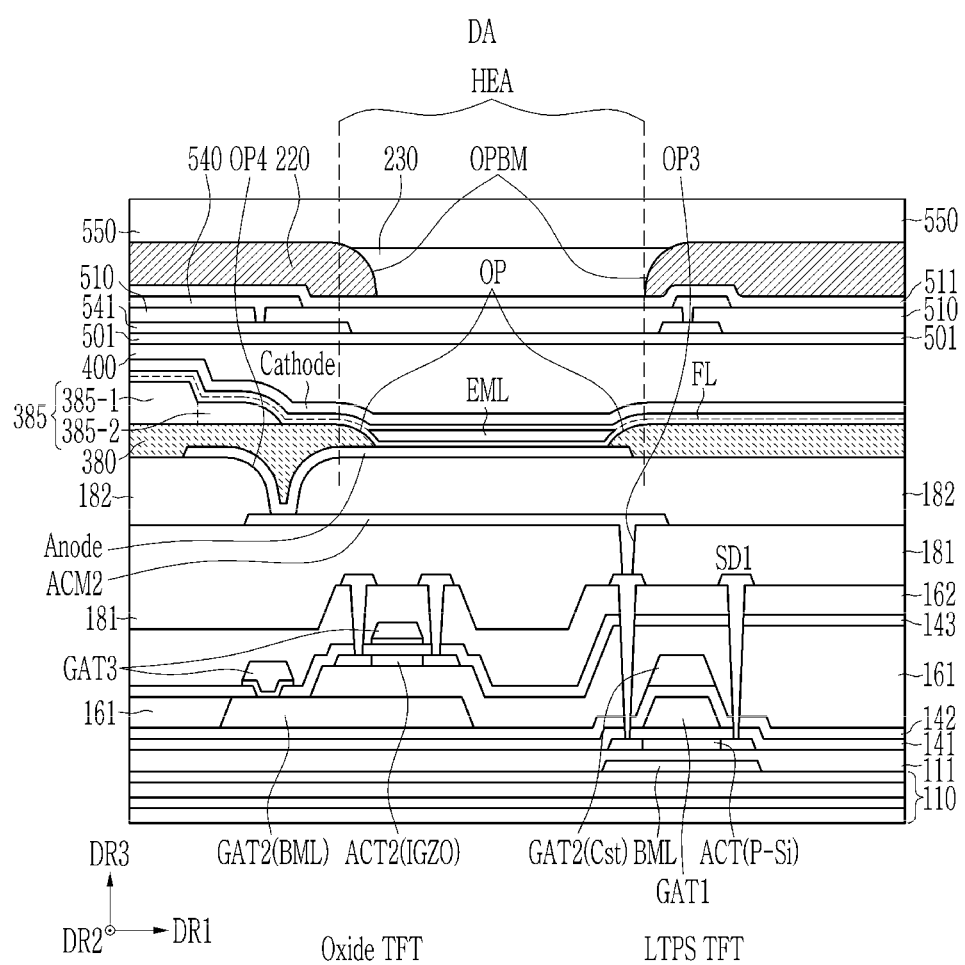
FIG. 34 is a cross-sectional view of a light emitting display device according to an embodiment.

FIG. 33 is a plan view showing an area for exposing an organic layer by a slit mask in a light emitting display device according to an embodiment, and FIG. 34 is a cross-sectional view of a light emitting display device according to an embodiment.

Referring to FIG. 33, in the second organic layer 182 on the second data conductive layer, the first halftone exposure area HEA1 of red or blue and the first halftone exposure area HEA1g of green are formed. The second organic layer 182 may have a thickness of about 1.5 µm, may have a thickness of greater than 1 µm and less than 2 µm, and may have a thickness of 2 µm or more and 5 µm or less.

Referring to FIG. 33, an opening OP4 exposing a second data conductive layer is indicated by a solid line. Since the third organic layer 183 is not formed, the opening OP4 is completed after the first halftone exposure areas HEA1 and HEA1g are formed in the second organic layer 182, and the second data conductive layer is exposed. The opening OP4 may not have an internal stepped structure.

Referring to FIG. 34, the second organic layer 182 may directly contact each of the black pixel definition layer 380 and the anode (Anode).

Referring to FIG. 33 and FIG. 34, the second organic layer 182 is formed between the second data conductive layer and the anode (Anode), and the height difference associated with the halftone exposure area of the second organic layers 182 can be less than 30 nm. Advantageously, the anode (Anode) located on the organic layer 182 may be sufficiently flattened. Therefore, it is possible to improve the image display quality by preventing the occurrence of color spread, color separation, and/or reflective color bands.

A reflection adjusting layer may be disposed on the light blocking layer 220. The reflection adjusting layer may selectively absorb light of a wavelength of a partial band among light reflected inside the display device or light incident outside the display device. The reflection adjusting layer may fill the opening OP.

For example, the reflection adjusting layer absorbs a first wavelength region of 490 nm to 505 nm and a second wavelength region of 585 nm to 600 nm, and thus light transmittance in the first wavelength region and second wavelength region may be 40% or less. The reflection adjusting layer may absorb light of a wavelength outside the emission wavelength range of red, green, or blue emitted from the light emitting diode ED. As described, the reflection adjusting layer absorbs light of a wavelength that does not belong to a wavelength range of red, green, or blue emitted from the light emitting diode, thereby preventing or minimizing the reduction in luminance of the display device and simultaneously preventing or minimizing the deterioration of the luminous efficiency and improving visibility of the display device.

In the embodiment, the reflection adjusting layer may be provided as an organic material layer including a dye, a pigment, or combination thereof. The reflection adjusting layer may contain a tetraazaporphyrin (TAP)-based compound, a porphyrin-based compound, a metal porphyrin-based compound, an oxazine-based compound, and a squarylium-based compound, a triarylmethane compound, a polymethine compound, an anthraquinone compound, a phthalocyanine compound, an azo compound, a perylene compound, a xanthene-based compound, a diammonium-based compound, a dipyrromethene-based compound, a cyanine-based compound, and a combination thereof.

In the embodiment, the reflection adjusting layer may have transmittance of about 64% to 72%. The transmittance of the reflection adjusting layer may be adjusted according to the content of the pigment and/or dye included in the reflection adjusting layer.

According to embodiments, the reflection adjusting layer may not be disposed in the first element area DA2. In addition, an embodiment including the reflection adjusting layer may further include a capping layer and a low reflection layer disposed between the cathode (Cathode) and the encapsulation layer 400.

The capping layer may serve to improve the luminous efficiency of the light emitting diode ED by the principle of constructive interference. The capping layer may include, for example, a material having a refractive index of 1.6 or more for light having a wavelength of 589 nm.

The capping layer may be an organic capping layer including an organic material, an inorganic capping layer including an inorganic material, or a composite capping layer including an organic material and an inorganic material. For example, the capping layer may contain a carbocyclic compound, a heterocyclic compound, an amine group-containing compound, a porphine derivative, a phthalocyanine derivative, a naphthalocyanine derivative, an alkali metal complex, alkaline earth metal complexes, or any combination thereof. The carbocyclic compounds, the heterocyclic compounds, and the amine group-containing compounds may be optionally substituted with substituents including O, N, S, Se, Si, F, Cl, Br, I, or any combination thereof.

A low reflection layer may be disposed on the capping layer. The low reflective layer may overlap a front surface of the substrate 110.

The low reflective layer may include an inorganic material having low reflectance, and in an embodiment, it may include a metal or metal oxide. When the low reflective layer contains a metal, it may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), and it may include zinc (Zn), germanium (Ge), silver (Ag), magnesium (Mg), gold (Au), copper (Cu), calcium (Ca), or a combination thereof. In addition, when the low reflective layer contains a metal oxide, it may include, for example, $SiO_2$, $TiO_2$, $ZrO_2$, $Ta_2O_5$, $HfO_2$, $Al_2O_3$, $ZnO$, $Y_2O_3$, $BeO$, $MgO$, $PbO_2$, $WO_3$, $SiN_x$, $LiF$, $CaF_2$, $MgF_2$, $CdS$, or a combination thereof.

In the embodiment, an absorption coefficient (k) of the inorganic material included in the low reflective layer may be 4.0 or less and 0.5 or more ($0.5 \leq k \leq 4.0$). In addition, the inorganic material included in the low reflective layer may have a refractive index (n) of 1 or more ($n \geq 1.0$).

The low reflective layer induces destructive interference between the light incident into the display device and the light reflected from the metal disposed under the low reflective layer, thereby reducing reflection of external light. Accordingly, the display quality and visibility of the display device can be improved by reducing the reflection of the external light of the display device through the low reflective layer.

According to embodiments, the capping layer may not be formed, and then the low reflective layer may be contact the cathode (Cathode) directly.

The encapsulation layer is disposed on the low reflective layer, other structures may be the same as FIGS. 22 and 34.

While examples of embodiments have been described, practical embodiments are not limited to the described embodiments. Practical embodiments cover various modifications and equivalent arrangements within the scope of the appended claims.

What is claimed is:

1. A light emitting display device comprising:
   a substrate;
   a first data conductive layer positioned above the substrate;
   a first organic layer positioned on the first data conductive layer;
   a second data conductive layer positioned on the first organic layer;
   a second organic layer and a third organic layer sequentially positioned on the second data conductive layer and having an anode connection opening;
   an anode positioned on the third organic layer and partially positioned inside the anode connection opening;
   a pixel definition layer having an anode exposure opening that exposes an exposed portion of the anode;
   a cathode overlapping both the pixel definition layer and the anode; and
   an encapsulation layer covering the cathode, wherein
   the second organic layer and the third organic layer respectively have a halftone exposure portion and a neighboring portion,
   the halftone exposure portion overlaps the exposed portion of the anode and overlaps the second data conductive layer or the first data conductive layer,
   the neighboring portion neighbors the halftone exposure portion and does not overlap the second data conductive layer, and
   a height difference between a top surface of the halftone exposure portion and a top surface of the neighboring portion is equal to or less than 30 nm.

2. The light emitting display device of claim 1, wherein the second organic layer and the third organic layer overlap each other.

3. The light emitting display device of claim 2, wherein the halftone exposure portion includes a first halftone exposure portion and a second halftone exposure portion,
   the first halftone exposure portion is included in the second organic layer, and
   the second halftone exposure portion is included in the third organic layer and overlaps the first halftone exposure portion.

4. The light emitting display device of claim 3, further comprising:
   a red color filter;
   a green color filter; and
   a blue color filter, wherein
   the first halftone exposure portion and the second halftone exposure portion overlap one of the red color filter and the blue color filter, and
   the second organic layer further includes a green-pixel halftone exposure portion overlapping the green color filter.

5. The light emitting display device of claim 4, wherein the first data conductive layer overlaps the green color filter, and
   the second data conductive layer overlaps the red color filter or the blue color filter.

6. The light emitting display device of claim 4, wherein a thickness of the second organic layer is greater than 1 μm and less than 2 μm, and
   a thickness of the third organic layer is greater than 1 μm and less than 2 μm.

7. The light emitting display device of claim 4, wherein
the anode connection opening includes a first opening and a second opening,
the first opening is included in the second organic layer,
the second opening is included in the third organic layer, and
the second organic layer includes a stepped structure exposed by the second opening.

8. The light emitting display device of claim 2, wherein the halftone exposure portion is included in only one of the second organic layer and the third organic layer.

9. The light emitting display device of claim 8, wherein the halftone exposure portion is included in only the second organic layer.

10. The light emitting display device of claim 1, wherein two opposite faces of the organic layer are formed of a same material and respectively directly contact the second data conductive layer and the anode.

11. The light emitting display device of claim 1, further comprising:
a light blocking layer positioned on the encapsulation layer and having a color filter opening;
a color filter filling the color filter opening; and
a sensing electrode covered by the light blocking layer, wherein
the halftone exposure portion overlaps the color filter.

12. The light emitting display device of claim 11, wherein
a perimeter of the halftone exposure portion surrounds a perimeter of the anode exposure opening in a plan view of the light emitting display device, and
the perimeter of the halftone exposure portion is surrounded by a perimeter of the color filter in the plan view of the light emitting display device.

13. The light emitting display device of claim 1, further comprising:
a spacer positioned between the pixel definition layer and the cathode, wherein
the spacer includes a first portion and a second portion shorter than the first portion in a direction perpendicular to the substrate and integrally formed with the first portion.

* * * * *